United States Patent
Han et al.

(10) Patent No.: US 9,082,987 B2
(45) Date of Patent: Jul. 14, 2015

(54) BENZOFLUORENE-BASED COMPOUNDS AND ORGANIC LIGHT-EMITTING DIODE INCLUDING THE SAME

(71) Applicant: Samsung Display Co., LTD., Yongin, Gyeonggi-do (KR)

(72) Inventors: Sang-Hyun Han, Yongin (KR); Seok-Hwan Hwang, Yongin (KR); Young-Kook Kim, Yongin (KR); Hye-Jin Jung, Yongin (KR); Jin-O Lim, Yongin (KR); Soo-Yon Kim, Yongin (KR); Eun-Jae Jeong, Yongin (KR); Jun-Ha Park, Yongin (KR); Eun-Young Lee, Yongin (KR); Jong-Hyuk Lee, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 81 days.

(21) Appl. No.: 14/043,802

(22) Filed: Oct. 1, 2013

(65) Prior Publication Data

US 2014/0326961 A1 Nov. 6, 2014

(30) Foreign Application Priority Data

May 2, 2013 (KR) ........................ 10-2013-0049621

(51) Int. Cl.
*H01L 29/08* (2006.01)
*H01L 35/24* (2006.01)
(Continued)

(52) U.S. Cl.
CPC .......... *H01L 51/006* (2013.01); *G06K 9/00671* (2013.01); *G06T 11/00* (2013.01);
(Continued)

(58) Field of Classification Search
CPC ............ H01L 51/0054; H01L 51/0069; H01L 51/0071; H01L 51/0073; H01L 51/0067; H01L 51/0074; H01L 51/0072; H01L 51/5012; H01L 51/007; H01L 51/5072; H01L 51/5056; H01L 51/5092
USPC ............................... 257/40, 79, 103; 556/413
See application file for complete search history.

(56) References Cited

U.S. PATENT DOCUMENTS 7,981,523 B2 7/2011 Hosokawa et al.
2011/0017983 A1* 1/2011 Mizuki et al. .................. 257/40
(Continued)

FOREIGN PATENT DOCUMENTS

JP 2011-219461 A 11/2011
(Continued)

*Primary Examiner* — Thanh Y Tran
(74) *Attorney, Agent, or Firm* — Christie, Parker & Hale, LLP

(57) ABSTRACT

Provided are benzofluorene-based compounds according to the following Formula 1 and an organic light-emitting diode including the same:

Formula 1

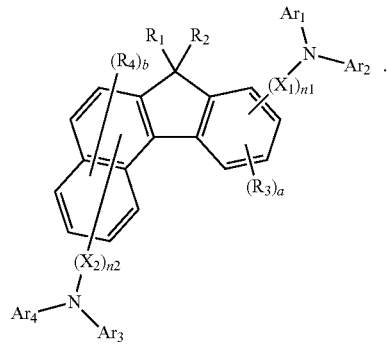

20 Claims, 1 Drawing Sheet

(51) Int. Cl.
*H01L 51/00* (2006.01)
*H04N 5/232* (2006.01)
*G06K 9/00* (2006.01)
*H04N 1/00* (2006.01)
*H01L 51/50* (2006.01)
*G06T 11/00* (2006.01)
*H04N 101/00* (2006.01)

(52) U.S. Cl.
CPC ........ *H01L51/0061* (2013.01); *H01L 51/0094* (2013.01); *H01L 51/5012* (2013.01); *H01L 51/5056* (2013.01); *H01L 51/5072* (2013.01); *H01L 51/5088* (2013.01); *H01L 51/5092* (2013.01); *H04N 1/00183* (2013.01); *H04N 5/23222* (2013.01); *H04N 5/23238* (2013.01); *H04N 5/23245* (2013.01); *H04N 2101/00* (2013.01)

(56) References Cited

U.S. PATENT DOCUMENTS

| 2013/0134405 | A1  | 5/2013 | Wang et al. |
| 2014/0100367 | A1* | 4/2014 | Yoon et al. .................... 544/229 |
| 2014/0159024 | A1* | 6/2014 | Takada et al. .................. 257/40 |
| 2014/0209873 | A1* | 7/2014 | Kim et al. ........................ 257/40 |
| 2014/0225076 | A1* | 8/2014 | Kim et al. ........................ 257/40 |

FOREIGN PATENT DOCUMENTS

| KR | 10-2007-0120545 A | 12/2007 |
| KR | 10-2008-0031808 A | 4/2008 |
| KR | 10-2010-0070992 A | 6/2010 |
| KR | 10-2010-0075101 A | 7/2010 |
| KR | 10-2011-0041728 A | 4/2011 |

* cited by examiner

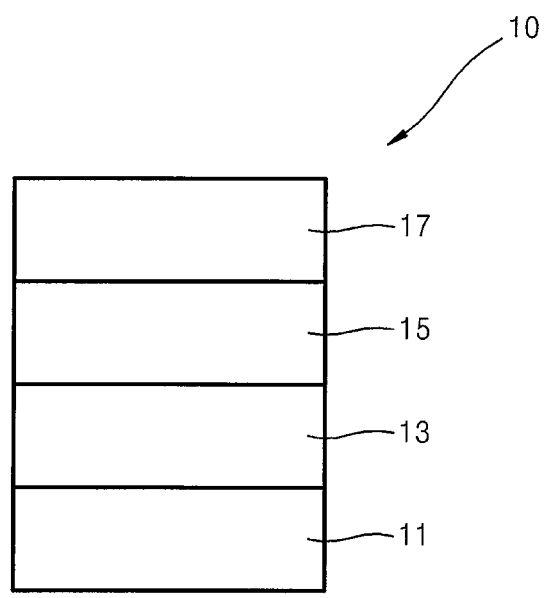

BENZOFLUORENE-BASED COMPOUNDS AND ORGANIC LIGHT-EMITTING DIODE INCLUDING THE SAME

CROSS-REFERENCE TO RELATED APPLICATION

This application claims priority to and the benefit of Korean Patent Application No. 10-2013-0049612, filed on May 2, 2013, in the Korean Intellectual Property Office, entitled "Benzofluorene-based compound and organic light emitting diode comprising the same," the content of which is incorporated herein by reference in its entirety.

BACKGROUND

1. Field

One or more embodiments of the present invention relate to benzofluorene-based compounds and organic light-emitting diodes including the same.

2. Description of the Related Art

Organic light-emitting diodes (OLEDs), which are self-emitting diodes, have advantages such as wide viewing angles, good contrast, quick response, high brightness, good driving voltage characteristics, and ability to provide multi-colored images.

A typical OLED has a structure including a substrate, and an anode, a hole transport layer, an emission layer, an electron transport layer, and a cathode, which are sequentially stacked on the substrate. The hole transport layer, the emission layer, and the electron transport layer are organic thin films formed of organic compounds.

An operating principle of an organic light-emitting diode having such a structure is as follows.

When a voltage is applied between the anode and the cathode, holes injected from the anode move to the emission layer via the hole transport layer, and electrons injected from the cathode move to the emission layer via the electron transport layer. The holes and electrons, which are carriers, are recombined in the emission layer to generate excitons. When the excitons transition from an excited state to a ground state, light is generated.

SUMMARY

According to aspects of embodiments of the present invention, provided is a high-quality organic light-emitting diode.

In an embodiment, provided is a benzofluorene-based compound represented by Formula 1 below:

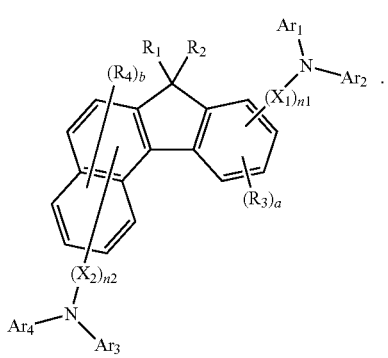

Formula 1

In Formula 1, $X_1$ and $X_2$ may each be independently selected from a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, and a substituted or unsubstituted $C_2$-$C_{60}$ heteroarylene group; n1 and n2 are each independently selected from an integer of 0 to 3, and when n1 is an integer of 2 or more, 2 or more of $X_1$ are identical to or different from each other, and when n2 is an integer of 2 or more, 2 or more of $X_2$ are identical to or different from each other; the sum of n1 and n2 is an integer of 1 to 6; $Ar_1$ to $Ar_4$ are each independently selected from a substituted or unsubstituted $C_6$-$C_{30}$ aryl group and a substituted or unsubstituted $C_2$-$C_{30}$ heteroaryl group; $R_1$ to $R_4$ are each independently selected from a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{30}$ alkyl group, a substituted or unsubstituted $C_2$-$C_{60}$ alkenyl group, a substituted or unsubstituted $C_2$-$C_{60}$ alkynyl group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{30}$ aryl group, and a substituted or unsubstituted $C_2$-$C_{30}$ heteroaryl group; a is an integer of 0 to 3, and when a is an integer of 2 or more, 2 or more of $R_3$ may be identical to or different from each other; and b is an integer of 0 to 5, and when b is an integer of 2 or more, 2 or more of $R_4$ may be identical to or different from each other.

According to a further embodiment, provided is an organic light-emitting diode including: a substrate; a first electrode; a second electrode on the first electrode; and an organic layer between the first electrode and the second electrode, the organic layer including an emission layer and one or more benzofluorene-based compounds.

BRIEF DESCRIPTION OF THE DRAWING

The accompanying drawing, together with the specification, illustrates embodiments of the present invention, and, together with the description, serves to explain the principles of the present invention.

FIG. 1 is a schematic view of the structure of an organic light-emitting diode according to an embodiment.

DETAILED DESCRIPTION

In the following detailed description, only certain embodiments of the present invention are shown and described, by way of illustration. As those skilled in the art would recognize, the invention may be embodied in many different forms and should not be construed as being limited to the embodiments set forth herein. In the context of the present application, when a first element is referred to as being "on" a second element, it can be directly on the second element or be indirectly on the second element with one or more intervening elements interposed therebetween. The use of "may" when describing embodiments of the present invention refers to "one or more embodiments of the present invention." Expressions such as "at least one of," when preceding a list of elements, modify the entire list of elements and do not modify the individual elements of the list. Like reference numerals designate like elements throughout the specification.

A benzofluorene-based compound according to an embodiment of the present invention is represented by Formula 1 below:

Formula 1

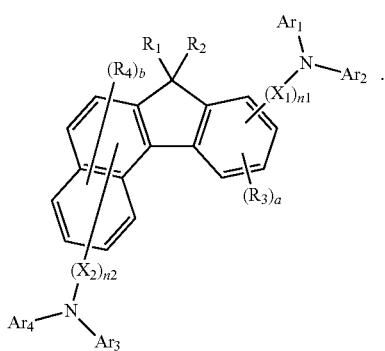

$X_1$ and $X_2$ in Formula 1 may each be independently selected from a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, and a substituted or unsubstituted $C_2$-$C_{60}$ heteroarylene group, but are not limited thereto.

For example, $X_1$ and $X_2$ in Formula 1 may each be independently selected from a substituted or unsubstituted phenylene group, a substituted or unsubstituted pentalenylene group, a substituted or unsubstituted indenylene group, a substituted or unsubstituted naphtylene group, a substituted or unsubstituted azulenylene group, a substituted or unsubstituted heptalenylene group, a substituted or unsubstituted indacenylene group, a substituted or unsubstituted acenaphtylene group, a substituted or unsubstituted fluorenylene group, a substituted or unsubstituted spiro-fluorenylene group, a substituted or unsubstituted phenalenylene group, a substituted or unsubstituted phenanthrenylene group, a substituted or unsubstituted anthrylene group, a substituted or unsubstituted fluoranthenylene group, a substituted or unsubstituted triphenylenylene group, a substituted or unsubstituted pyrenylene group, a substituted or unsubstituted chrysenylene group, a substituted or unsubstituted naphthacenylene, a substituted or unsubstituted picenylene group, a substituted or unsubstituted perylenylene group, a substituted or unsubstituted pentaphenylene group, a substituted or unsubstituted hexacenylene group, a substituted or unsubstituted pyrrolylene group, a substituted or unsubstituted imidazolylene group, a substituted or unsubstituted pyrazolylene group, a substituted or unsubstituted pyridinylene group, a substituted or unsubstituted pyrazinylene group, a substituted or unsubstituted pyrimidinylene group, a substituted or unsubstituted pyridazinylene group, a substituted or unsubstituted isoindolylene group, a substituted or unsubstituted indolylene group, a substituted or unsubstituted indazolylene group, a substituted or unsubstituted purinylene group, a substituted or unsubstituted quinolinylene group, a substituted or unsubstituted benzoquinolinylene group, a substituted or unsubstituted phthalazinylene group, a substituted or unsubstituted naphthyridinylene group, a substituted or unsubstituted quinoxalinylene group, a substituted or unsubstituted quinazolinylene group, a substituted or unsubstituted cinnolinylene group, a substituted or unsubstituted carbazolylene group, a substituted or unsubstituted phenanthridinylene group, a substituted or unsubstituted acridinylene group, a substituted or unsubstituted phenanthrolinylene group, a substituted or unsubstituted phenazinylene group, a substituted or unsubstituted benzooxazolylene group, a substituted or unsubstituted benzoimidazolylene group, a substituted or unsubstituted furanylene group, a substituted or unsubstituted benzofuranylene group, a substituted or unsubstituted thiophenylene group, a substituted or unsubstituted benzothiophenylene group, a substituted or unsubstituted thiazolylene group, a substituted or unsubstituted isothiazolylene group, a substituted or unsubstituted benzothiazolylene group, a substituted or unsubstituted isoxazolylene group, a substituted or unsubstituted oxazolylene group, a substituted or unsubstituted triazolylene group, a substituted or unsubstituted tetrazolylene group, a substituted or unsubstituted oxadiazolylene group, a substituted or unsubstituted triazinylene group, a substituted or unsubstituted benzooxazolylene group, a substituted or unsubstituted dibenzopuranylene group, a substituted or unsubstituted dibenzothiophenylene group, and a substituted or unsubstituted benzocarbazolylene group, but $X_1$ and $X_2$ are not limited thereto.

$X_1$ to $X_2$ in Formula 1 may each be independently selected from:

a phenylene group, a naphthylene group, an anthracenylene group, a pyridinylene group, a pyrazinylene group, a pyrimidinylene group and a pyridazinylene group;

a phenylene group, a naphthylene group, an anthracenylene group, a pyridinylene group, a pyrazinylene group, a pyrimidinylene group and a pyridazinylene group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, and a $C_1$-$C_{10}$ alkyl group;

a $C_1$-$C_{10}$ alkyl group substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a $C_6$-$C_{16}$ aryl group and a $C_2$-$C_{16}$ heteroaryl group; and a $C_6$-$C_{16}$ aryl group and a $C_2$-$C_{16}$ heteroaryl group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_6$-$C_{16}$ aryl group, and a $C_2$-$C_{16}$ heteroaryl group but $X_1$ to $X_2$ are not limited thereto.

$X_1$ and $X_2$ may each be independently selected from a phenylene group, a naphthylene group, an anthracenylene group, a pyridinylene group, a pyrazinylene group, a pyrimidinylene group and a pyridazinylene group; and a phenylene group, a naphthylene group, an anthracenylene group, a pyridinylene group, a pyrazinylene group, a pyrimidinylene group and a pyridazinylene group, each substituted with at least one selected from a deuterium atom, —F, a cyano group, a nitro group, a methyl group, an ethyl group, an n-propyl group, an i-propyl group, an n-butyl group, an i-butyl group, a t-butyl group, a phenyl group, a naphthyl group, an anthryl group, a fluorenyl group, a pyridinyl group, a pyrazinyl group, a pyrimidinyl group, and a pyridazinyl group, but are not limited thereto.

$X_1$ and $X_2$ in Formula 1 may each be independently selected from a phenylene group, a naphthylene group, an anthracenylene group, a pyridinylene group and a pyrimidinylene group, but are not limited thereto.

$X_1$ and $X_2$ in Formula 1 may each be independently selected from Formulae 2a to 2h below, but are not limited thereto:

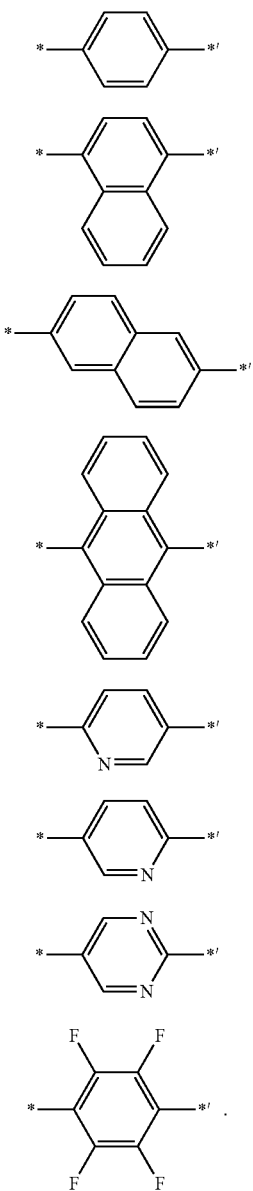

* in Formulae 2a to 2h indicates a binding site to a corresponding N of Formula 1, and *' indicates a binding site to a corresponding position on the benzofluorene ring of Formula 1.

According to an embodiment of the present invention, n1 and n2 in Formula 1 are each independently selected from an integer of 0 to 3, and when n1 is an integer of 2 or more, 2 or more of $X_1$ may be identical to or different from each other, and when n2 is an integer of 2 or more, 2 or more of $X_2$ may be identical to or different from each other, but n1 and n2 are not limited thereto. The sum of n1 and n2 may be an integer of 1 to 6.

When n1 or n2 is 0, the benzofluorene ring of Formula 1 directly binds to a corresponding N of Formula 1.

According to embodiments of the present invention, the sum of n1 and n2 in Formula 1 is an integer of at least 1. That is, according to embodiments of the present invention, at least one N of Formula 1 does not bind directly to the benzofluorene ring.

For example, n1 and n2 in Formula 1 are each independently selected from 0 or 1, with the sum of n1 and n2 being at least 1, but n1 and n2 are not limited thereto.

For example, n1 and n2 in Formula 1 may each be 1, but are not limited thereto.

According to an embodiment of the present invention, $Ar_1$ to $Ar_4$ in Formula 1 are each independently selected from a substituted or unsubstituted $C_6$-$C_{30}$ aryl group and a substituted or unsubstituted $C_2$-$C_{30}$ heteroaryl group, but are not limited thereto.

For example, $Ar_1$ to $Ar_4$ in Formula 1 may each be independently selected from a substituted or unsubstituted phenyl group, a substituted or unsubstituted pentalenyl group, a substituted or unsubstituted indenyl group, a substituted or unsubstituted a naphtyl group, a substituted or unsubstituted azulenyl group, a substituted or unsubstituted heptalenyl group, a substituted or unsubstituted indacenyl group, a substituted or unsubstituted acenaphtyl group, a substituted or unsubstituted fluorenyl group, a substituted or unsubstituted spiro-fluorenyl group group, a substituted or unsubstituted phenalenyl group, a substituted or unsubstituted phenanthrenyl group, a substituted or unsubstituted anthryl group, a substituted or unsubstituted fluoranthenyl group, a substituted or unsubstituted triphenylenyl group, a substituted or unsubstituted pyrenyl group, a substituted or unsubstituted chrysenyl group, a substituted or unsubstituted naphthacenyl, a substituted or unsubstituted picenyl group, a substituted or unsubstituted perylenyl group, a substituted or unsubstituted a pentaphenyl group, a substituted or unsubstituted hexacenyl group, a substituted or unsubstituted pyrrolyl group, a substituted or unsubstituted imidazolyl group, a substituted or unsubstituted pyrazolyl group, a substituted or unsubstituted pyridinyl group, a substituted or unsubstituted pyrazinyl group, a substituted or unsubstituted pyrimidinyl group, a substituted or unsubstituted pyridazinyl group, a substituted or unsubstituted isoindolyl group, a substituted or unsubstituted indolyl group, a substituted or unsubstituted indazolyl group, a substituted or unsubstituted purinyl group, a substituted or unsubstituted quinolinyl group, a substituted or unsubstituted benzoquinolinyl group, a substituted or unsubstituted phthalazinyl group, a substituted or unsubstituted naphthyridinyl group, a substituted or unsubstituted quinoxalinyl group, a substituted or unsubstituted quinazolinyl group, a substituted or unsubstituted cinnolinyl group, a substituted or unsubstituted carbazolyl group, a substituted or unsubstituted phenanthridinyl group, a substituted or unsubstituted acridinyl group, a substituted or unsubstituted phenanthrolinyl group, a substituted or unsubstituted phenazinyl group, a substituted or unsubstituted benzoimidazolyl group, a substituted or unsubstituted furanyl group, a substituted or unsubstituted benzofuranyl group, a substituted or unsubstituted thiophenyl group, a substituted or unsubstituted benzothiophenyl group, a substituted or unsubstituted thiazolyl group, a substituted or unsubstituted isothiazolyl group, a substituted or unsubstituted benzothiazolyl group, a substituted or unsubstituted isoxazolyl group, a substituted or unsubstituted oxazolyl group, a substituted or unsubstituted triazolyl group, a substituted or unsubstituted tetrazolyl group, a substituted or unsubstituted oxadiazolyl group, a substituted or unsubstituted triazinyl group, a substituted or unsubstituted benzooxazolyl group, a substituted or unsubstituted dibenzofuranyl group, a substituted or unsubstituted dibenzothiophenyl group, and a substituted or unsubstituted benzocarbazolyl, but $Ar_1$ to $Ar_4$ are not limited thereto.

For example, $Ar_1$ to $Ar_4$ in Formula 1 may each be independently selected from:

a phenyl group, a naphthyl group, an anthryl group, a fluorenyl group, a benzofuranyl group, a benzothiophenyl group, a dibenzofuranyl group, and a dibenzothiophenyl group;

a phenyl group, a naphthyl group, an anthryl group, a fluorenyl group, a benzofuranyl group, a benzothiophenyl group, a dibenzofuranyl group, and a dibenzothiophenyl group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, and —$Si(Q_1)(Q_2)(Q_3)$ (wherein $Q_1$ to $Q_3$ are each independently selected from a hydrogen atom, a deuterium atom, or a $C_1$-$C_{10}$ alkyl group) and a $C_1$-$C_{10}$ alkyl group;

a $C_1$-$C_{10}$ alkyl group substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a $C_6$-$C_{16}$ aryl group and a $C_2$-$C_{16}$ heteroaryl group; and a $C_6$-$C_{16}$ aryl group and a $C_2$-$C_{16}$ heteroaryl group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_6$-$C_{16}$ aryl group, and a $C_2$-$C_{16}$ heteroaryl group, but $Ar_1$ to $Ar_4$ are not limited thereto.

For example, $Ar_1$ to $Ar_4$ in Formula 1 may each be independently selected from a phenyl group, a naphthyl group, an anthryl group, a fluorenyl group, a benzofuranyl group, a benzothiophenyl group, a dibenzofuranyl group, and a dibenzothiophenyl group; and a phenyl group, a naphthyl group, an anthryl group, a fluorenyl group, a benzofuranyl group, a benzothiophenyl group, a dibenzofuranyl group, and a dibenzothiophenyl group, each substituted with at least one selected from a deuterium atom, —F, a hydroxyl group, a cyano group, a nitro group, —$Si(Q_1)(Q_2)(Q_3)$ (wherein $Q_1$ to $Q_3$ are each independently selected from a hydrogen atom, a deuterium atom, a methyl group, an ethyl group, an n-propyl group, an i-propyl group, an n-butyl group, a sec-butyl group, an i-butyl group, and a t-butyl group), a methyl group, an ethyl group, an n-propyl group, an i-propyl group, an n-butyl group, a sec-butyl group, an i-butyl group, a t-butyl group, a phenyl group, a naphthyl group, an anthryl group, a pyridyl group, a pyrimidyl group, and a triazinyl group, but $Ar_1$ to $Ar_4$ are not limited thereto.

For example, $Ar_1$ to $Ar_4$ in Formula 1 may each be independently selected from a phenyl group, a naphthyl group, a fluorenyl group, a dibenzofuranyl group, and a dibenzothiophenyl group; and a phenyl group, a naphthyl group, a fluorenyl group, a dibenzofuranyl group, and a dibenzothiophenyl group, each substituted with at least one selected from a deuterium atom, —F, a cyano group, a nitro group, —$Si(Q_1)(Q_2)(Q_3)$ (wherein $Q_1$ to $Q_3$ are each independently selected from a methyl group, an ethyl group, and a t-butyl group), a methyl group, an ethyl group, a t-butyl group, a phenyl group, and a pyridyl group, but $Ar_1$ to $Ar_4$ are not limited thereto.

For example, $Ar_1$ to $Ar_4$ in Formula 1 may each be independently selected from Formulae 3a to 3m below, but are not limited thereto:

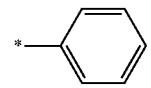

3a

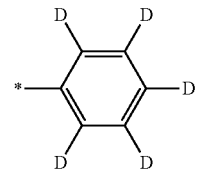

3b

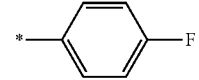

3c

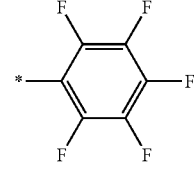

3d

3e

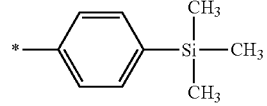

3f

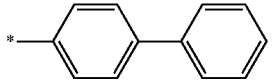

3g

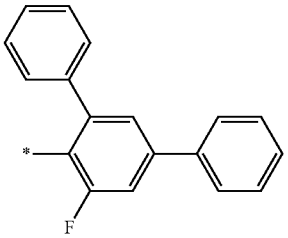

3h

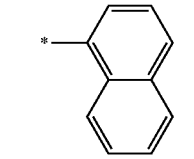

3i

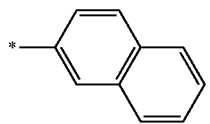

3j

-continued

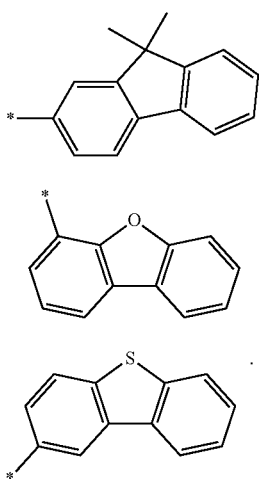

3k

3l

3m

* in Formulae 3a to 3m indicates a binding site to a corresponding N of Formula 1.

According to an embodiment of the present invention, $R_1$ to $R_4$ are each independently selected from a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{30}$ alkyl group, a substituted or unsubstituted $C_2$-$C_{60}$ alkenyl group, a substituted or unsubstituted $C_2$-$C_{60}$ alkynyl group, a substituted or unsubstituted $C_3$-$C_{10}$ cycloalkyl group, a substituted or unsubstituted $C_2$-$C_{10}$hetero cycloalkyl group, a substituted or unsubstituted $C_3$-$C_{10}$ cycloalkenyl group, a substituted or unsubstituted $C_2$-$C_{10}$hetero cycloalkenyl group, a substituted or unsubstituted $C_6$-$C_{30}$ aryl group, and a substituted or unsubstituted $C_2$-$C_{30}$ heteroaryl group, but are not limited thereto.

For example, $R_1$ and $R_2$ in Formula 1 may each be independently selected from a hydrogen atom, a deuterium atom, a halogen atom, a hydroxyl group, a cyano group, a nitro group, a substituted or unsubstituted $C_1$-$C_{30}$ alkyl group, and a substituted or unsubstituted $C_6$-$C_{30}$ aryl group, but are not limited thereto.

For example, $R_1$ and $R_2$ in Formula 1 may each be independently selected from a hydrogen atom, a deuterium atom, a methyl group, and a phenyl group; and a methyl group, and a phenyl group, each substituted with at least one selected from a hydrogen atom, a deuterium atom, a halogen atom, a cyano group, and a nitro group, but are not limited thereto.

For example, $R_1$ and $R_2$ in Formula 1 may each be independently selected from a methyl group, —$CD_3$, and a phenyl group, but are not limited thereto.

For example, $R_3$ and $R_4$ in Formula 1 may each be independently selected from a hydrogen atom, a deuterium atom, —F, a cyano group, a nitro group, a methyl group, an ethyl group, an n-propyl group, an i-propyl group, an n-butyl group, an i-butyl group, and a t-butyl group;
a methyl group, an ethyl group, an n-propyl group, an i-propyl group, an n-butyl group, an i-butyl group, and a t-butyl group, each substituted with at least one selected from a hydrogen atom, a deuterium atom, —F, a cyano group, a nitro group, a methyl group, an ethyl group, an n-propyl group, an i-propyl group, an n-butyl group, an i-butyl group, and a t-butyl group;
a phenyl group, a naphthyl group, and an anthracenyl group; and
a phenyl group, a naphthyl group, and an anthracenyl group, each substituted with at least one selected from a hydrogen atom, a deuterium atom, —F, a cyano group, a nitro group, a methyl group, an ethyl group, an n-propyl group, an i-propyl group, an n-butyl group, an i-butyl group, and a t-butyl group,
but $R_3$ and $R_4$ are not limited thereto.

For example, $R_3$ and $R_4$ in Formula 1 may each be independently selected from a hydrogen atom, a deuterium atom, —F, a methyl group, a t-butyl group, and a phenyl group, but are not limited thereto.

According to an embodiment of the present invention, a in Formula 1 is an integer of 0 to 3, and when a is an integer of 2 or more, 2 or more of $R_3$ may be identical to or different from each other, but a in Formula 1 is not limited thereto.

For example, a may be 0, but is not limited thereto.

According to an embodiment of the present invention, b in Formula 1 is an integer of 0 to 5, and when b is an integer of 2 or more, two or more of $R_4$ may be identical to or different from each other, but b in Formula 1 is not limited thereto.

For example, b may be 0, but is not limited thereto.

For example, a and b may both be 0, but are not limited thereto. When a and b are both 0, corresponding phenyl rings included in the benzofluorene ring are not substituted with $R_3$ and $R_4$.

According to an embodiment of the present invention, the benzofluorene-based compound represented by Formula 1 is a compound represented by one of Formulae 1a to 1c, but is not limited thereto:

Formula 1a

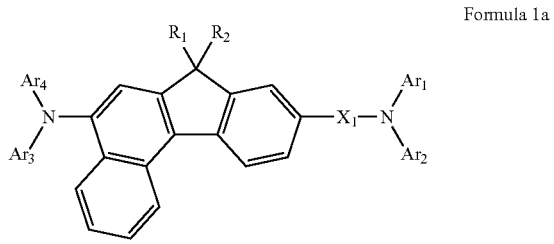

Formula 1b

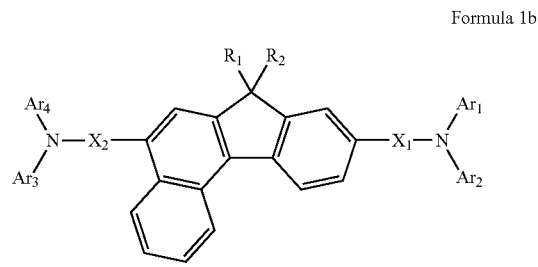

Formula 1c

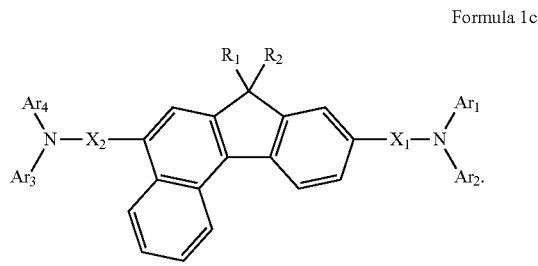

$X_1$ and $X_2$ in Formulae 1a to 1c may each be independently selected from Formulae 2a to 2h:

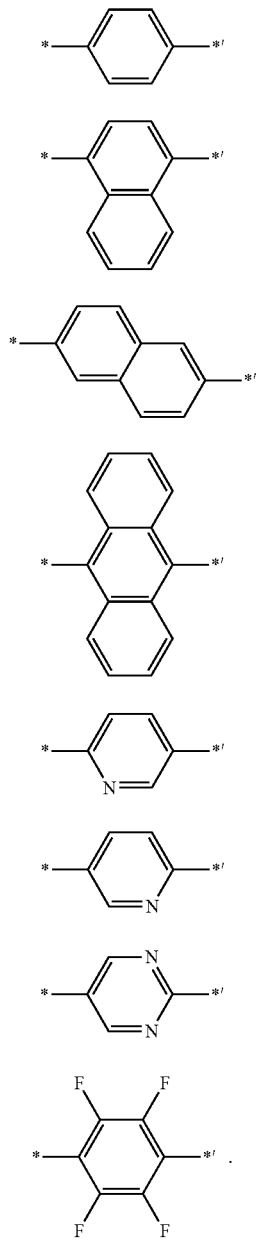

In Formulae 2a to 2h, * indicates a binding site to a corresponding N of Formulae 1a to 1c, and *' indicates a binding site to corresponding position on the benzofluorene ring of Formulae 1a to 1c.

$Ar_1$ to $Ar_4$ in Formulae 1a to 1c may each be independently selected from Formulae 3a to 3m below:

3a

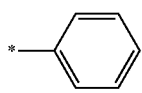

3b

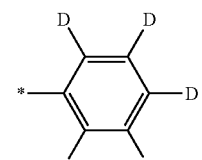

3c

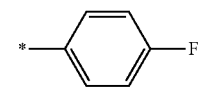

3d

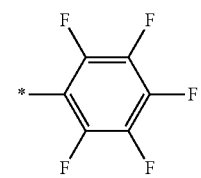

3e

3f

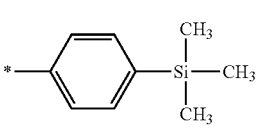

3g

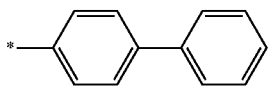

3h

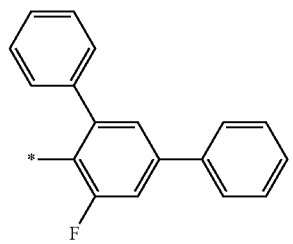

3i

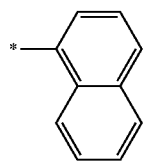

3j

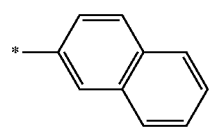

3k
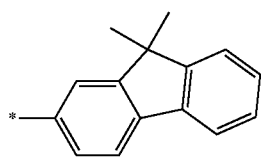

31
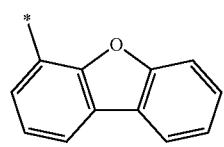

3m
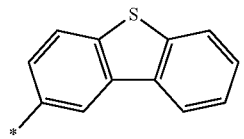

In Formulae 3a to 3m, * indicates a binding site to corresponding N of Formulae 1a to 1c.

$R_1$ and $R_2$ in Formulae 1a to 1c may each be independently selected from a methyl group, —$CD_3$, and a phenyl group.

According to an embodiment of the present invention, the benzofluorene-based compound represented by Formula 1 is selected from one of Compounds 1 to 100, but is not limited thereto:

1

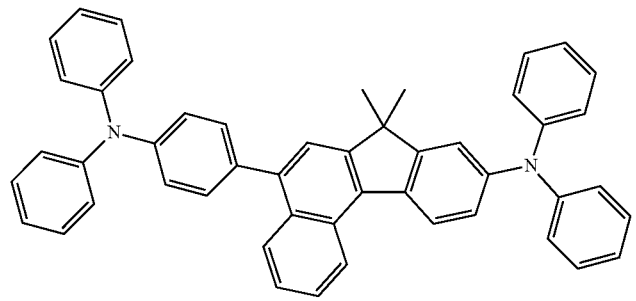

2

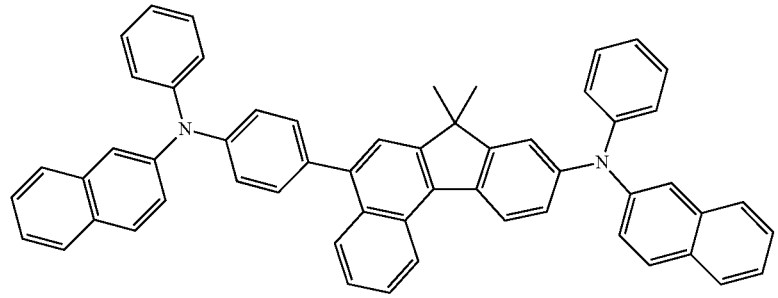

3

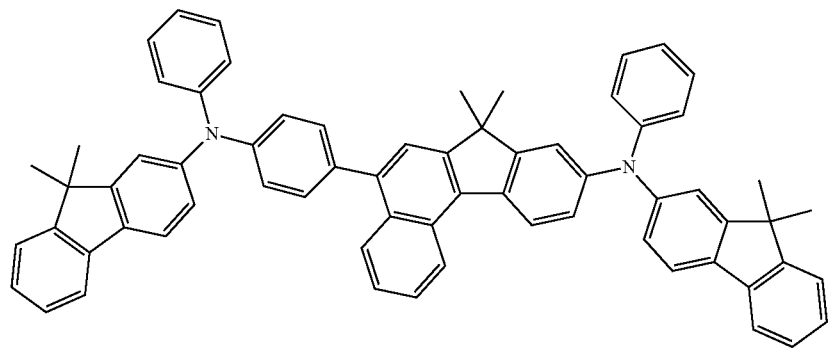

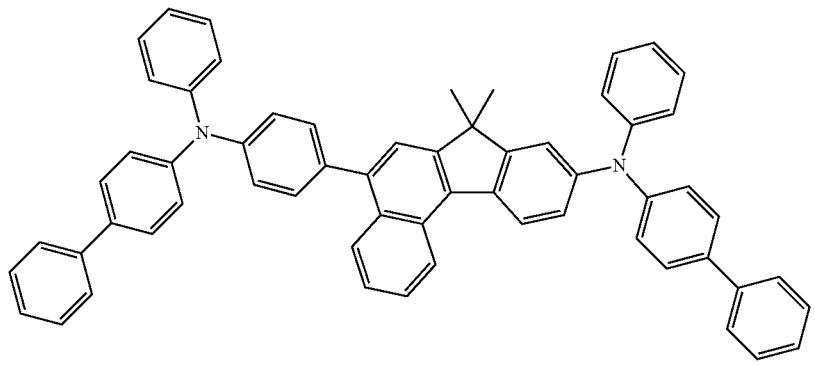
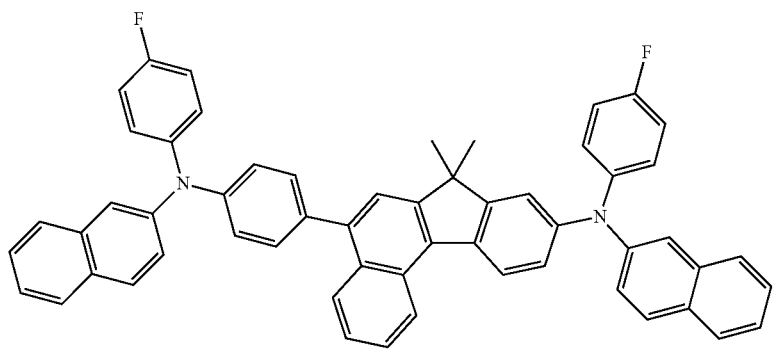
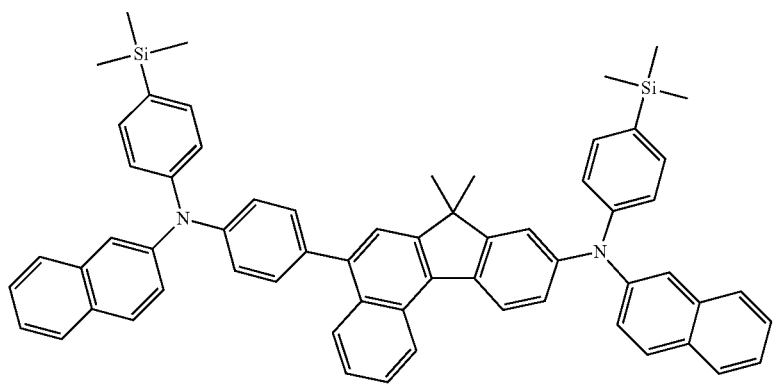
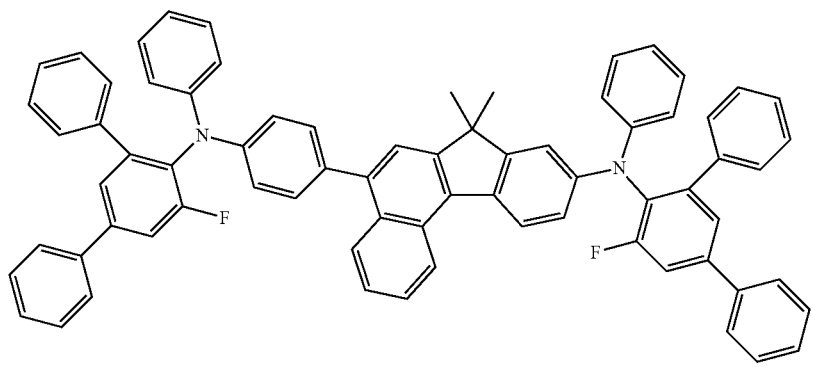

-continued
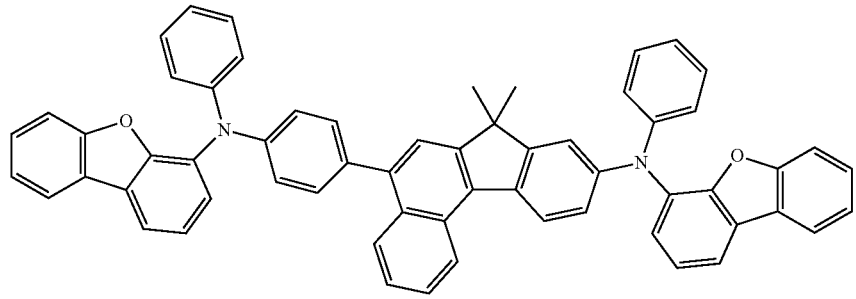
8
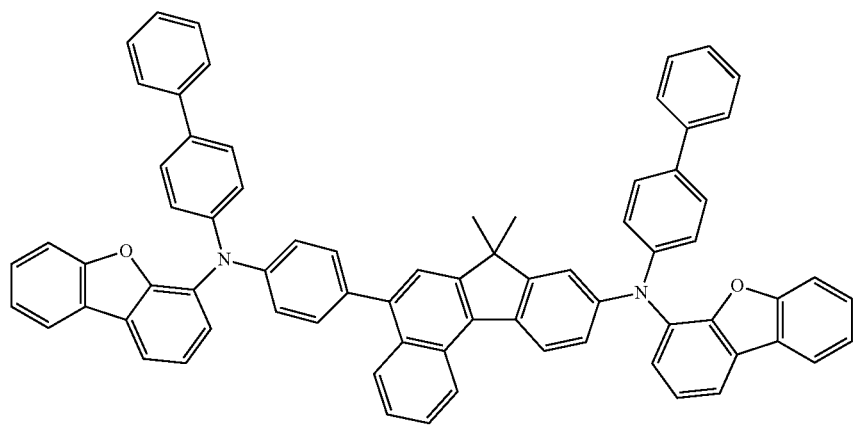
9
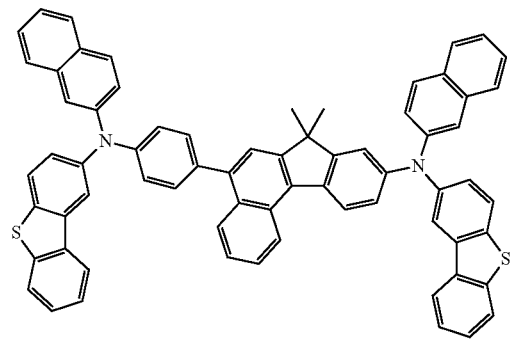
10
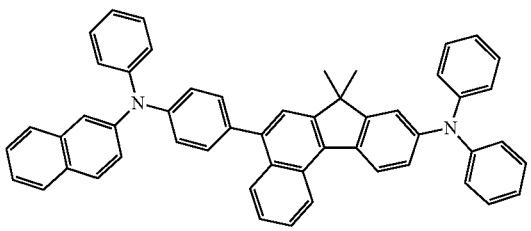
11
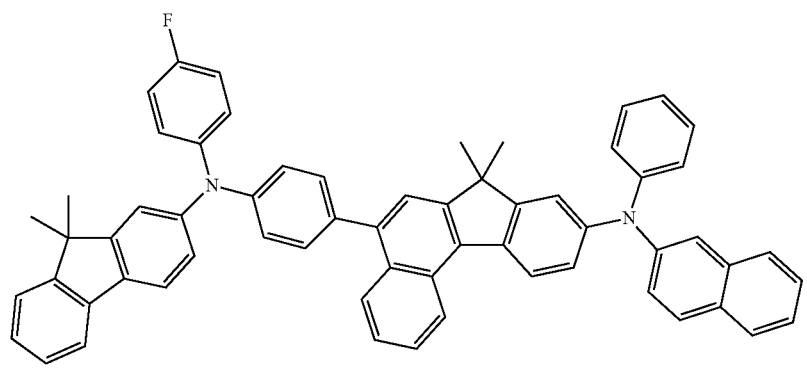
12

13
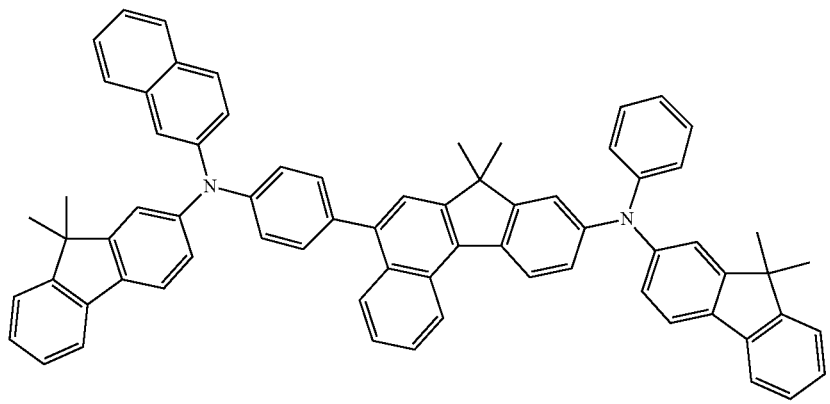
14
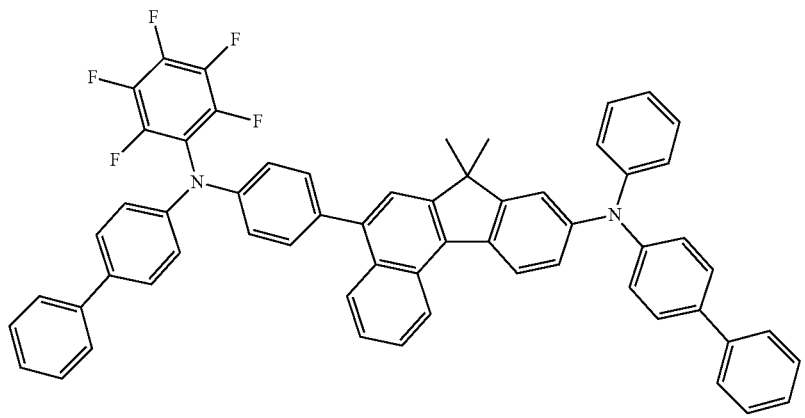
15
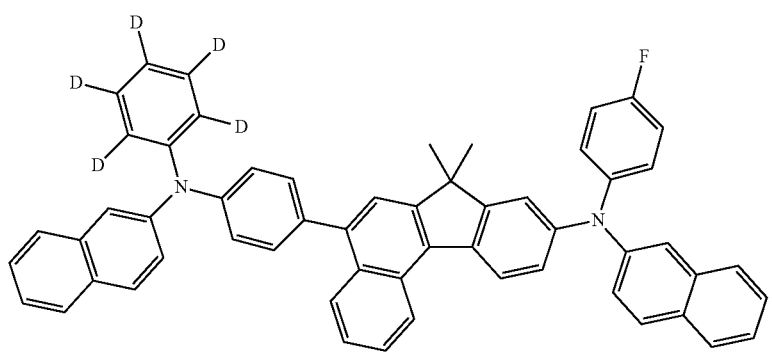
16
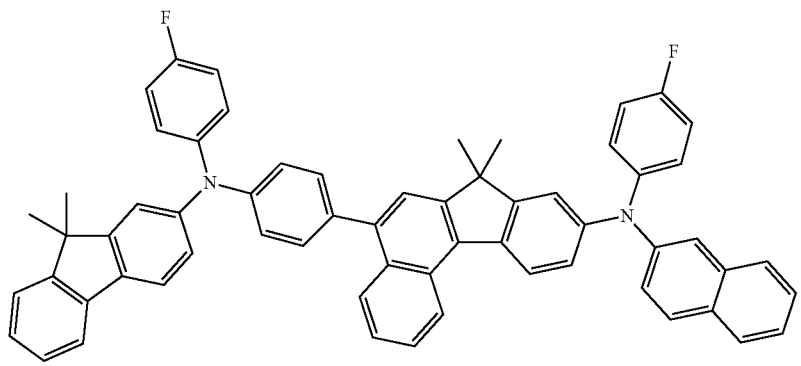

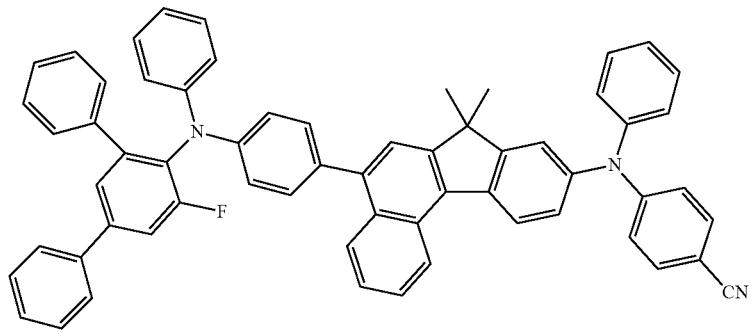
17
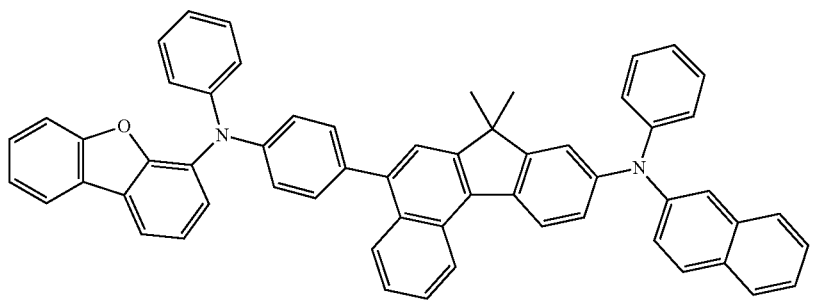
18
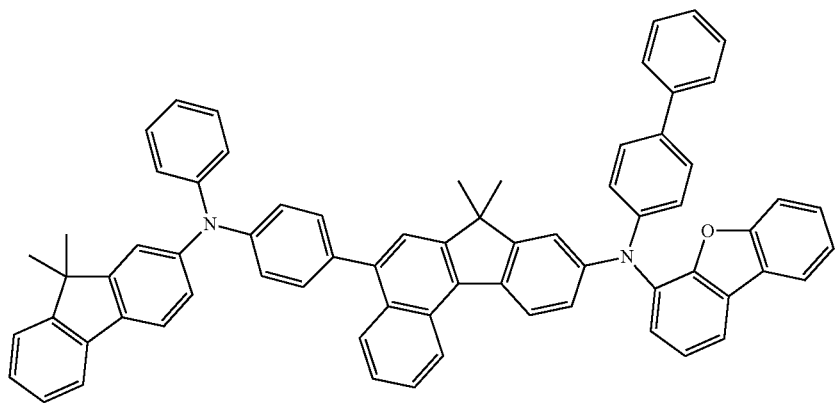
19
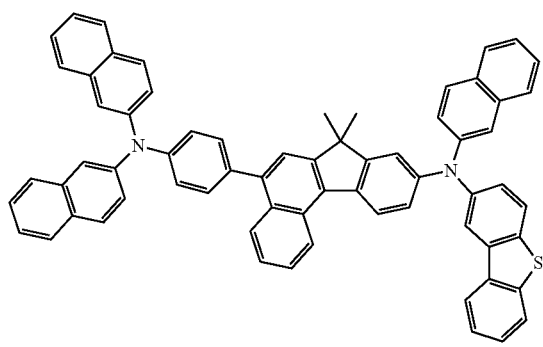
20
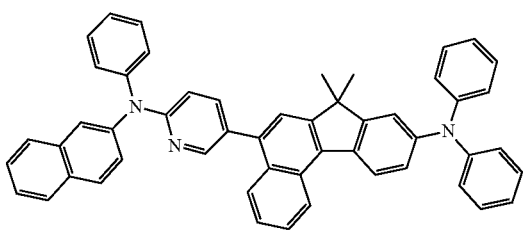
21

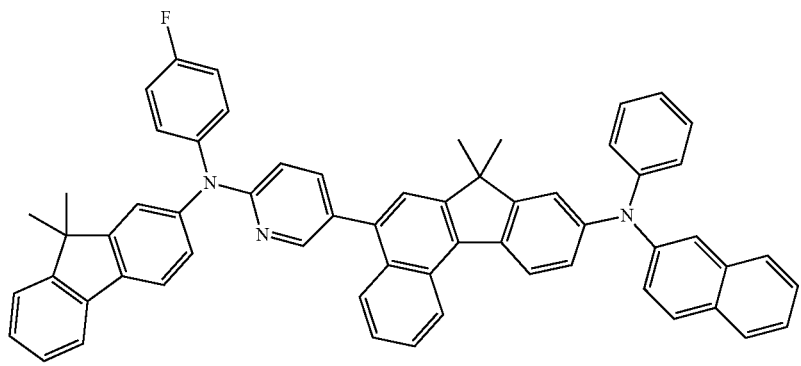
22
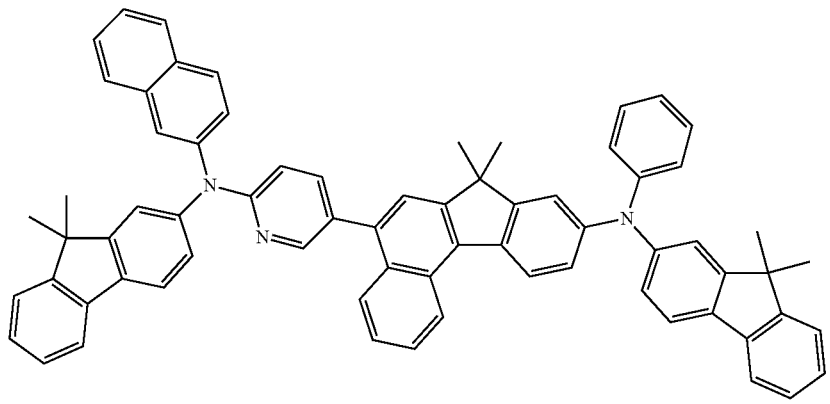
23
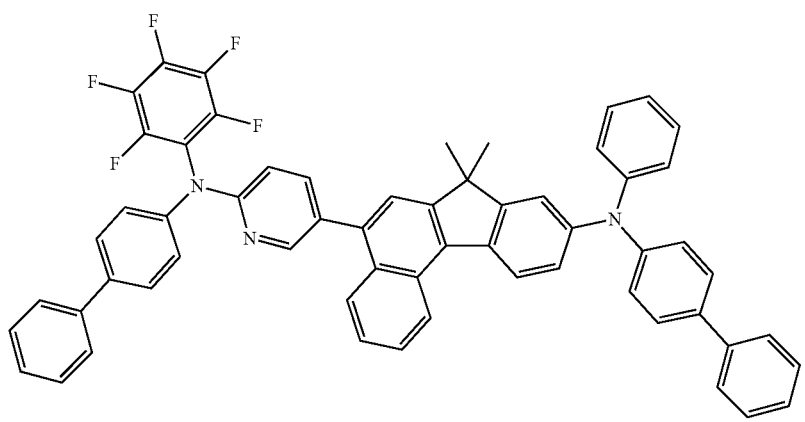
24
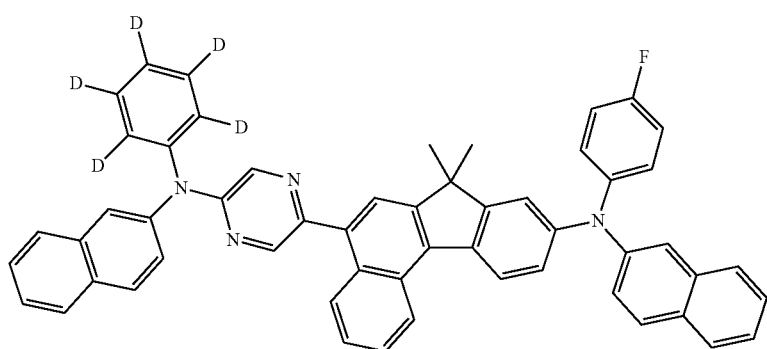
25

26
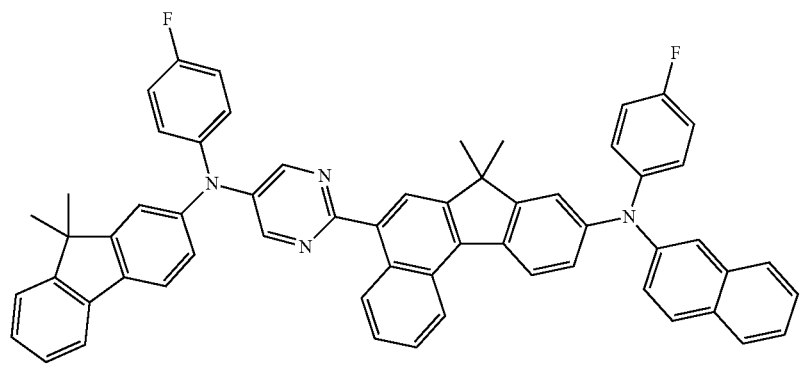
27
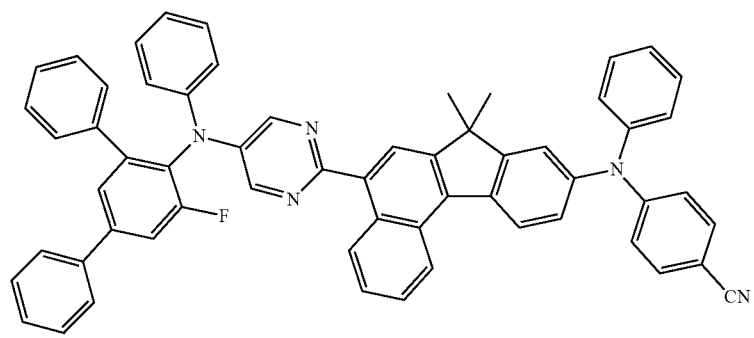
28
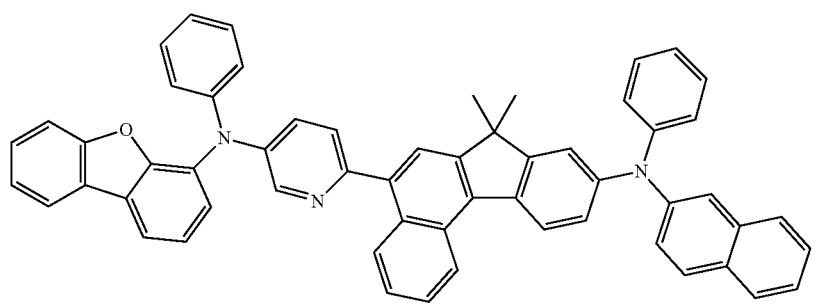
29
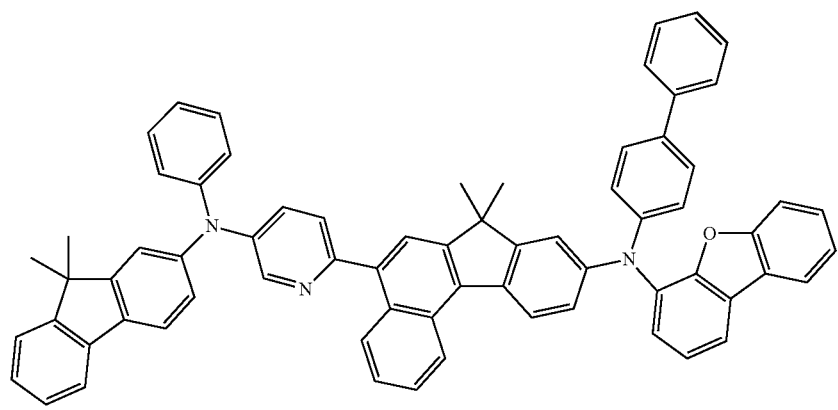

-continued
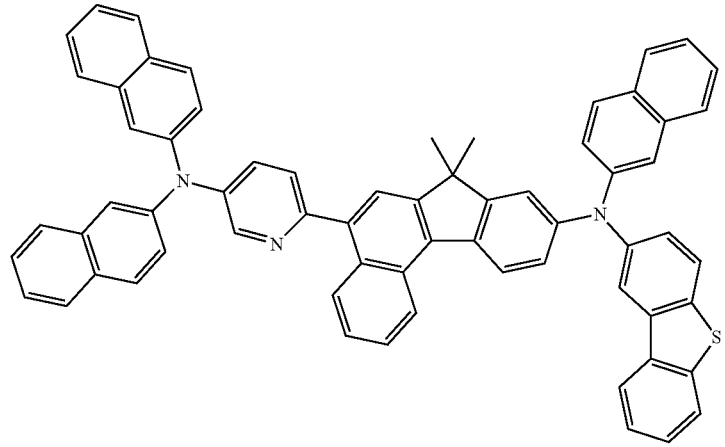
30
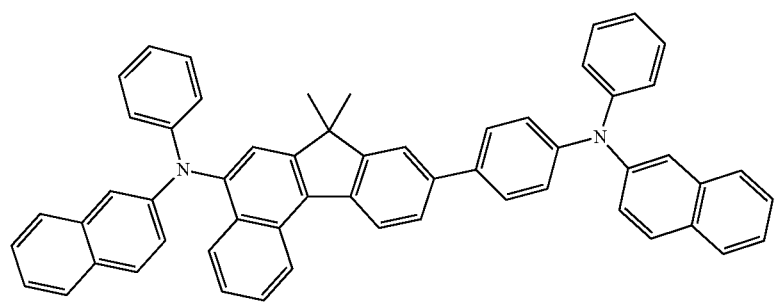
31
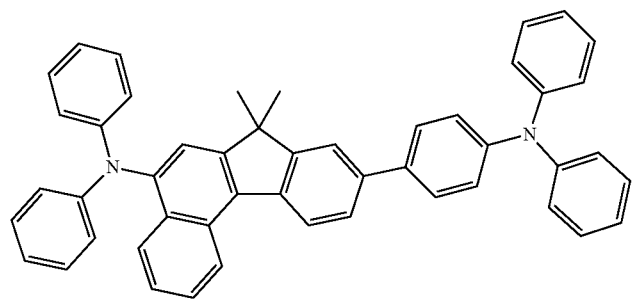
32
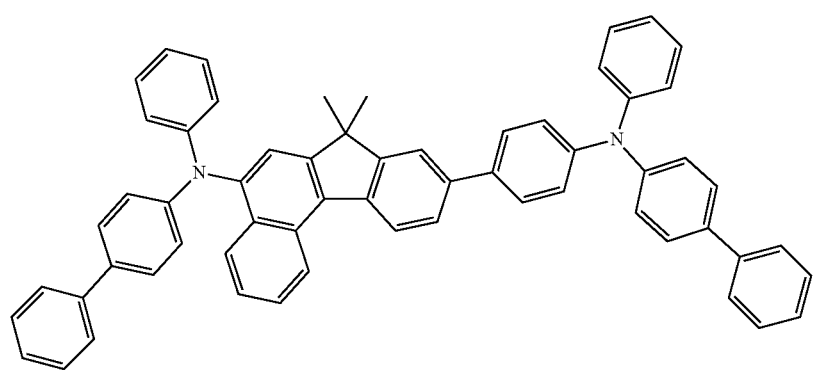
33

34
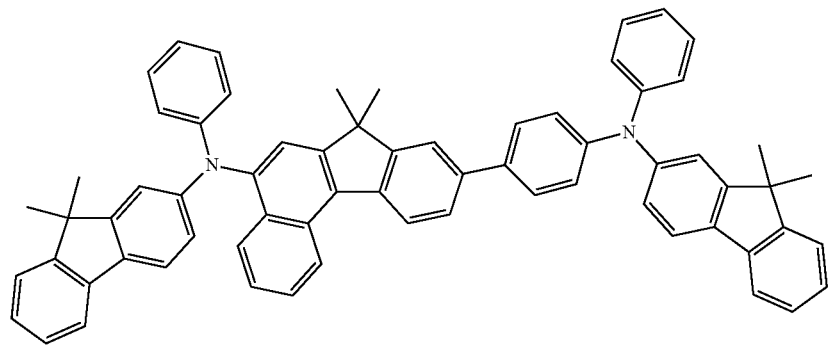
35
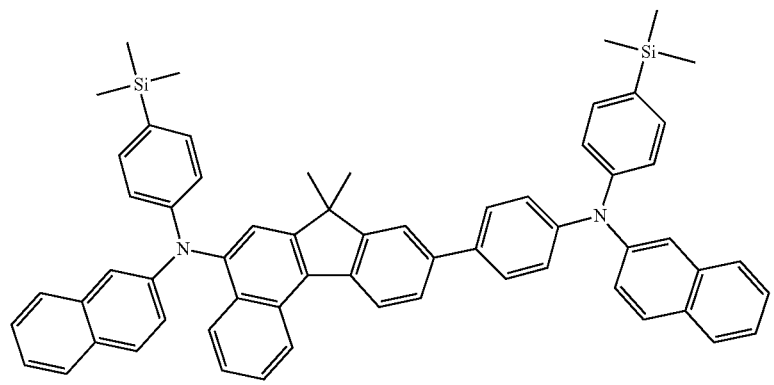
36
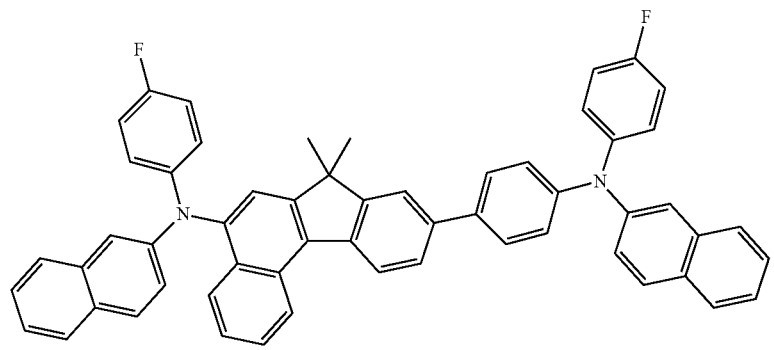
37
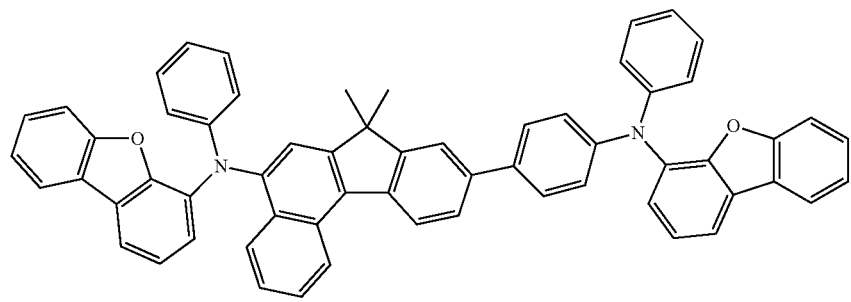

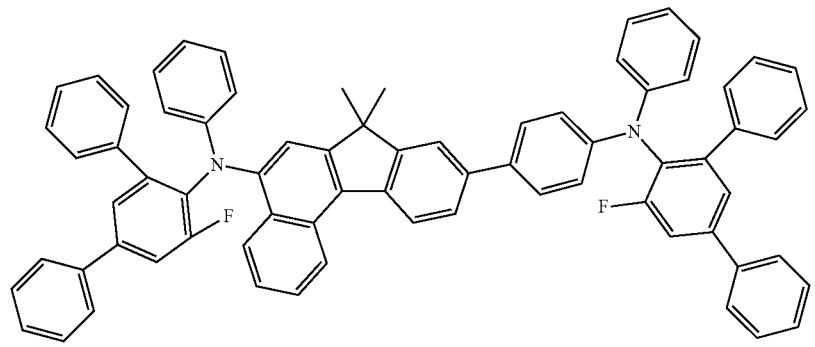
38
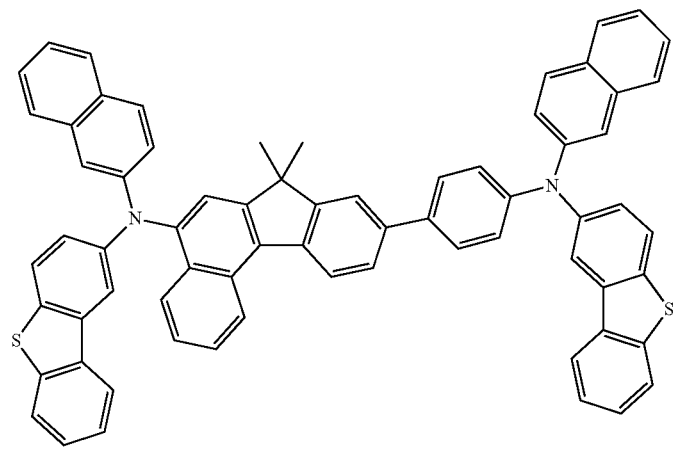
39
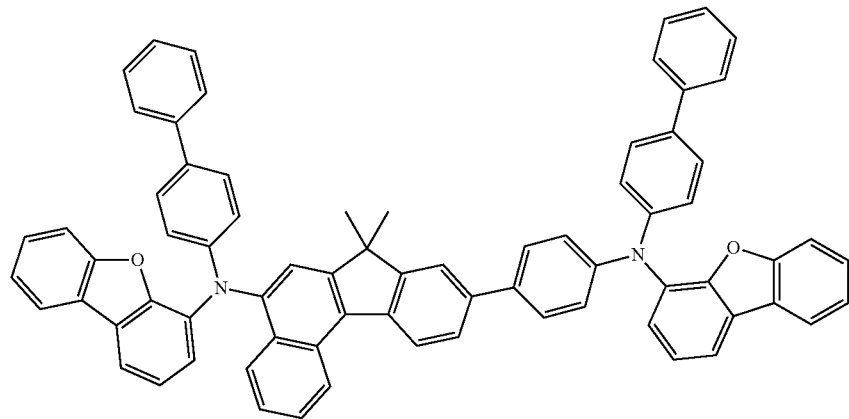
40
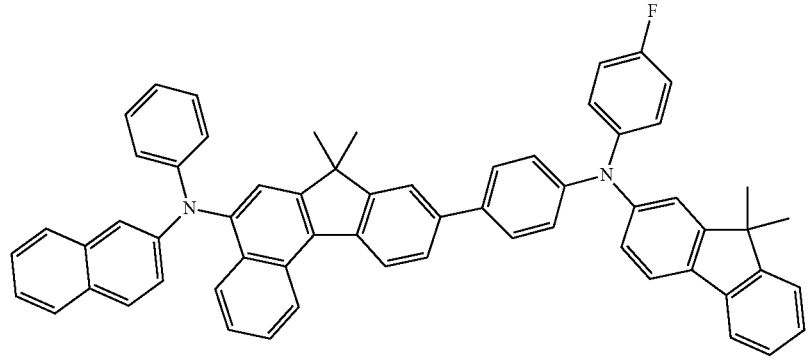
41

42
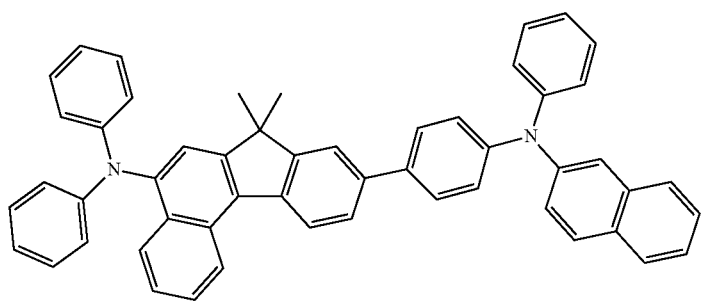
43
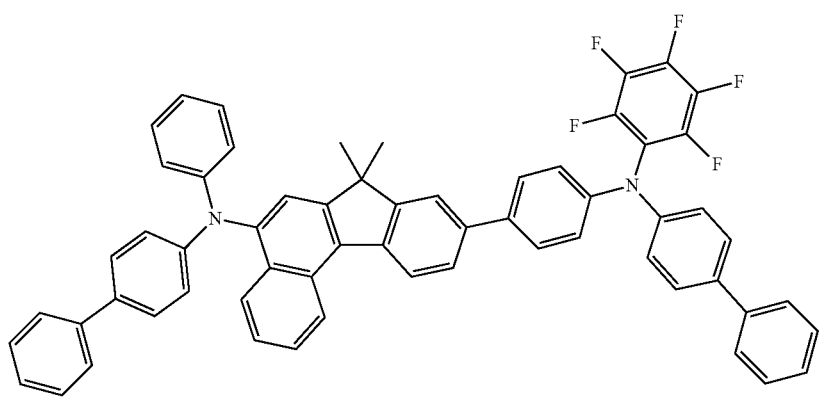
44
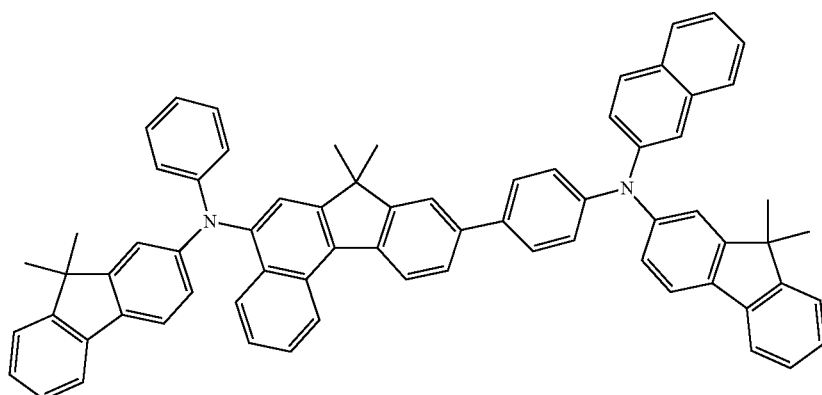
45
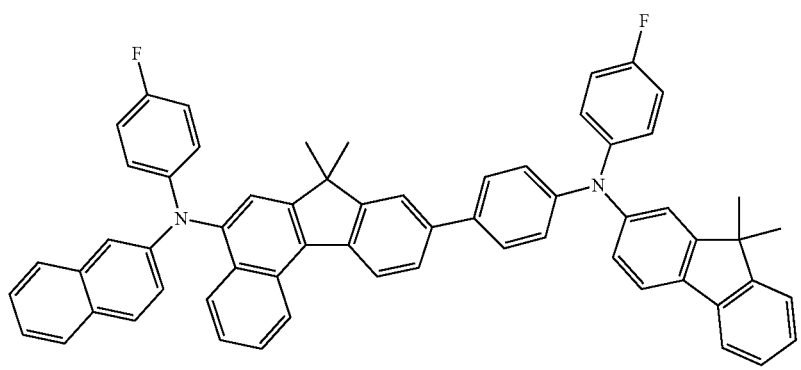

-continued
46
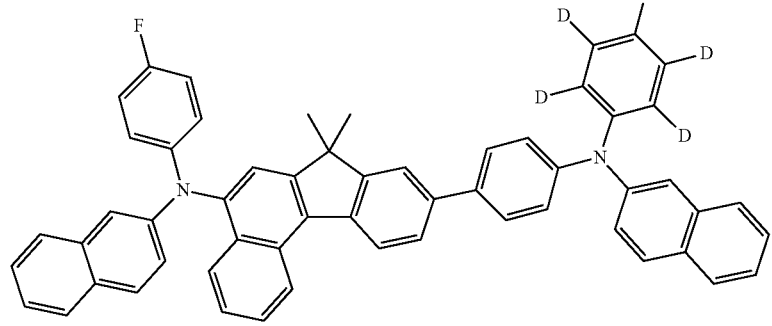
47
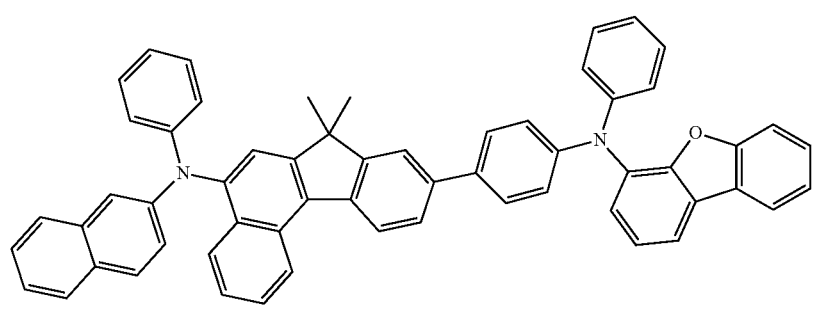
48 49
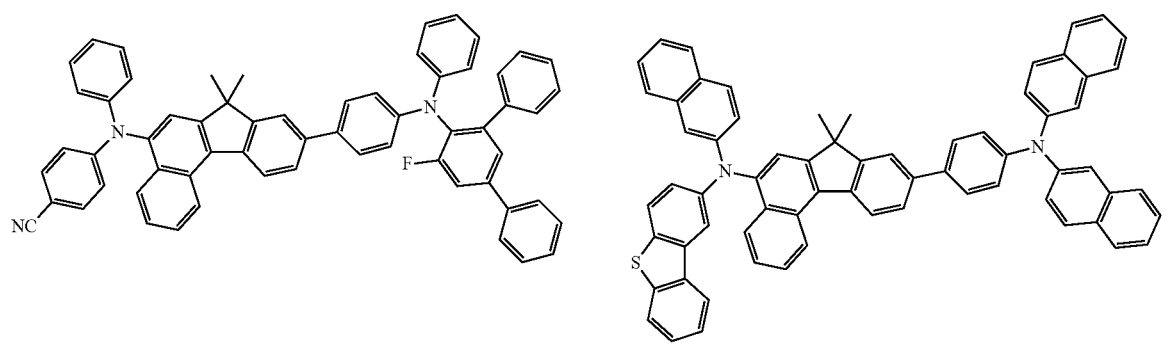
50
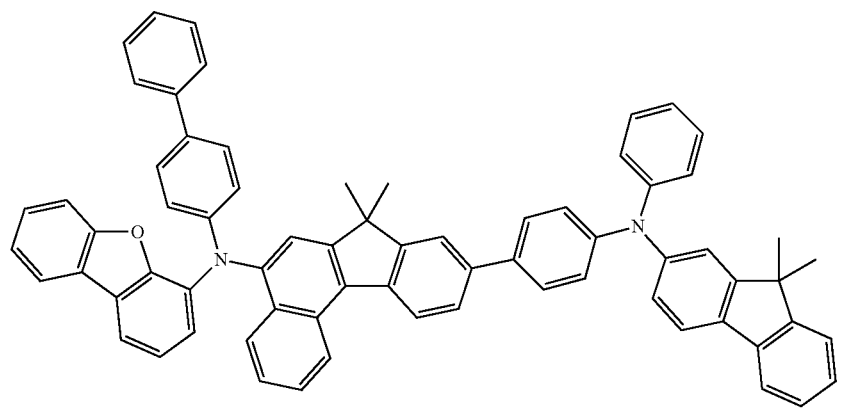

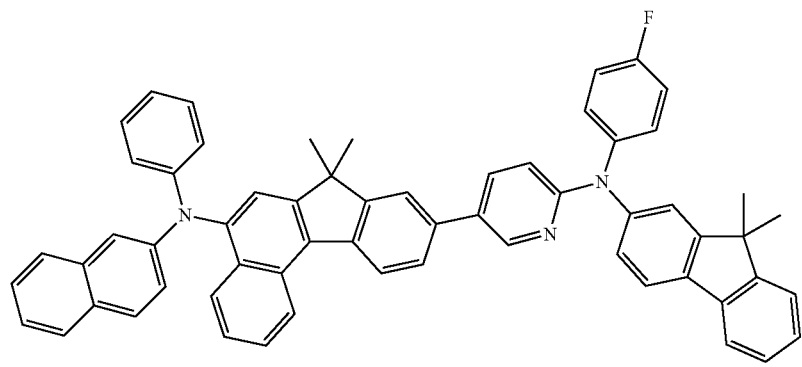
51
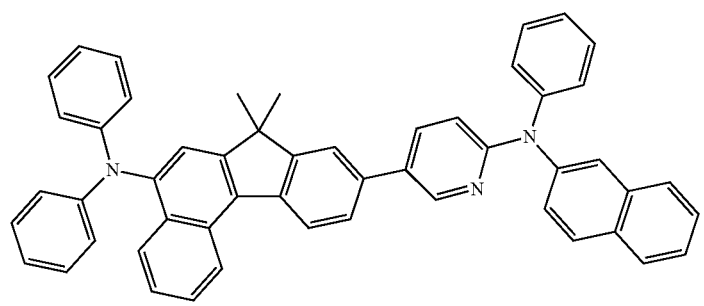
52
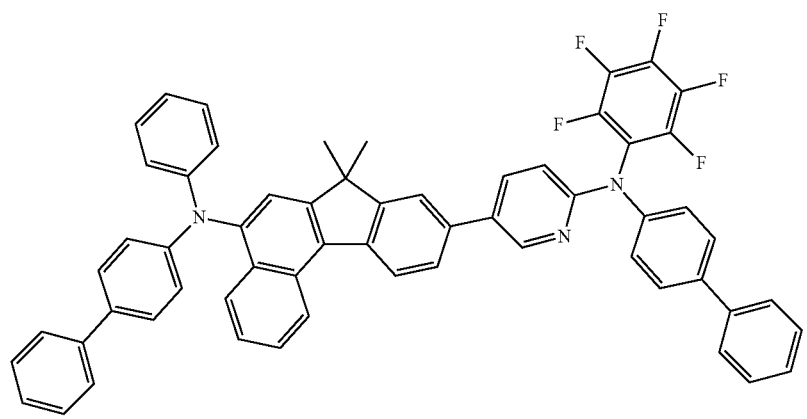
53
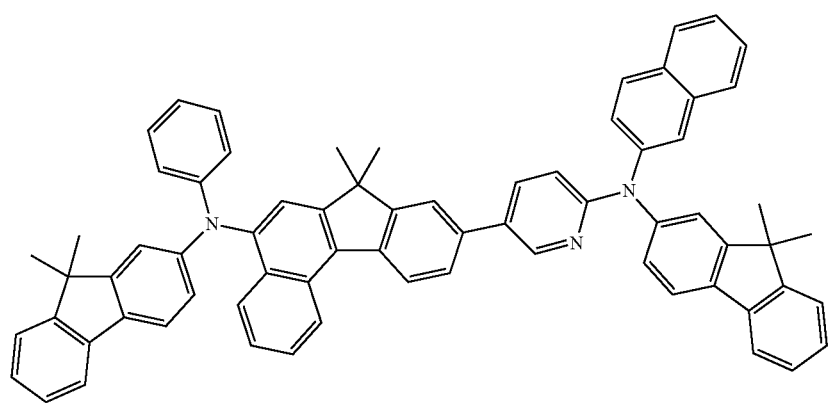
54

-continued
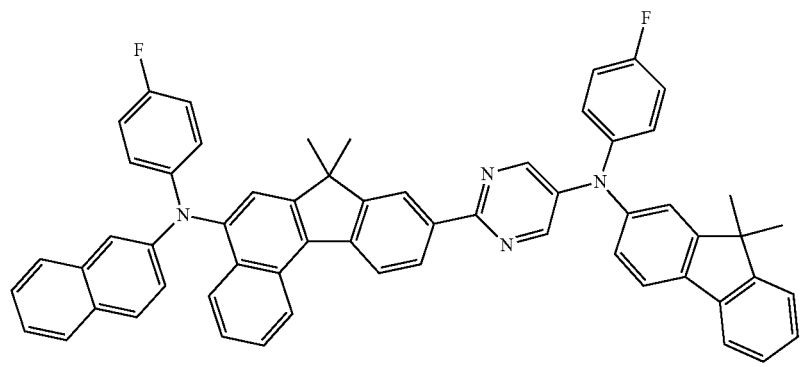
55
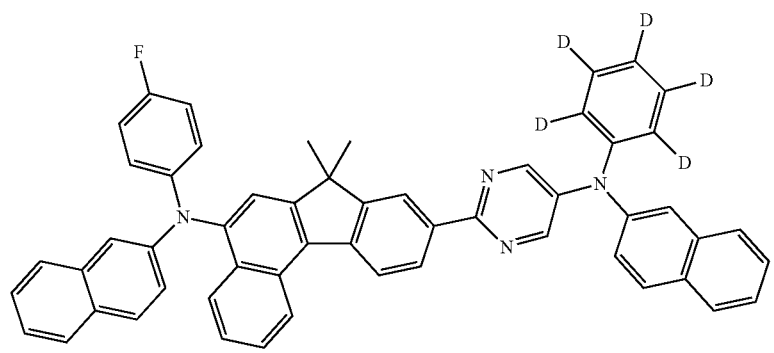
56
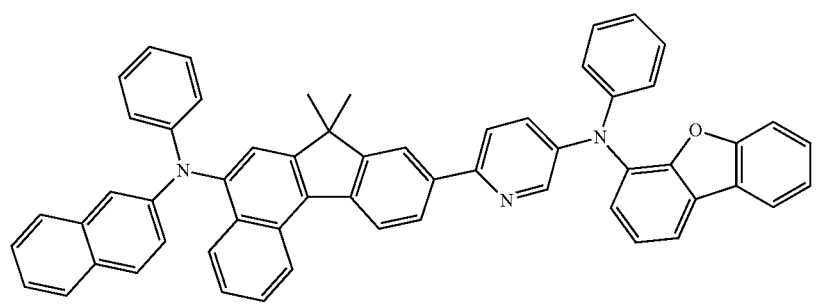
57
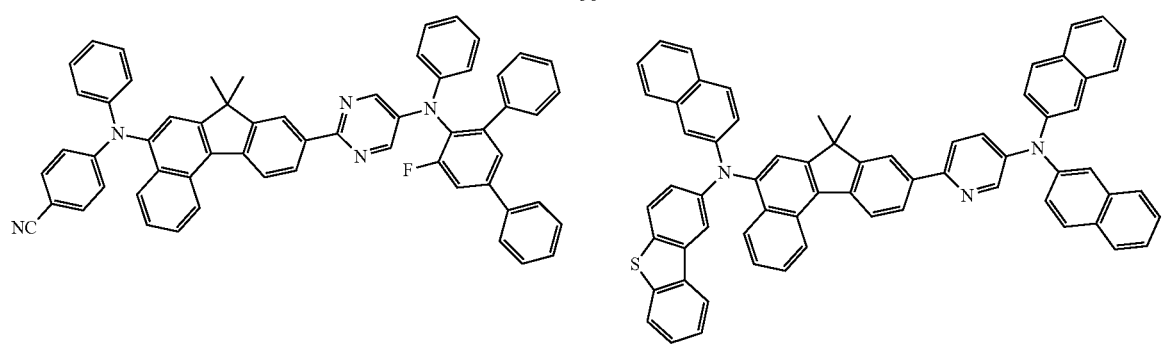
58 59

-continued
60
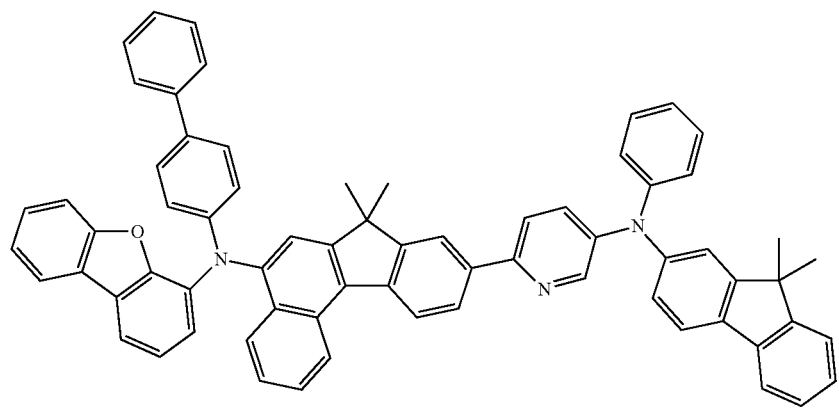
61
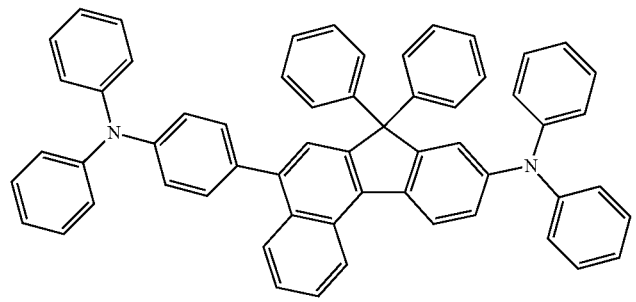
62
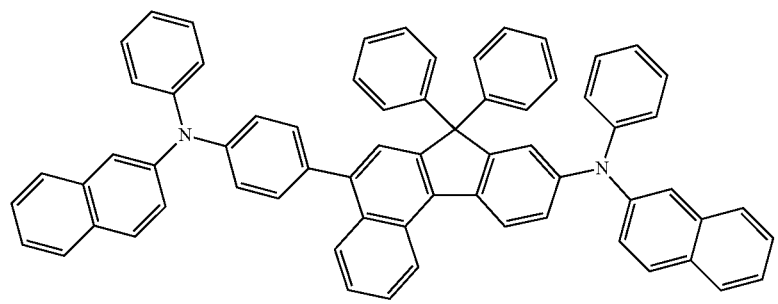
63
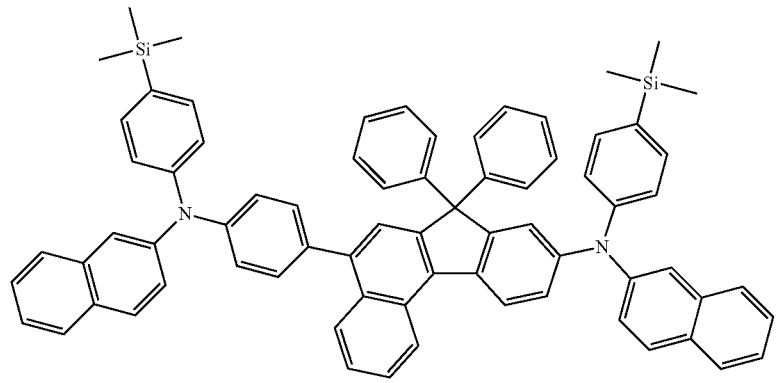

-continued
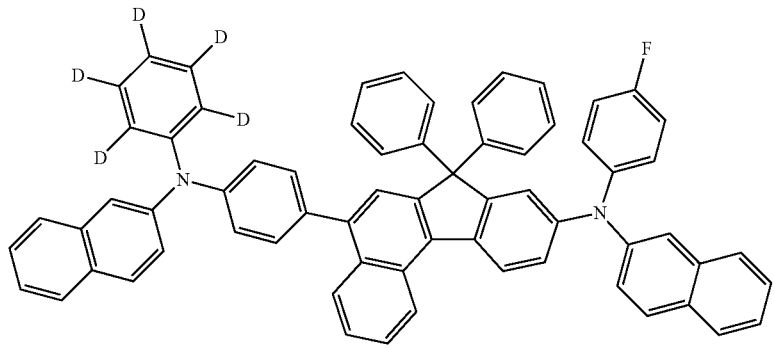
64
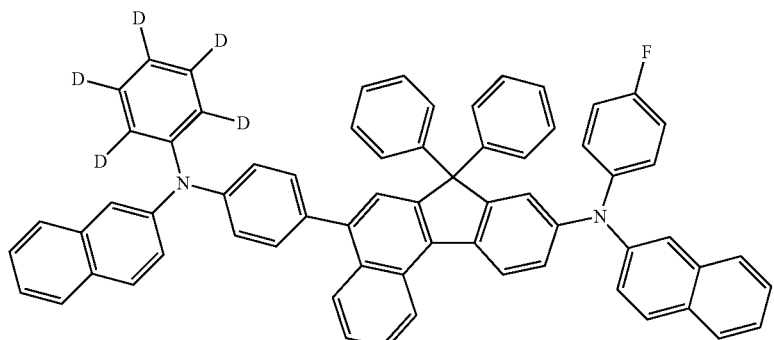
65
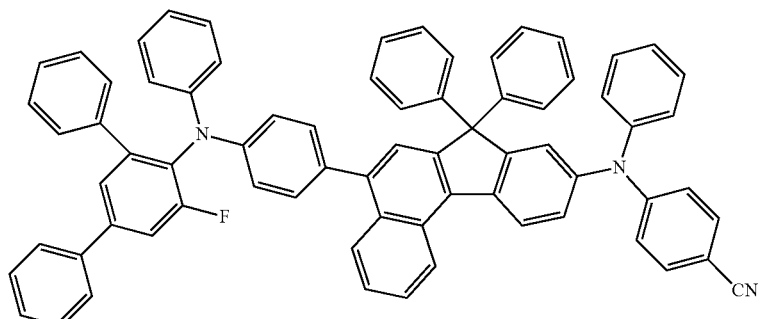
66
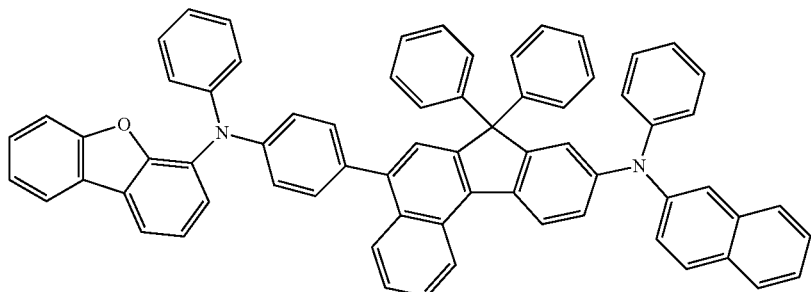
67
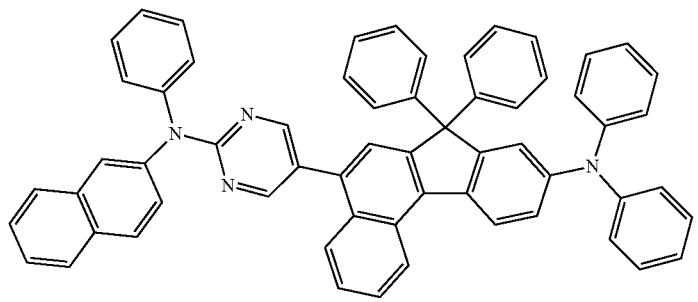
68

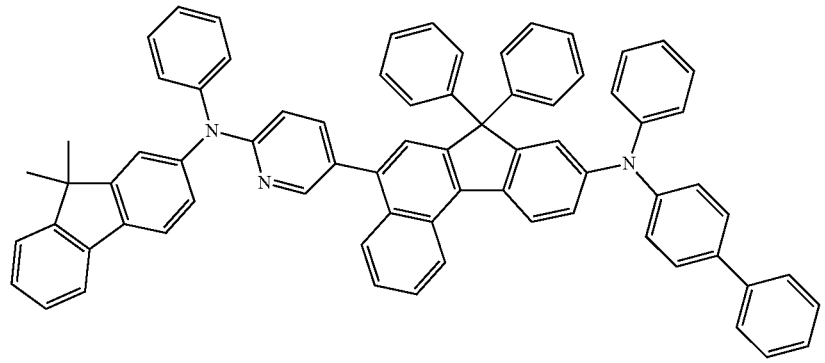
69
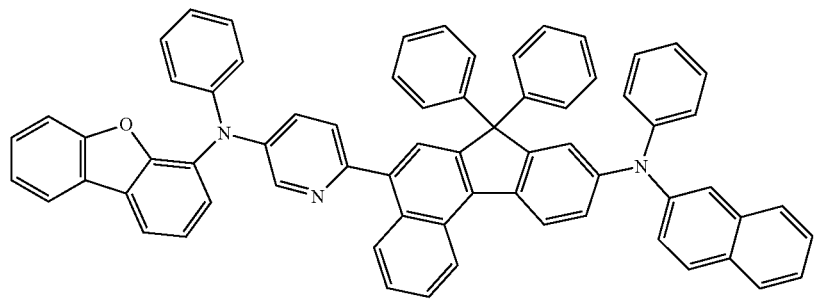
70
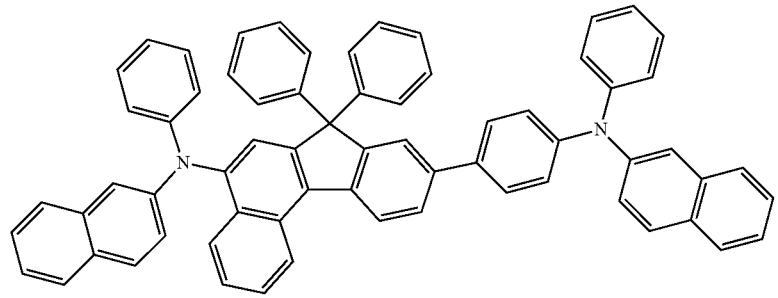
71
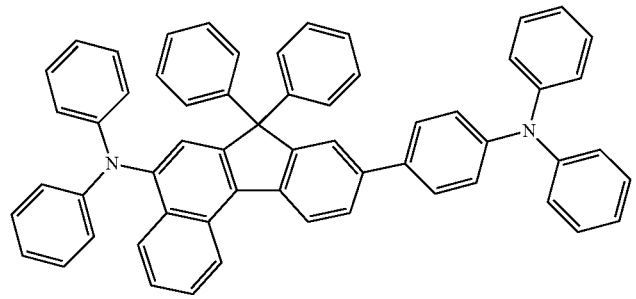
72
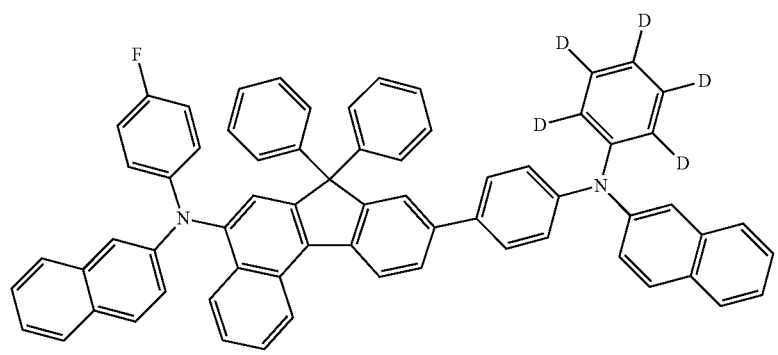
73

-continued
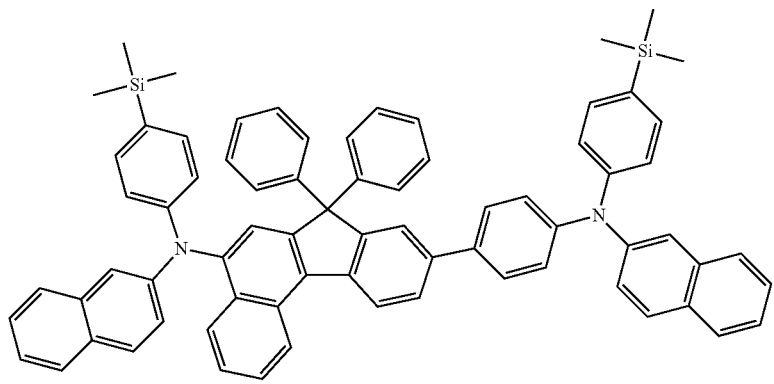
74
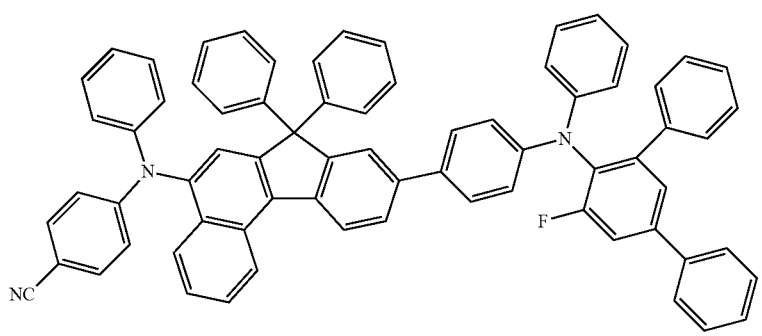
75
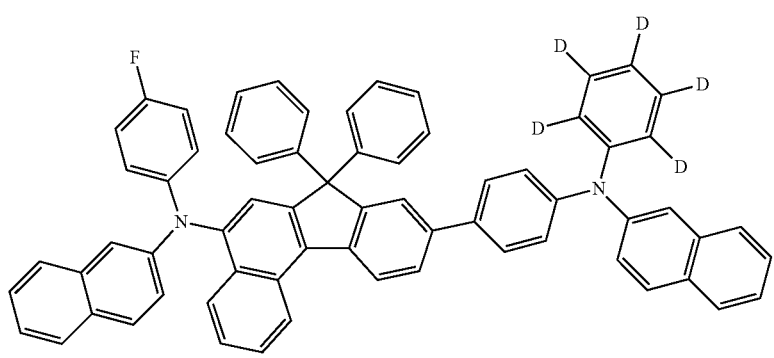
76
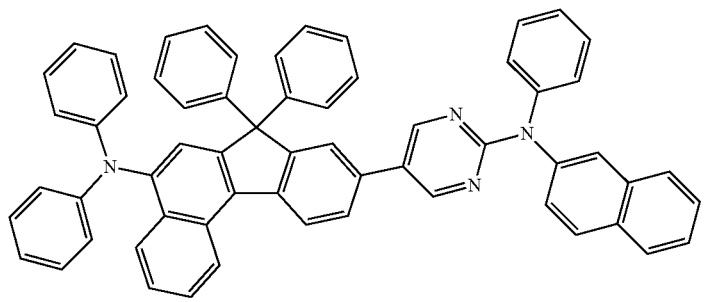
77

78
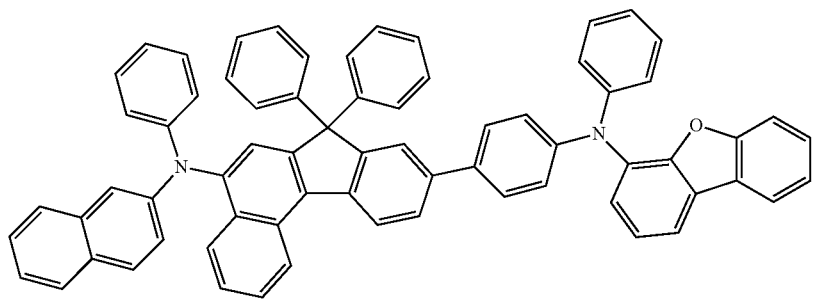
79
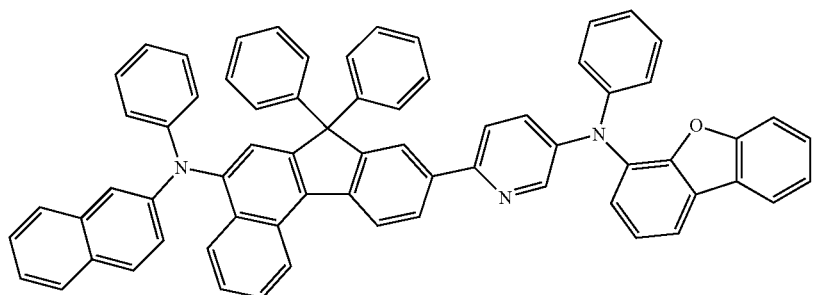
80
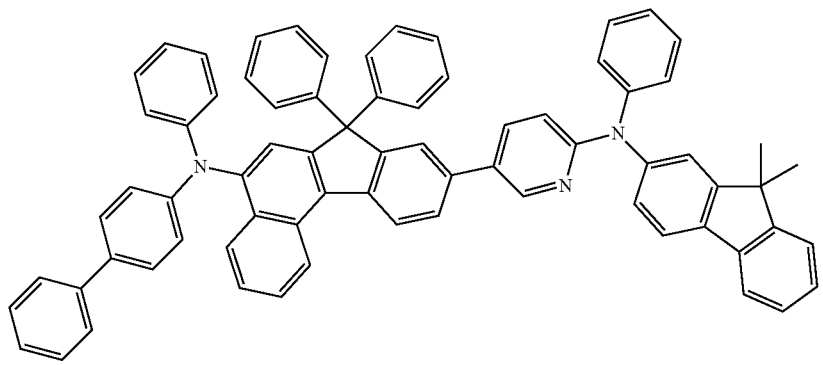
81
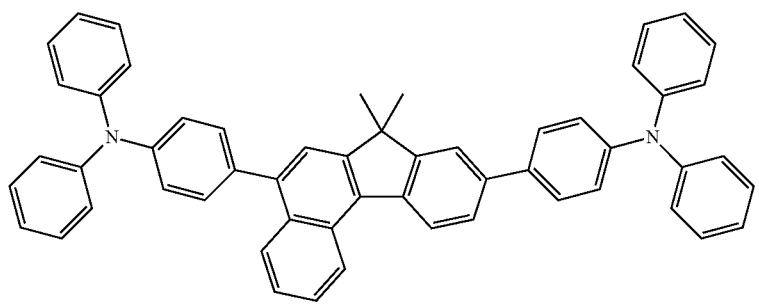
82
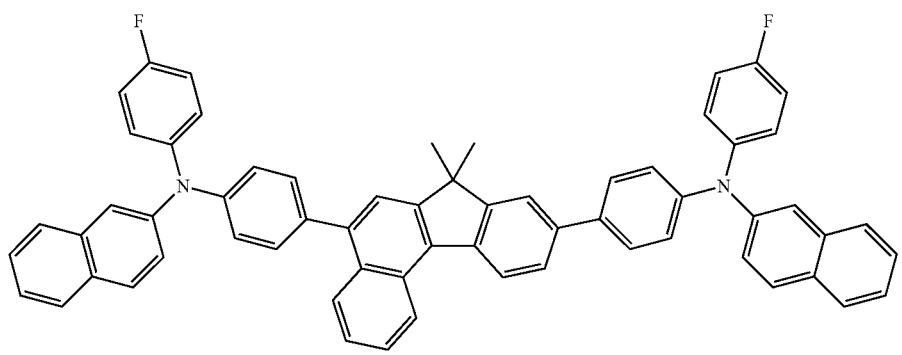

-continued
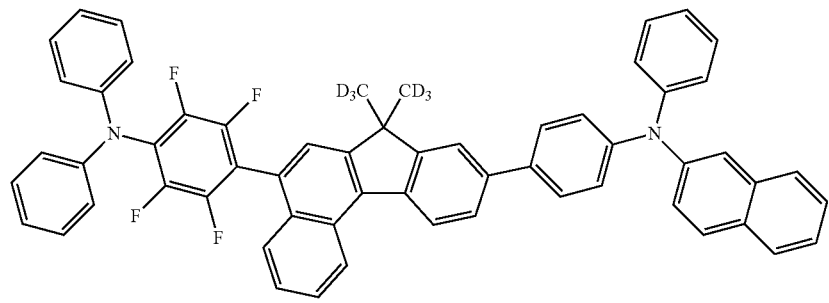
83
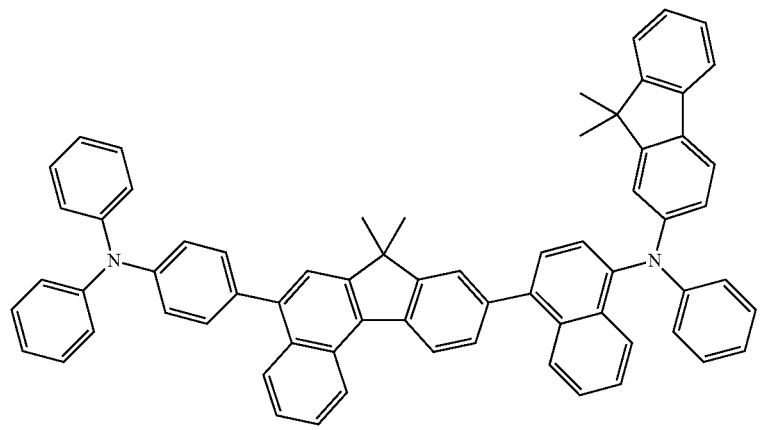
84
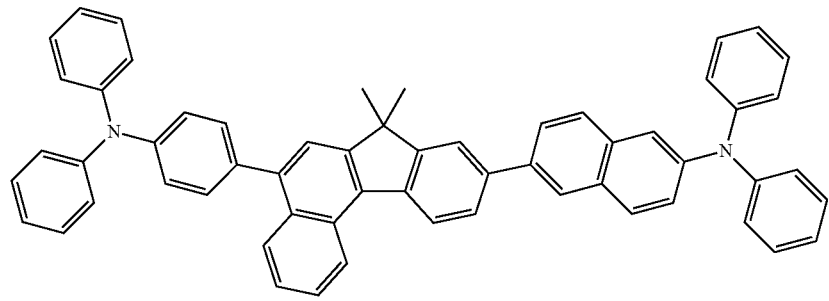
85
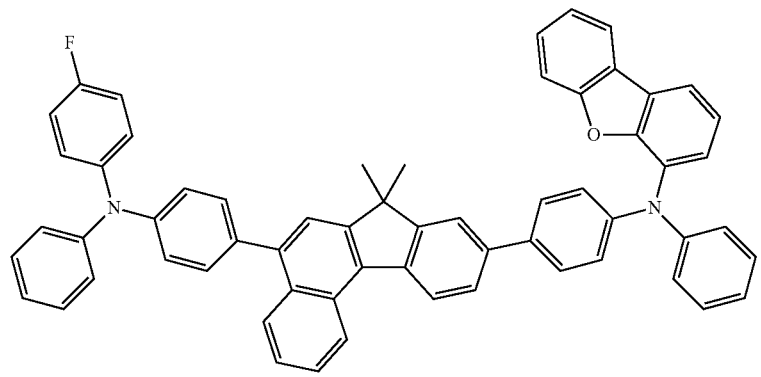
86

-continued
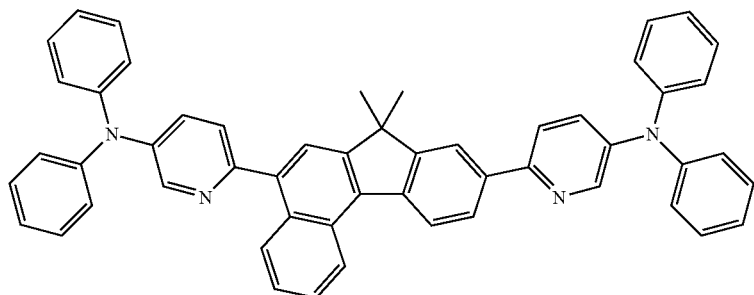
87
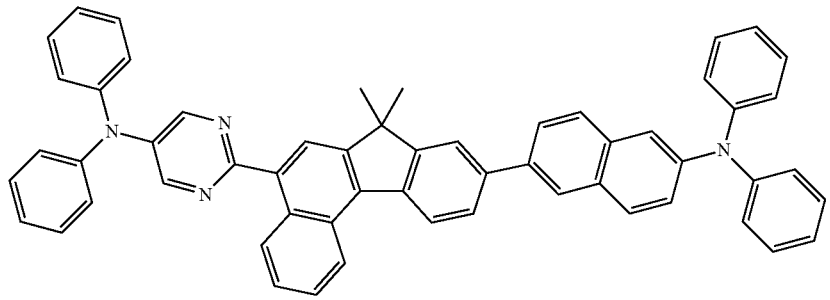
88
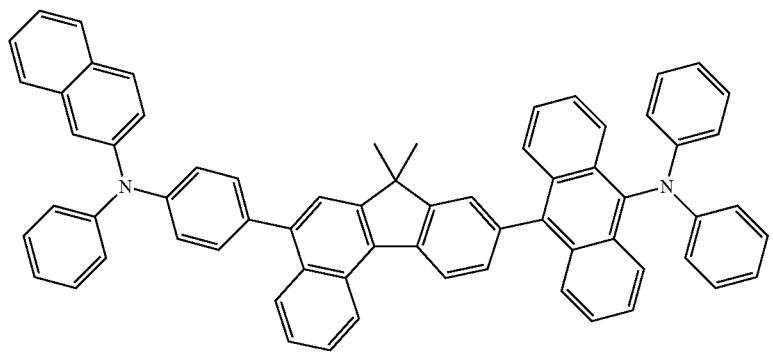
89
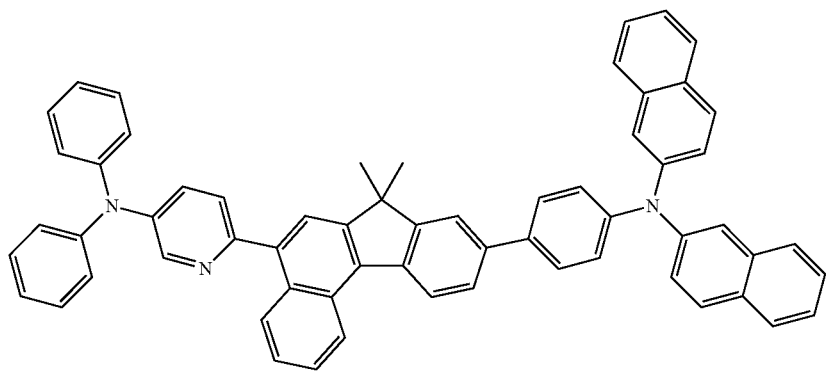
90
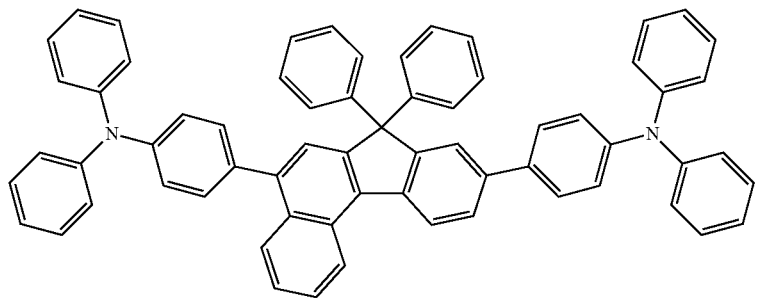
91

-continued
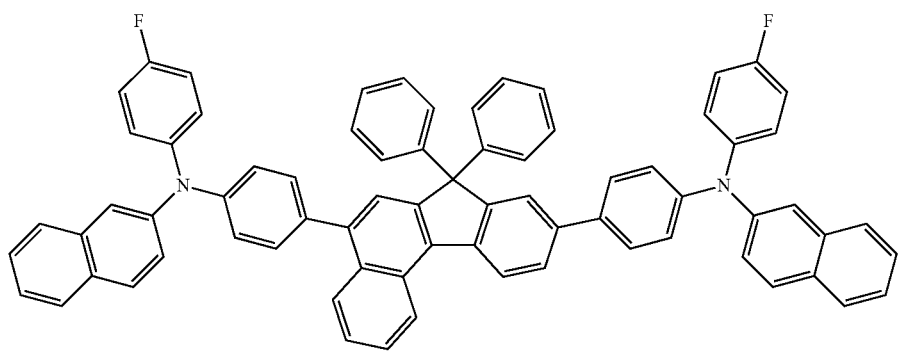
92
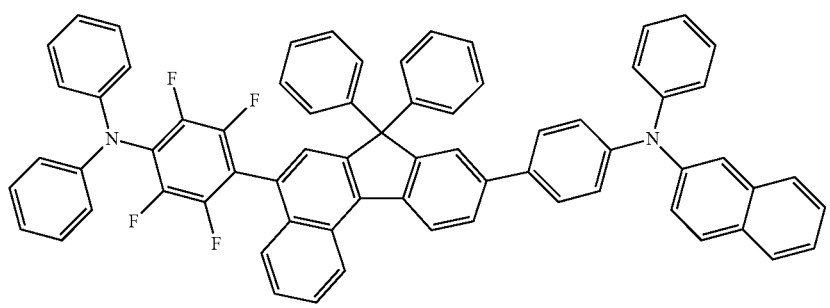
93
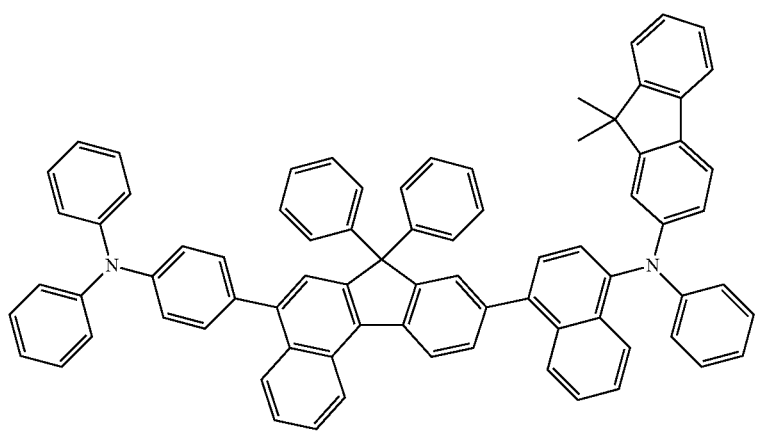
94
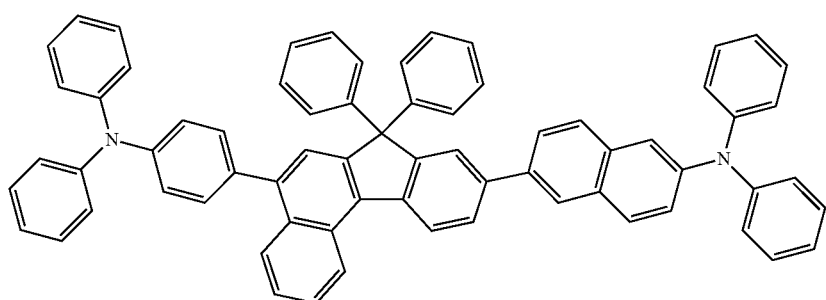
95

-continued

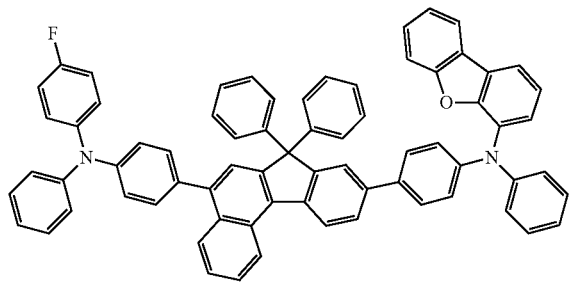

96

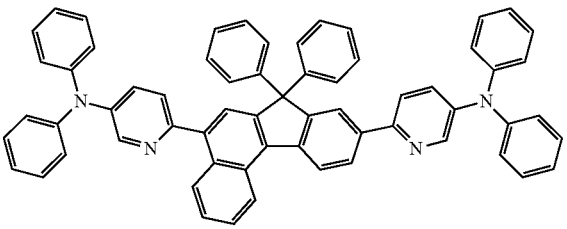

97

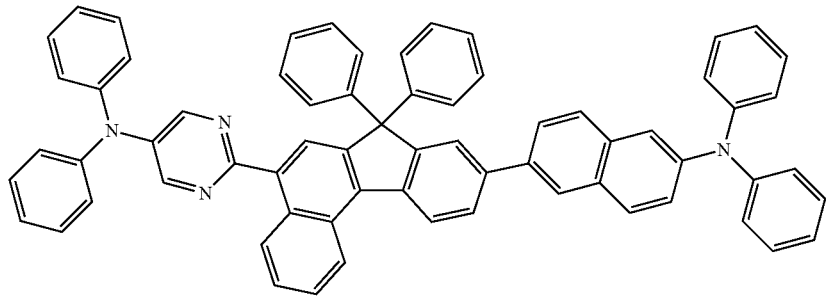

98

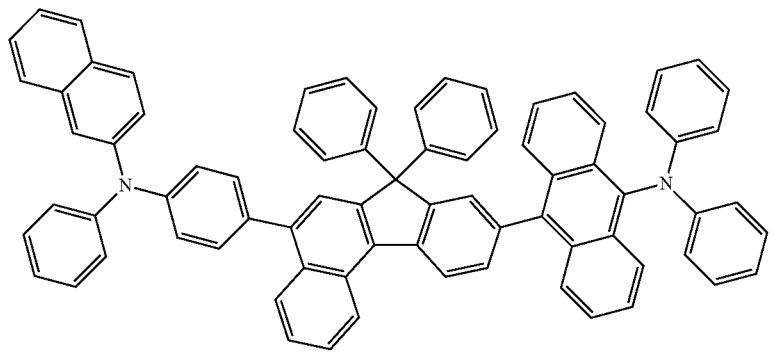

99

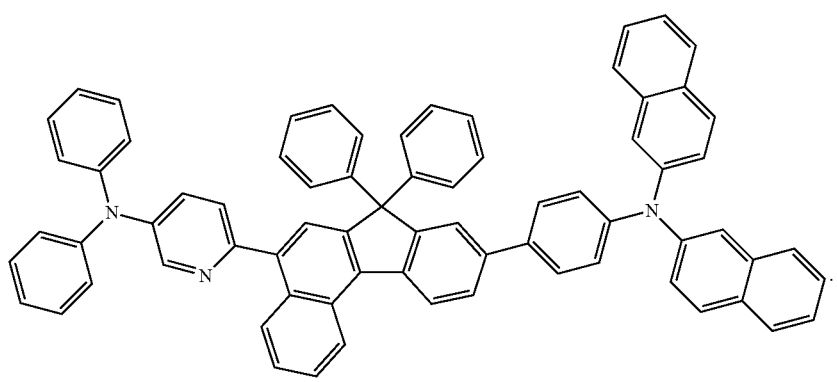

100

According to embodiments of the present disclosure, a benzofluorene-based compound represented by Formula 1 includes a linker between the benzofluorene ring and at least one N of Formula 1 (i.e. the sum of n1 and n2 is at least 1 in the compound represented by Formula 1, and thus includes at least one $X_1$ or $X_2$). According to embodiments of the present invention, inclusion of one or more linkers, allows for control of an energy level of a compound. Accordingly, $X_1$, $X_2$, n1 and n2 in a compound represented by Formula 1, may be selected in accordance with a desired energy level of the compound. For example, in one embodiment, the compound represented by Formula 1 is used as a dopant, and $X_1$, $X_2$, n1 and n2 may be selected in accordance with a desired relative energy level of the compound with respect to a host and an adjacent organic layer. An organic light emitting diode including such a compound may provide an organic light-emitting device with a lower driving voltage and improved efficiency, brightness, and lifespan.

A compound represented by Formula 1, having a benzofluorene core, may have a more 3-dimentional sterical structure (or may be less planar) than, for example, a compound having a pyrene core. When an organic layer is formed by using a compound including a pyrene core, molecules of the compound may be more regularly stacked, for example, by being horizontally oriented, thus increasing intermolecular interactions. However, molecules of a compound including a benzofluorene core may be more irregularly stacked, thus decreasing intermolelcular interactions. Accordingly, a compound represented by Formula 1, having a benzofluorene core, may have a smaller intermolecular attractive force compared to a more planar compound, such as compound having a pyrene core. Thus, an emission color of a compound having a benzofluorene core, such as a compound represented by Formula 1, may be less biased to a longer wavelength, and thus, may provide blue emission with improved color purity.

The benzofluorene-based compound represented by Formula 1 may be synthesized by using any suitable organic synthesis method. Various methods of synthesis of benzofluorene-based compounds represented by Formula 1 will be more apparent to one of ordinary skill in the art by referring to the examples, which are presented later.

At least one benzofluorene-based compound represented by Formula 1 may be used between a pair of electrodes of an organic light-emitting diode. For example, the benzofluorene-based compound represented by Formula 1 may be used in an emission layer.

Accordingly, in a further embodiment, provided is an organic light-emitting diode including: a first electrode; a second electrode on the first electrode; and an organic layer between the first electrode and the second electrode and including an emission layer and at least one benzofluorene-based compound represented by Formula 1.

The wording that "an organic layer includes at least one benzofluorene-based compound" used herein means that the organic layer may include one benzofluorene-based compound represented by Formula 1 or may include two or more benzofluorene-based compounds represented by Formula 1, that is, two or more structurally different compounds represented by Formula 1 may be included.

The organic layer may include at least one selected from a hole injection layer, a hole transport layer, a functional layer having a hole injection capability and a hole transport capability (hereinafter, referred to as an "H-functional layer"), a buffer layer, an electron blocking layer, a hole blocking layer, an electron transport layer, an electron injection layer, and a functional layer having an electron injection capability and an electron transport capability (hereinafter, referred to as an "E-functional layer"). That is, the organic layer may include one or more of the above layers.

The term "organic layer" as used herein refers to a single layer or to a plurality of layers, between a first electrode and a second electrode of an organic light-emitting diode.

For example, the organic layer may include an emission layer, which may include a benzofluorene-based compound represented by Formula 1. The emission layer including the benzofluorene-based compound represented by Formula 1 may emit light that is generated according to a fluorescence emission mechanism.

According to an embodiment of the present invention, the benzofluorene-based compound is included in the emission layer of the organic light-emitting diode as a dopant, and the emission layer may further include a host. The host is described later.

FIG. 1 is a schematic sectional view of an organic light-emitting diode 10 according to an embodiment of the present invention. Hereinafter, the structure of an organic light-emitting diode according to an embodiment of the present invention and a method of manufacturing an organic light-emitting diode according to an embodiment of the present invention will be described in connection with FIG. 1.

In the embodiment of FIG. 1, the organic light-emitting diode 10 includes a substrate 11, a first electrode 13, an organic layer 15, and a second electrode 17, which are sequentially stacked in that order.

For the substrate 11, any substrate that is suitable for use in an organic light-emitting diode may be used. For example, the substrate 11 may be a glass substrate or transparent plastic substrate, having a suitable mechanical strength, thermal stability, transparency, surface smoothness, ease of handling, and/or water resistance.

A first electrode 13 may be formed by, for example, by depositing or sputtering a material for a first electrode on the substrate 11. When the first electrode 13 is an anode, the material for the first electrode may be selected from materials with a high work function to ease hole injection. The first electrode 13 may be a reflective electrode or a transmission electrode. The material for the first electrode may be a transparent material with high conductivity, and examples of such a material are indium tin oxide (ITO), indium zinc oxide (IZO), tin oxide ($SnO_2$), and zinc oxide (ZnO). When magnesium (Mg), aluminum (Al), aluminum-lithium (Al—Li), calcium (Ca), magnesium-indium (Mg—In), magnesium-silver (Mg—Ag), or the like is used, the first electrode 13 may be used as a reflective electrode.

The first electrode 13 may have a single-layer structure or a multi-layer structure including two or more layers. For example, the first electrode 13 may have a three-layered structure of ITO/Ag/ITO, but the structure of the first electrode 13 is not limited thereto.

The organic layer 15 may be on the first electrode 13.

The organic layer 15 may include, for example, a hole injection layer, a hole transport layer, a buffer layer, an emission layer, an electron transport layer, and/or an electron injection layer.

The hole injection layer (HIL) may be formed on the first electrode 13 by using various suitable methods, such as vacuum deposition, spin coating, casting, LB deposition, or the like.

When the HIL is formed using vacuum deposition, vacuum deposition conditions may vary according to the compound that is used to form the HIL, and a desired structure and thermal properties of the HIL to be formed. For example, vacuum deposition may be performed at a temperature of about 100° C. to about 500° C., a pressure of about $10^{-8}$ torr to about $10^{-3}$ torr, and a deposition rate of about 0.01 to about 100 Å/sec. However, the deposition conditions are not limited thereto.

When the HIL is formed using spin coating, the coating conditions may vary according to the compound that is used to form the HIL, and the desired structure and thermal properties of the HIL to be formed. For example, the coating rate may be in a range of about 2000 rpm to about 5000 rpm, and a temperature at which heat treatment is performed to remove a solvent after coating may be in the range of about 80° C. to about 200° C. However, the coating conditions are not limited thereto.

In some embodiments, as a hole injection material, any hole injection material suitable for use in an organic light-emitting device may be used, and examples include, N'-diphenyl-N,N'-bis-[4-(phenyl-m-tolyl-amino)-phenyl]-biphenyl-4,4'-diamine (DNTPD), a phthalocyanine compound such as copper phthalocyanine, 4,4',4''-tris(3-methylphenylphenylamino) triphenylamine (m-MTDATA), N,N'-di(1-naphthyl)-N,N'-diphenylbenzidine (NPB), TDATA, 2-TNATA, a polyaniline/dodecylbenzenesulfonic acid (pani/DBSA), poly(3,4-ethylenedioxythiophene)/poly(4-styrenesulfonate) (PEDOT/PSS), polyaniline/camphor sulfonicacid (pani/CSA), and (polyaniline)/poly(4-styrenesulfonate) (PANI/PSS), but are not limited thereto.

m-MTDATA

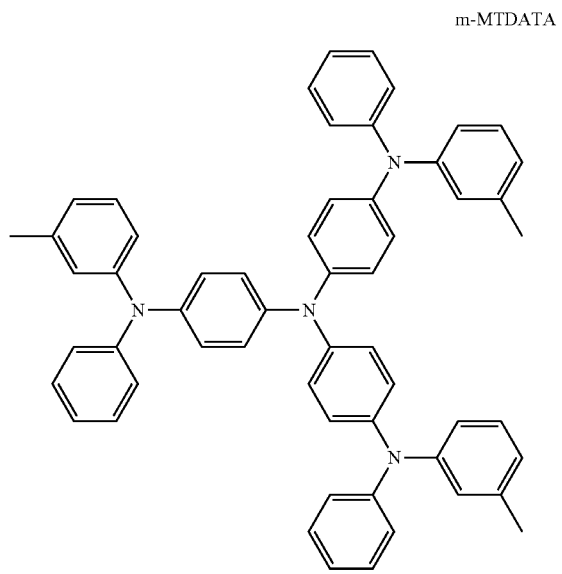

TDATA

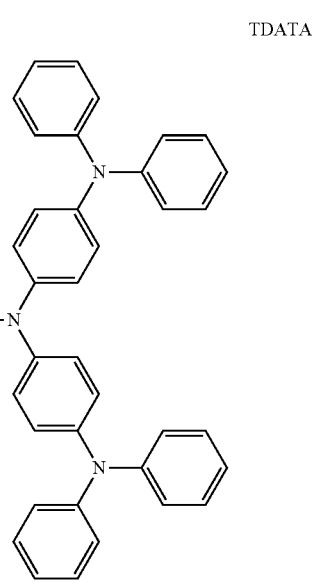

2-TNATA

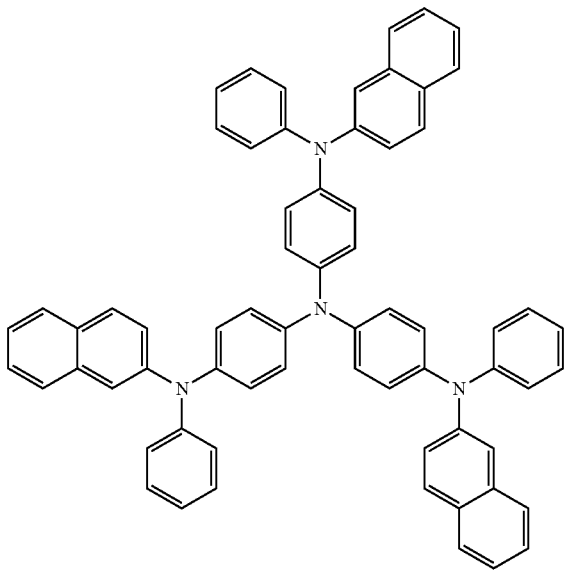

A thickness of the HIL may be in a range of about 100 Å to about 10000 Å, for example, about 100 Å to about 1000 Å. When the thickness of the HIL is within these ranges, the HIL may have suitable electron injection ability without a substantial increase in driving voltage.

A hole transport layer (HTL) may be formed on the HIL by using vacuum deposition, spin coating, casting, LB deposition, or the like. When the HTL is formed using vacuum deposition or spin coating, the deposition and coating conditions may be similar to those for the formation of the HIL, though the deposition and coating conditions may vary according to a compound that is used to form the HTL.

Examples of a suitable hole transport material according to embodiments of the present invention include a carbazole derivative, such as N-phenylcarbazole or polyvinylcarbazol, N,N'-bis(3-methylphenyl)-N,N'-diphenyl-[1,1-biphenyl]-4,4'-diamine (TPD, shown below), 4,4',4''-tris(N-carbazolyl) triphenylamine (TCTA), and N,N'-di(1-naphthyl)-N,N'-diphenylbenzidine (NPB, shown below), but are not limited thereto.

TPD

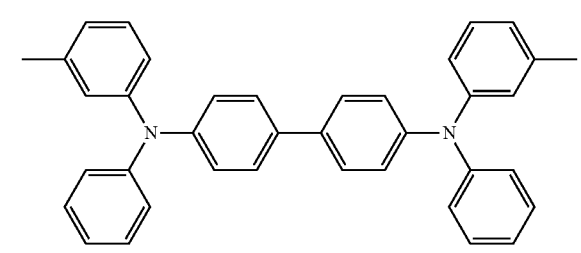

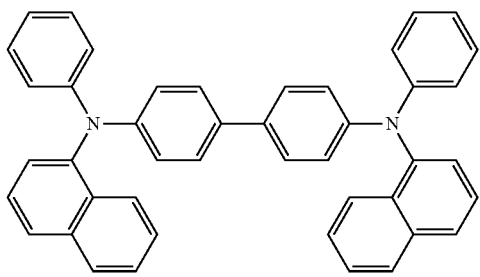

NPB

A thickness of the HTL may be in a range of about 50 Å to about 2000 Å, for example, about 100 Å to about 1500 Å. When the thickness of the HTL is within these ranges, the HTL may have suitable electron transporting ability without a substantial increase in driving voltage.

An H-functional layer (i.e. a functional layer having a hole injection ability and a hole transport ability) may include one or more materials selected from the materials for the HIL and one or more materials selected from the materials for the HTL. A thickness of the H-functional layer may be in a range of about 500 Å to about 10,000 Å, for example, about 100 Å to about 1,000 Å. When the thickness of the H-functional layer is within these ranges, the H-functional layer may have suitable hole injection and transport characteristics without a substantial increase in driving voltage.

In addition, the HIL, the HTL, and/or the H-functional layer may include at least one compound represented by Formula 300 or Formula 301 below:

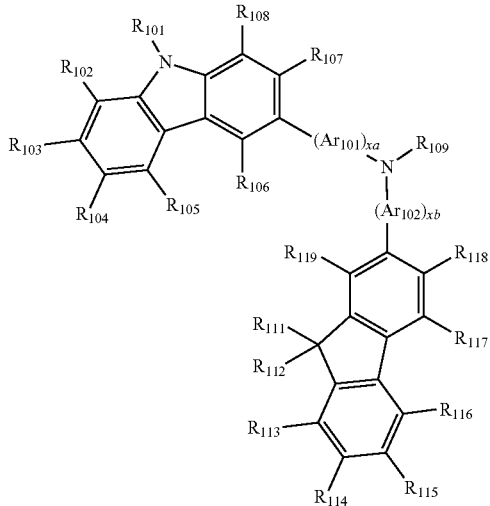

Formula 300

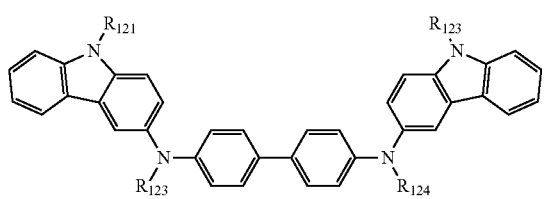

Formula 301

$Ar_{101}$ and $Ar_{102}$ in Formula 300 may each be independently selected from a substituted or unsubstituted $C_6$-$C_{60}$ arylene group. For example, $Ar_{101}$ and $Ar_{102}$ may each be independently selected from a phenylene group, a pentalenylene group, an indenylene group, a naphthylene group, an azulenylene group, a heptalenylene group, a acenaphthylene group, a fluorenylene group, a phenarenylene group, a phenanthrenylene group, an anthrylene group, a fluoranthenylene group, a triphenylenylene group, a pyrenylene group, a chrysenylene group, a naphthacenylene group, a pycenylene group, a perylenylene group, and a penacenylene group; and a phenylene group, a pentalenylene group, an indenylene group, a naphthylene group, an azulenylene group, a heptalenylene group, an acenaphthylene group, a fluorenylene group, a phenarenylene group, a phenanthrenylene group, an anthrylene group, a fluoranthenylene group, a triphenylenylene group, a pyrenylene group, a chrysenylene group, a naphthacenylene group, a pycenylene group, a perylenylene group, and a penacenylene group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_2$-$C_{10}$ heterocycloalkyl group, a $C_2$-$C_{10}$ heterocycloalkenyl group, a $C_6$-$C_{60}$ aryl group, a $C_6$-$C_{60}$ aryloxyl group, a $C_6$-$C_{60}$ arylthio group, and $C_2$-$C_{60}$ heteroaryl group.

xa and xb in Formula 300 may each be independently selected from an integer of 0 to 5, for example 0, 1 or 2. For example, xa may be 1 and xb may be 0, but are not limited thereto.

$R_{101}$ to $R_{108}$, $R_{111}$ to $R_{119}$, and $R_{121}$ to $R_{124}$ in Formulae 300 and 301 may each be independently selected from a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_5$-$C_{60}$ aryl group, a substituted or unsubstituted $C_5$-$C_{60}$ aryloxyl group, and a substituted or unsubstituted $C_5$-$C_{60}$ arylthio group. For example, $R_{101}$ to $R_{108}$, $R_{111}$ to $R_{119}$, and $R_{121}$ to $R_{124}$ in Formulae 300 and 301 may each be independently selected from a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pentyl group, a hexyl group, and the like), a $C_1$-$C_{10}$ alkoxy group (for example, a methoxy group, an ethoxy group, a propoxy group, a butoxy group, a pentoxy group, and the like);

a $C_1$-$C_{10}$ alkyl group and a $C_1$-$C_{10}$ alkoxy group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof and a phosphoric acid group or a salt thereof;

a phenyl group; a naphthyl group; an anthryl group; a fluorenyl group; a pyrenyl group; and a phenyl group, a naphthyl group, an anthryl group, a fluorenyl group, and a pyrenyl group, each substituted with at least one selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group, but $R_{101}$ to $R_{108}$, $R_{111}$ to $R_{119}$, and $R_{121}$ to $R_{124}$ are not limited thereto.

$R_{109}$ in Formula 300 may be selected from a phenyl group, a naphthyl group, an anthryl group, a biphenyl group, and a pyridyl group and a phenyl group, a naphthyl group, an anthryl group, a biphenyl group, and a pyridyl group, each substituted with at least one selected from of a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{20}$ alkyl group, and a substituted or unsubstituted $C_1$-$C_{20}$ alkoxy group.

According to an embodiment of the present invention, the compound represented by Formula 300 is a compound represented by Formula 300A below, but is not limited thereto:

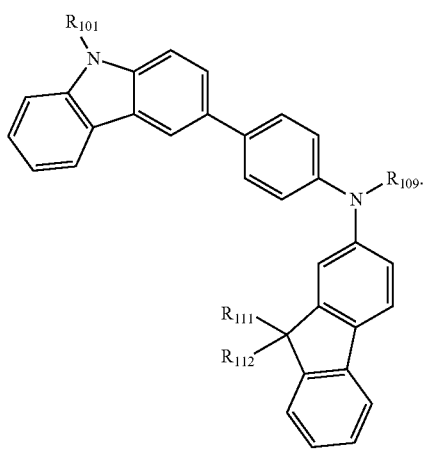

Formula 300A $R_{101}$, $R_{111}$, $R_{112}$, and $R_{109}$ in Formula 300 A may be selected as already described above with reference to Formula 300.

For example, the HIL, the HTL, and/or the H-functional layer may include at least compound selected from Compounds 301 to 320 below, but is not limited thereto, and one or more of the layers may include other materials:

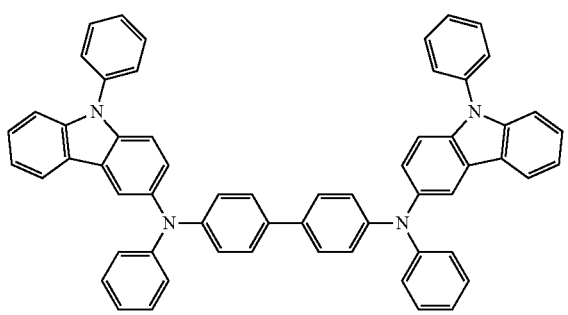

301

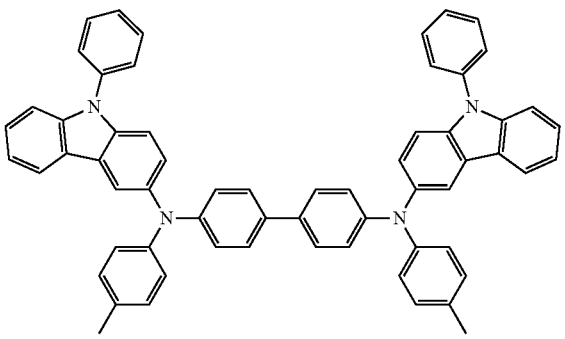

302

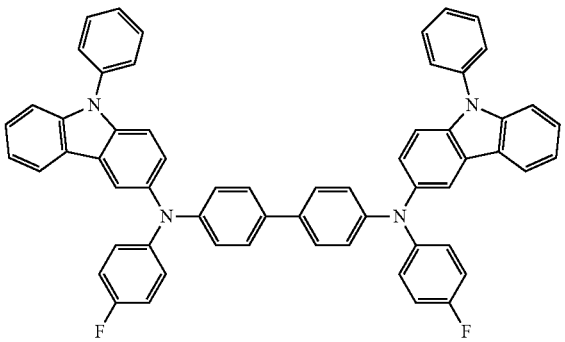

303

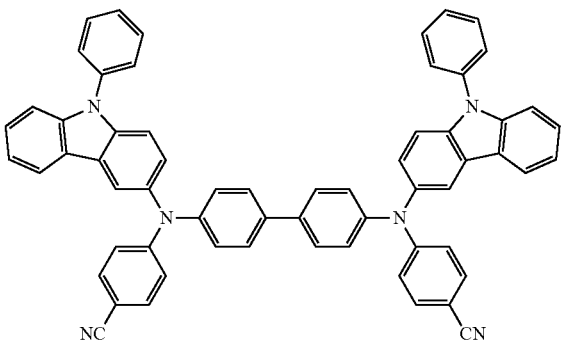

304

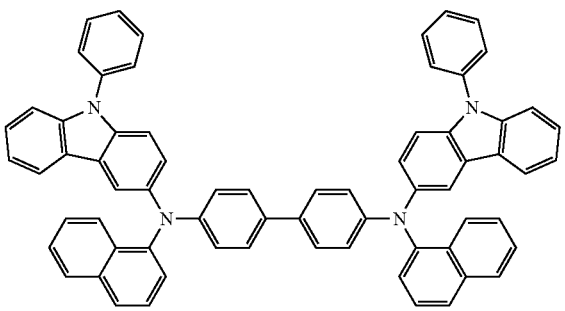

305

306
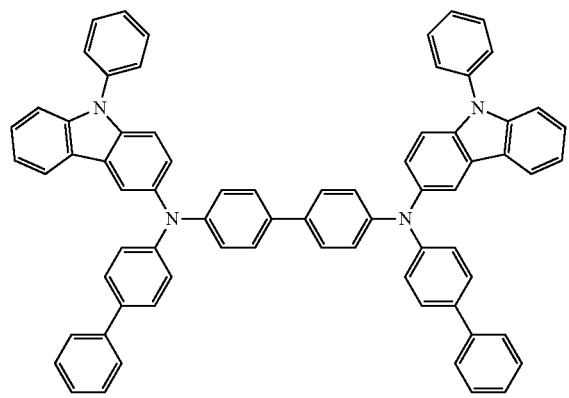
307
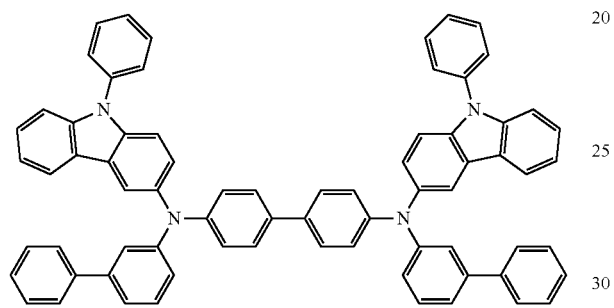
308
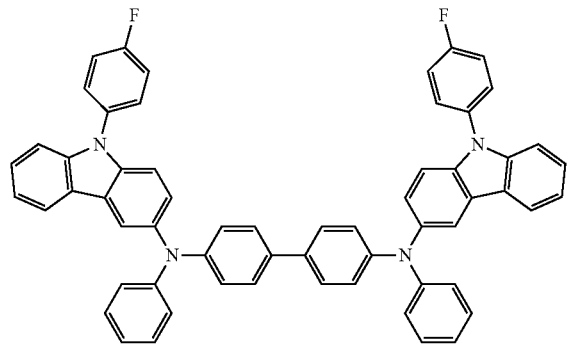
309
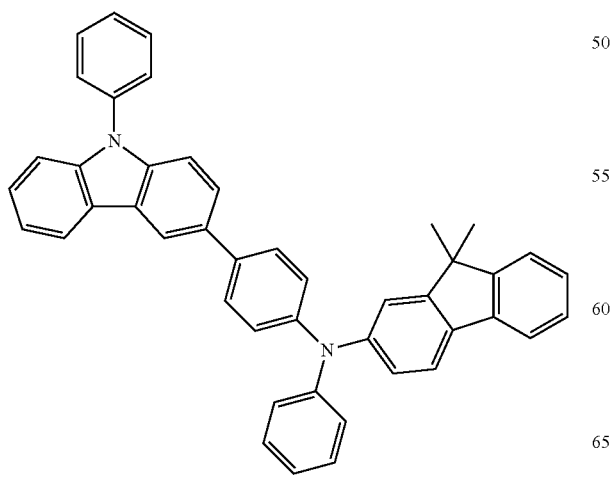
310
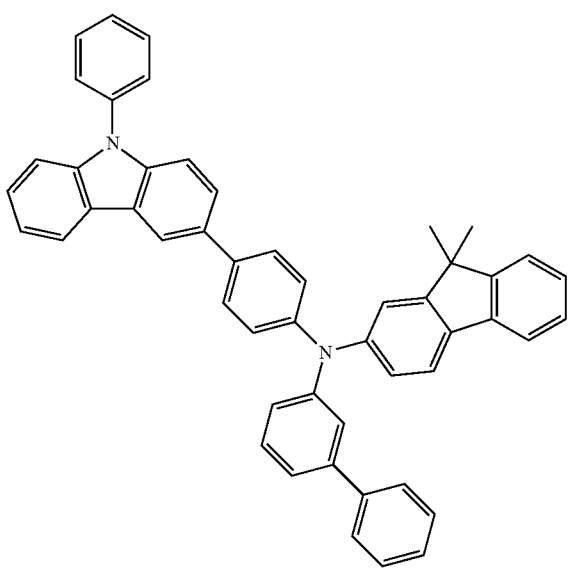
311
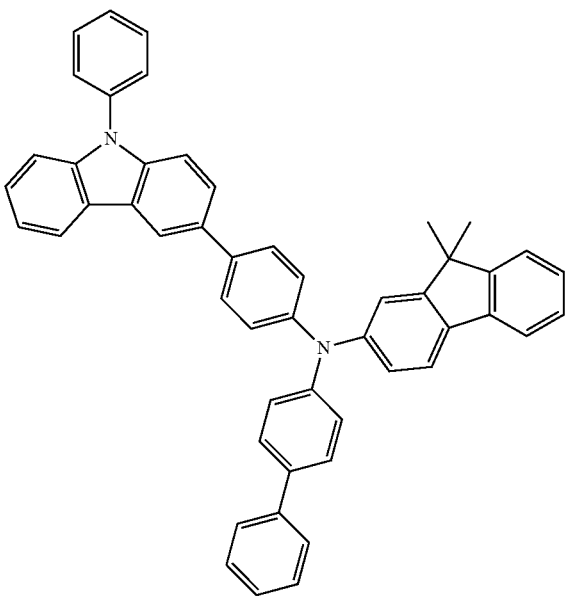

312
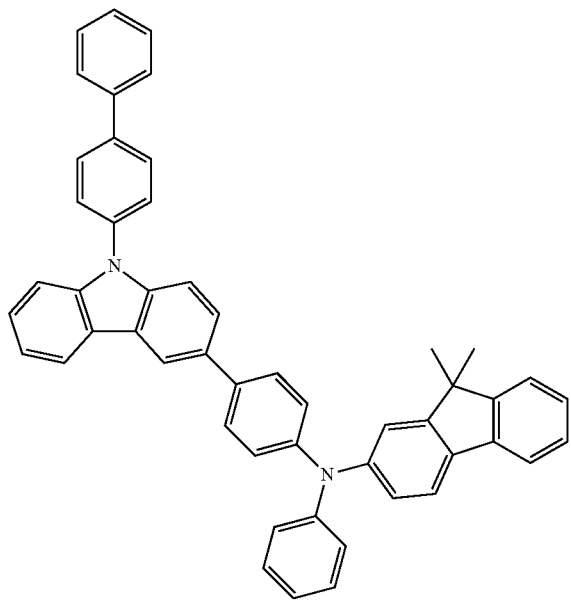
313
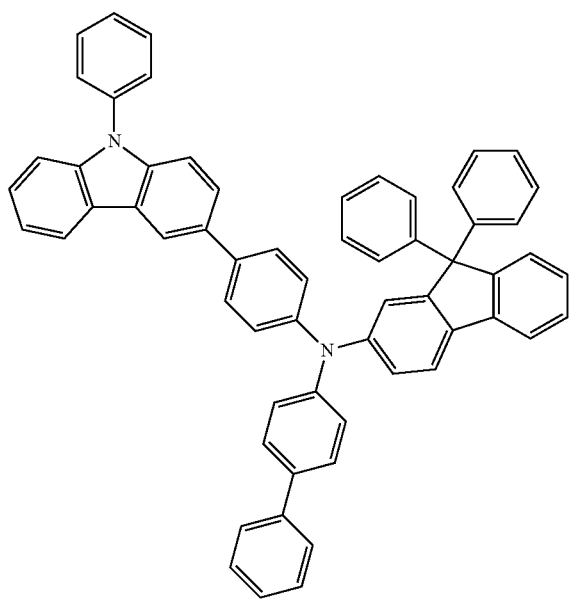
314
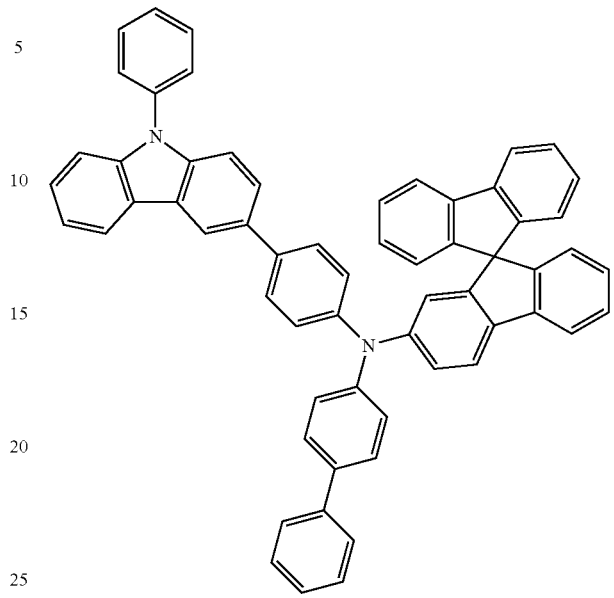
315
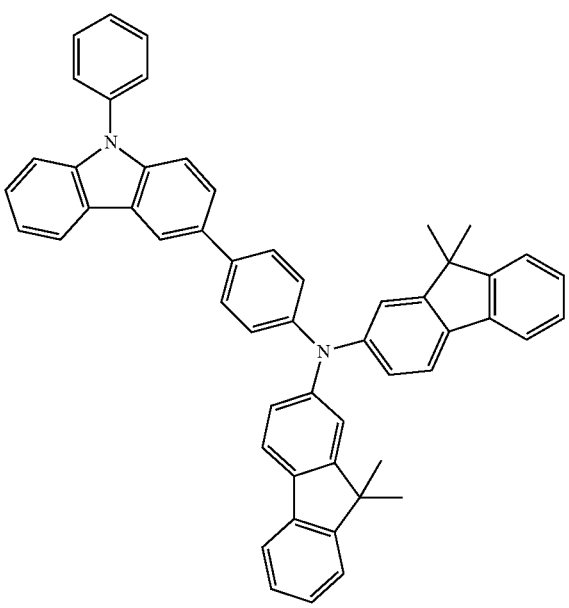

316

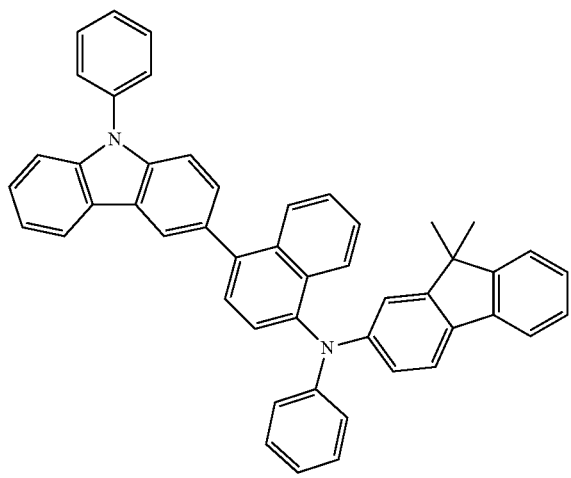

317

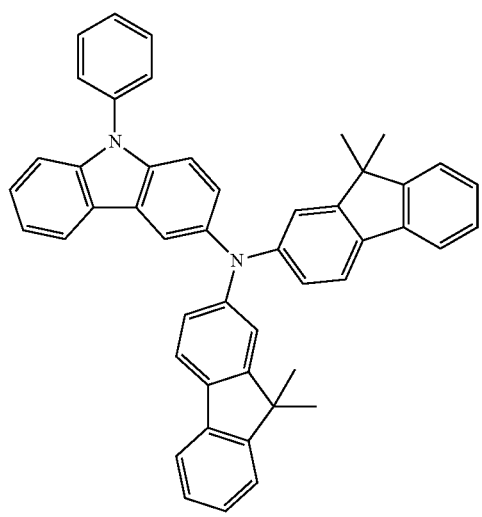

318

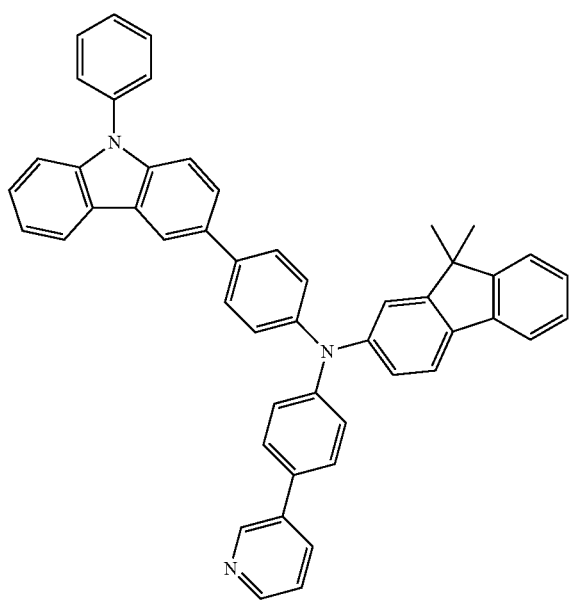

319

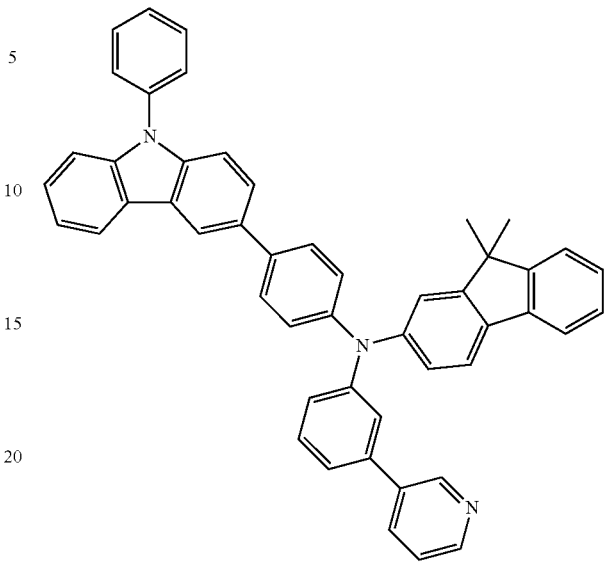

320

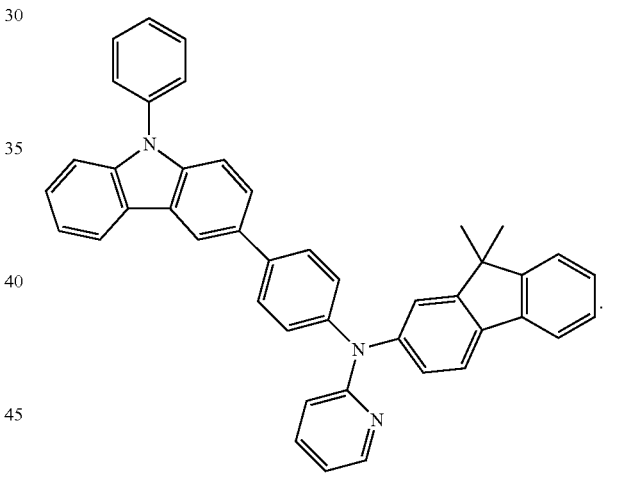

The HIL, the HTL, and/or the H-functional layer, may further include a charge-generating material to increase conductivity, in addition to the hole injecting materials, the hole transport materials, and/or the materials having both hole injection and hole transport capabilities.

Examples of the charge generating material include quinine derivatives, metal oxides, and compounds with a cyano group, but are not limited thereto. Additional examples of the charge-generating material include a quinone derivative, such as tetracyanoquinonedimethane (TCNQ) or 2,3,5,6-tetrafluoro-tetracyano-1,4-benzoquinonedimethane (F4-TCNQ); a metal oxide, such as tungsten oxide or molybdenum oxide; and a cyano group-containing compound, such as Compound 200 below, but are not limited thereto.

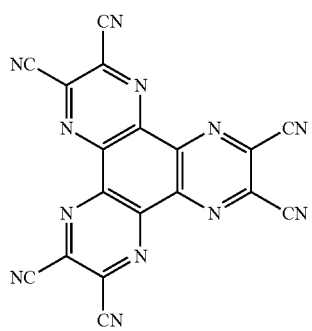

Comopund 200

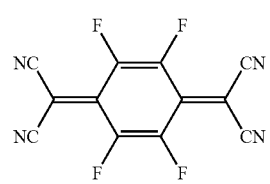

F4-TCNQ

When the hole injection layer, the hole transport layer, and/or the H-functional layer further includes a charge-generating material, the charge-generating material may be homogeneously dispersed or non-homogeneously distributed in the hole injection layer, the hole transport layer, and/or the H-functional layer, independently.

A buffer layer may be included between the HIL, the HTL, and/or the H-functional layer, and an emission layer. The buffer layer may compensate for an optical resonance distance of light according to a wavelength of the light emitted from the emission layer, and thus may increase efficiency. A buffer layer may include any hole injecting material or hole transporting material suitable for use in an organic light-emitting device. In some embodiments, the buffer layer includes a same material as a materials used in the HIL, HTL, and/or H-functional layer, which is on the buffer layer.

An emission layer (EML) may be formed on the HTL, the H-functional layer, or the buffer layer by spin coating, casting, or a LB method. When the EML is formed by vacuum deposition or spin coating, the deposition and coating conditions may be similar to those for the formation of the HIL, though the conditions for deposition and coating may vary according to a material that is used to form the EML.

The EML may include a host and a benzofluorene-based compound represented by Formula 1 as a dopant.

An amount of the dopant (that is, an amount of the benzofluorene-based compound represented by Formula 1) in the EML may be in a range of about 0.01 to about 15 parts by weight based on 100 parts by weight of the host, but is not limited thereto.

A thickness of the EML may be in a range of about 100 Å to about 1000 Å, for example, about 200 Å to about 600 Å. When the thickness of the EML is within these ranges, the EML may have improved luminescent properties without a substantial increase in driving voltage.

In one embodiment, a hole blocking layer (HBL) may be formed on the EML to prevent or reduce diffusion of triplet excitons or holes to an electron transport layer. When the HBL is formed by vacuum deposition or spin coating, the deposition and coating conditions may be similar to those for the formation of the HIL, though the conditions for deposition and coating may vary according to a material that is used to form the HBL. Any hole-blocking material suitable for use in an organic light-emitting device may be used. Examples thereof include oxadiazole derivatives, triazole derivatives, and phenanthroline derivatives. For example, bathocuproine (BCP) illustrated below may be used as a hole-blocking material:

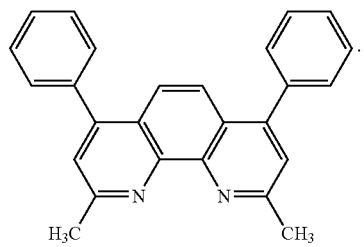

BCP

A thickness of the HBL may be in a range of about 20 Å to about 1000 Å, for example, about 30 Å to about 300 Å. When the thickness of the HBL is within these ranges, the HBL may have suitable hole blocking properties without a substantial increase in driving voltage.

An electron transport layer (ETL) may be formed on the HBL using various methods, for example, by vacuum deposition, spin coating, casting, or the like. When the ETL is formed using vacuum deposition or spin coating, the deposition and coating conditions may be similar to those for the formation of the HIL, though the conditions for deposition and coating may vary according to a material that is used to form the ETL. Examples of materials for the ETL include any electron transporting materials suitable to stably transport electrons injected from an electron injection electrode (cathode). Examples of suitable electron transport materials include a quinoline derivative such as tris(8-quinolinolate) aluminum (Alq$_3$), 3-(biphenyl-4-yl)-5-(5-tert-butylphenyl)-4-phenyl-4H-1,2,4-triazole (TAZ), bis(2-methyl-8Oquinolinolato-N1,O8)-(1,1'-biphenyl) (Balq), beryllium bis(benzoquinoli-10-nolate) (Bebq$_2$), 9,10-di(2-naphthyl)anthracene (ADN), Compound 201, and Compound 202, some of which are shown below, but the examples are not limited thereto:

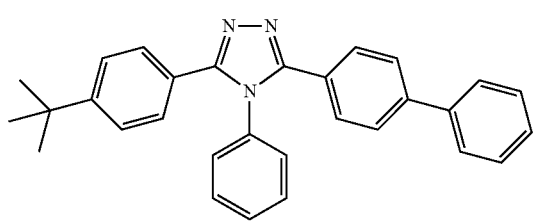

TAZ

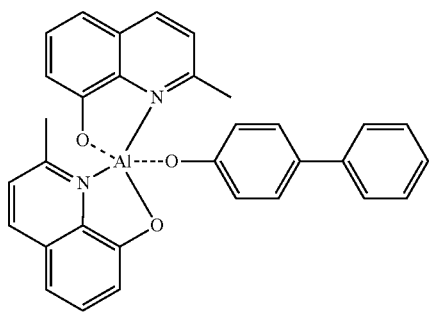

BAlq

-continued

Compound 201

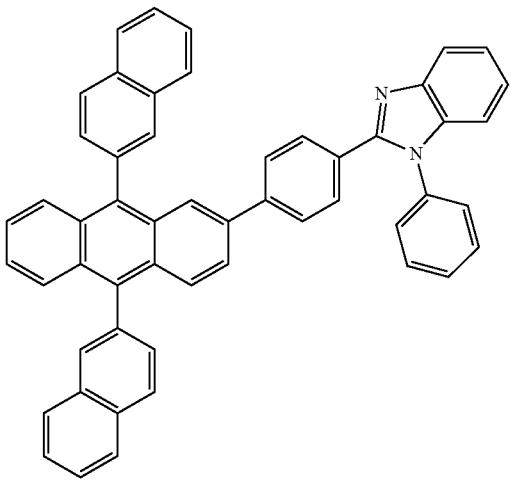

Compound 202

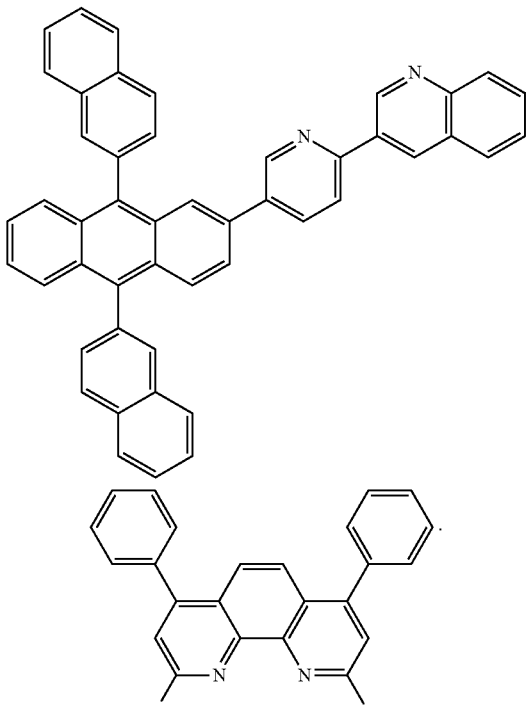

BCP

A thickness of the ETL may be in a range of about 100 Å to about 1000 Å, for example, about 150 Å to about 500 Å. When the thickness of the ETL is within these ranges, the ETL may have suitable electron transporting ability without a substantial increase in driving voltage.

The ETL may further include a metal-containing material, in addition to a suitable electron transporting inorganic material.

The metal-containing material may include a lithium (Li) compound. Non-limiting examples of the Li compound are lithium quinolate (LiQ) and Compound 203 below:

Compound 203

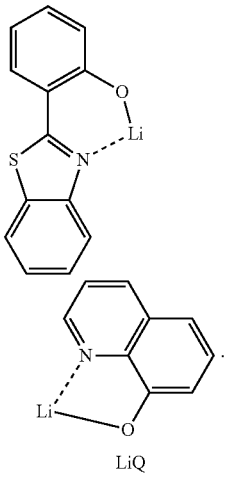

LiQ

An electron injection layer (EIL), which may facilitate injection of electrons from the cathode, may be formed on the ETL. Any electron-injecting material suitable for use in an organic light-emitting device may be used to form the EIL.

Non-limiting examples of materials for forming the EIL are LiF, NaCl, CsF, $Li_2O$, and BaO. The deposition conditions of the EIL may be similar to those used to form the HIL, although the deposition conditions may vary according to the material that is used to form the EIL.

The thickness of the EIL may be from about 1 Å to about 100 Å, and in some embodiments, may be from about 3 Å to about 90 Å. When the thickness of the EIL is within these ranges, the EIL may have suitable electron injection ability without a substantial increase in driving voltage.

In one embodiment, the second electrode 17 is on the organic layer 15. The second electrode 17 may be a cathode, which is an electron injection electrode. A metal for forming the second electrode may be a metal, an alloy, an electrically conductive compound, which all have a low-work function, or a mixture thereof. According to an embodiment of the present invention, lithium (Li), magnesium (Mg), aluminum (Al), aluminum (AO-lithium (Li), calcium (Ca), magnesium (Mg)-indium (In), magnesium (Mg)-silver (Ag), or the like may be formed as a thin film to form a transmission electrode. In some embodiments, to manufacture a top-emission light-emitting diode, the transmission electrode may be formed of indium tin oxide (ITO) or indium zinc oxide (IZO).

The following provides additional descriptions, by way of example, of the groups described above with reference to the benzofluorene-based compounds according to embodiments of the present disclosure.

The unsubstituted $C_1$-$C_{60}$ alkyl group (or $C_1$-$C_{60}$ alkyl group) referred to herein may be a $C_1$-$C_{60}$ linear or branched alkyl group, such as methyl, ethyl, propyl, isobutyl, sec-butyl, pentyl, iso-amyl, or hexyl; and the substituted $C_1$-$C_{60}$ alkyl group referred to herein may be a group, in which at least one hydrogen atom of a corresponding unsubstituted $C_1$-$C_{60}$ alkyl group is substituted with one selected from a deuterium atom, a halogen atom, a hydroxyl group, a nitro group, a cyano group, an amino group, an amidino group, a hydrazine group, a hydrazone group, a carboxylic acid group or salt thereof, a sulfonic acid group or salt thereof, a phosphoric acid group or salt thereof, a $C_1$-$C_{60}$ alkyl group, a $C_2$-$C_{60}$ alkenyl group, a $C_2$-$C_{60}$ alkynyl group, a $C_6$-$C_{60}$ aryl group, a $C_2$-$C_{60}$ heteroaryl group, —N($Q_{11}$)($Q_{12}$), and —Si($Q_{13}$)($Q_{14}$)($Q_{15}$)

(wherein $Q_{11}$ to $Q_{15}$ are each independently selected from a hydrogen atom, a $C_1$-$C_{60}$ alkyl group, a $C_2$-$C_{60}$ alkenyl group, a $C_2$-$C_{60}$ alkynyl group, a $C_5$-$C_{60}$ aryl group, and a $C_2$-$C_{60}$ heteroaryl group).

The unsubstituted $C_6$-$C_{60}$ aryl group referred to herein may be a monovalent group having a carbocyclic aromatic system including 6 to 60 carbon atoms and including at least one aromatic ring. The unsubstituted $C_6$-$C_{60}$ arylene group referred to may be a divalent group having a carbocyclic aromatic system including 5 to 60 carbon atoms and including at least one aromatic ring. When the aryl group or the arylene group includes at least two rings, the rings may be fused to each other via a single bond. At least one hydrogen atom of the aryl group or the arylene group may be substituted as already described above in connection with the substituted $C_1$-$C_{60}$ alkyl group.

Examples of the substituted or unsubstituted $C_6$-$C_{60}$ aryl group include a phenyl group, a $C_1$-$C_{10}$ alkylphenyl group (for example, an ethylphenyl group), a $C_1$-$C_{10}$ alkylbiphenyl group (for example, an ethylbiphenyl group), a halophenyl group (for example, o-, m- and p-fluorophenyl groups, a dichlorophenyl group), a dicyanophenyl group, a trifluoromethoxyphenyl group, o-, m-, and p-tolyl groups, o-, m- and p-cumenyl groups, a mesityl group, a phenoxyphenyl group, a (α,α-dimethylbenzene)phenyl group, a (N,N'-dimethyl)aminophenyl group, a (N,N'-diphenyl)aminophenyl group, a pentalenyl group, an indenyl group, a naphthyl group, a halonaphthyl group (for example, a fluoronaphthyl group), a $C_1$-$C_{10}$ alkylnaphthyl group (for example, a methylnaphthyl group), a $C_1$-$C_{10}$ alkoxynaphthyl group (for example, a methoxynaphthyl group), an anthracenyl group, an azrenyl group, a heptalenyl group, an acenaphthylenyl group, a phenalenyl group, a fluorenyl group, an anthraquinolinyl group, a methylanthryl group, a phenanthryl group, a triphenylenyl group, a pyrenyl group, a chrysenyl group, an ethyl-chrysenyl group, a picenyl group, a perylenyl group, a chloroperylenyl group, a pentaphenyl group, a pentasenyl group, a tetraphenylenyl group, a hexaphenyl group, a hexacenyl group, a rubicenyl group, a coroneryl group, a trinaphthylenyl group, a heptaphenyl group, a heptacenyl group, a piranthrenyl group, and an obarenyl group. Examples of the substituted and unsubstituted $C_5$-$C_{60}$ aryl group may be understood by referring to the examples of the substituted and unsubstituted $C_6$-$C_{60}$ aryl group, and the substituents of the substituted $C_1$-$C_{60}$ alkyl group.

The unsubstituted $C_2$-$C_{60}$ heteroaryl group used herein refers to a monovalent group having a system of one or more aromatic rings having at least one hetero atom selected from nitrogen (N), oxygen (O), phosphorous (P), and sulfur (S) and carbon atoms as the remaining ring atoms. The unsubstituted $C_2$-$C_{60}$ heteroarylene group used herein refers to a divalent group having a system of one or more aromatic rings having at least one hetero atom selected from nitrogen (N), oxygen (O), phosphorous (P), and sulfur (S) and carbon atoms as the remaining ring atoms. When the heteroaryl group or the heteroarylene group have at least two rings, the rings may be fused to each other via a single bond. At least one hydrogen atom of the heteroaryl group and/or the heteroarylene group may be substituted as already described above in connection with the $C_1$-$C_{60}$ alkyl group. Examples of the unsubstituted $C_2$-$C_{60}$ heteroaryl group include a pyrazolyl group, an imidazolyl group, a oxazolyl group, a thiazolyl group, a triazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, a enzoanimidazolyl group, an imidazopyridinyl group, and an imidazopyrimidinyl group. Examples of the substituted or unsubstituted $C_2$-$C_{60}$ heteroarylene group may be understood by referring to the examples of the substituted or unsubstituted $C_2$-$C_{60}$ arylene group.

An organic light-emitting diode has been described in connection with FIG. 1. However, an organic light-emitting diode according to embodiments of the present invention is not limited thereto. One or more embodiments of the present invention will be described in more detail with reference to the following examples. However, these examples are not intended to limit the scope of the present invention.

Additionally, one or more embodiments of the present invention will also be described in more detail with reference to the following synthesis examples, which provide examples of methods of synthesizing a benzofluorene-based compound according to embodiments of the present invention. However, embodiments of the present invention are not limited to these synthesis examples. Also, by referring to the synthesis examples, one of ordinary skill in the art may be able to synthesize other benzofluorene-based compounds according to embodiments of the present invention.

SYNTHESIS EXAMPLES

Compounds used in the following synthesis examples for the synthesis of a benzofluorene-based compound according to embodiments of the present invention include the following:

Compounds A-1 to A-10

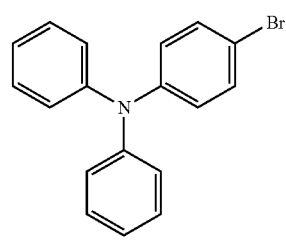

A-1

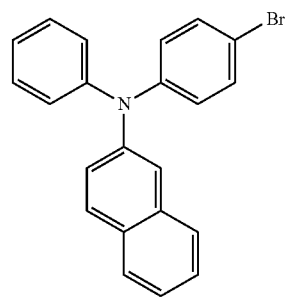

A-2

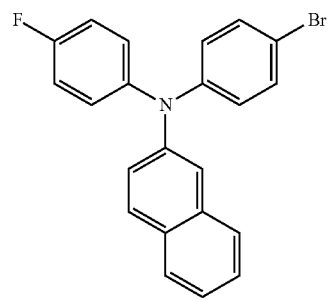

A-3

A-4
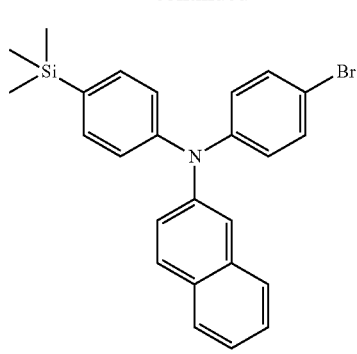
A-5
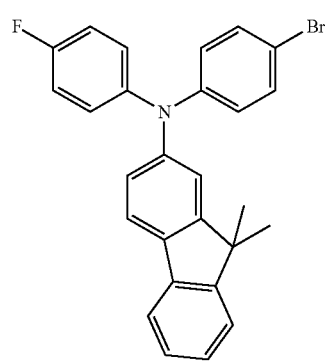
A-6
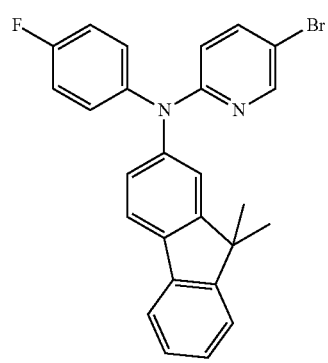
A-7
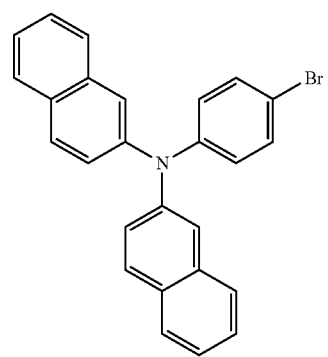
A-8
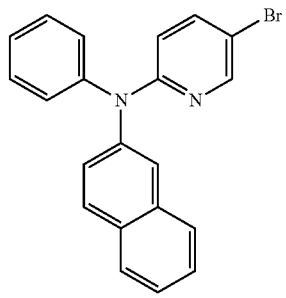
A-9
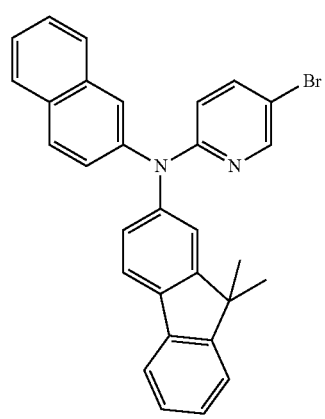
A-10
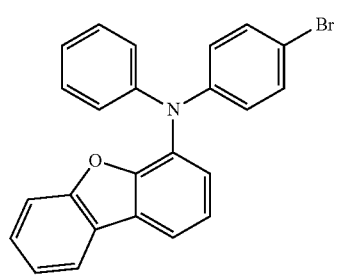
Compounds B-1 to B-11
B-1
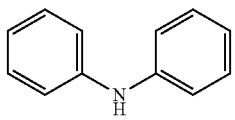
B-2
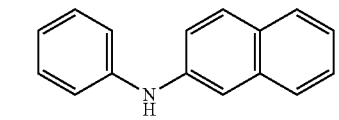
B-3
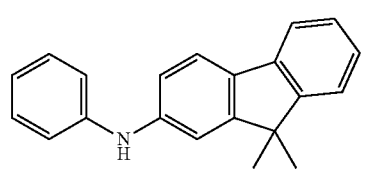

-continued
and Compounds C-1 to C-3
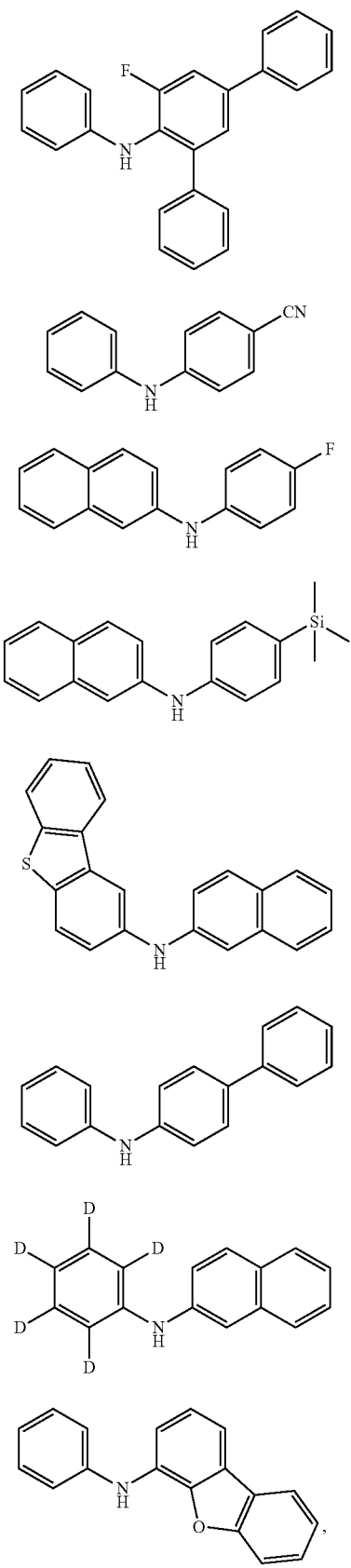
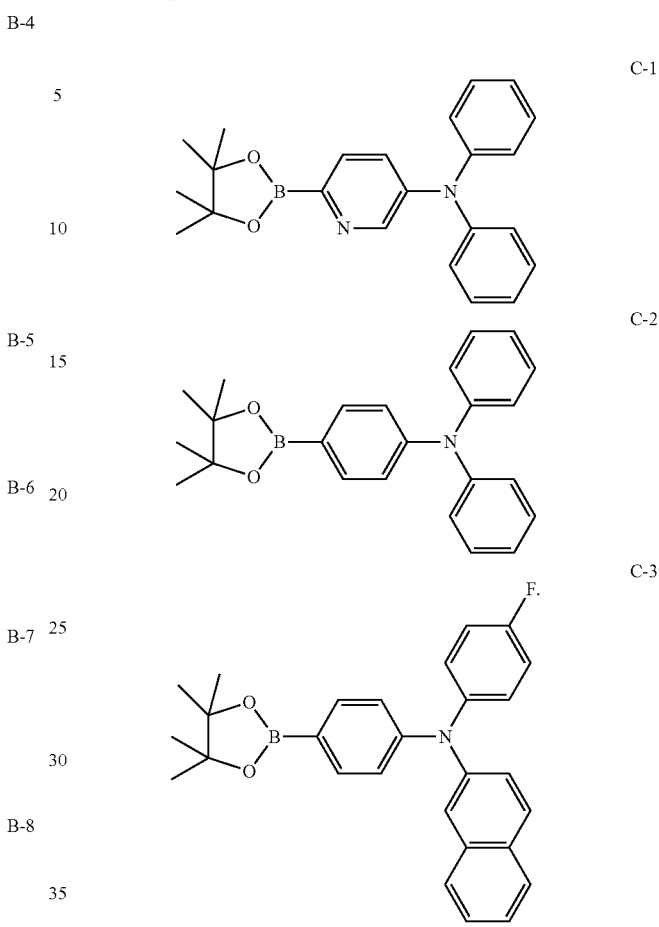
Synthesis of Compound 1
Intermediates I-1 to I-5 and Compound 1 were synthesized according to Reaction Schemes 1 and 2 below.
Reaction Scheme 1
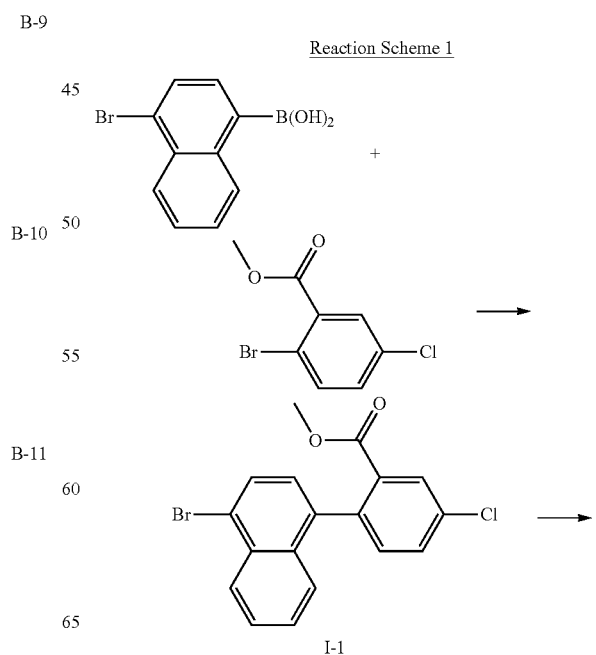

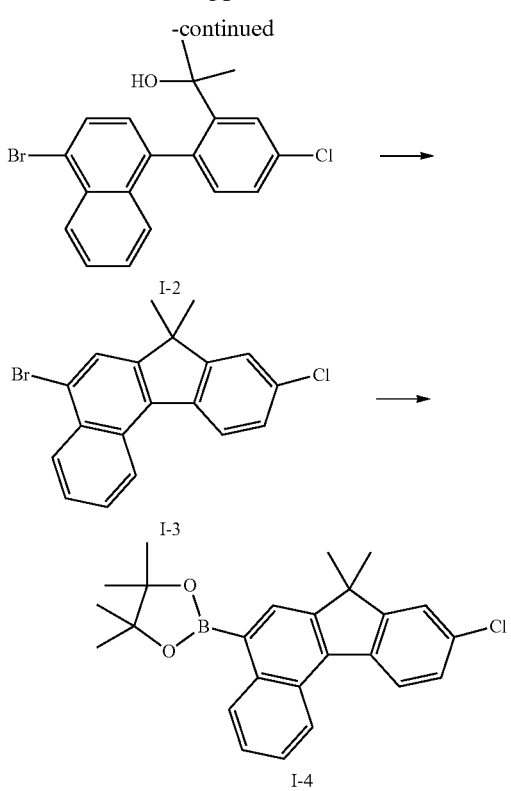

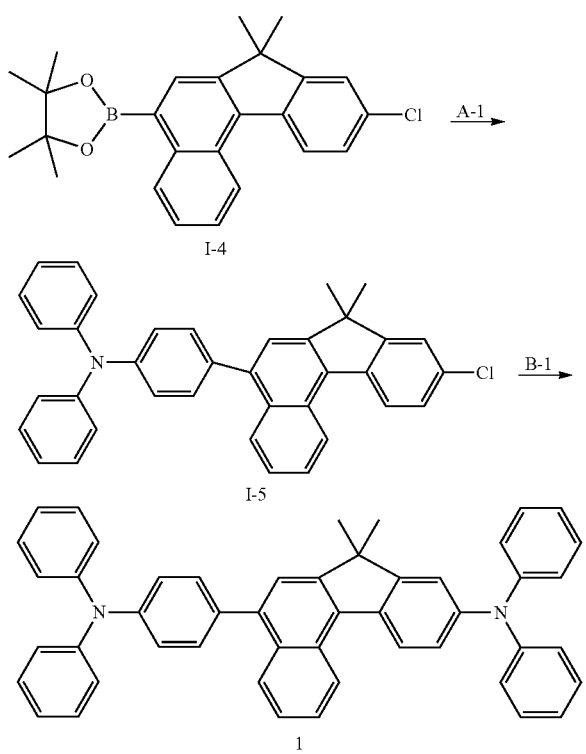

Synthesis of Intermediate I-1

25.08 g (100 mmol) of 4-bromo-1-naphthaleneborate, 24.95 g (100 mmol) of methyl 5-chloro-2-bromo benzoate, 5.77 g (0.5 mmol) of Pd(PPh$_3$)$_4$, and 27.64 g (200 mmol) of K$_2$CO$_3$ were dissolved in a 500 mL of a THF/H$_2$O (2/1 volume ratio) mixed solution, and then, the mixture was stirred at a temperature of 80° C. for 12 hours. The reaction solution was cooled to room temperature and then 200 mL of water was added thereto, followed by 3 times of extraction with 150 mL of ethylether. The collected organic solvent layer was dried with magnesium sulfate and the solvent was removed therefrom by evaporation. The obtained residue was separation-purified by silica gel-column chromatography to obtain Intermediate I-1 (29.29 g, yield 78%).

Synthesis of Intermediate I-2

In a nitrogen atmosphere, 22.51 g (60 mmol) of Intermediate I-1 was dissolved in 500 ml of anhydrous THF, and then the mixture was stirred at a temperature of 0° C. for 1 hour. 120 ml of a 1.6M solution of methylmagnesium bromide in hexane was added dropwise thereto over 1 hour. After 24 hours of stirring at room temperature, 100 ml of 1N HCl was added thereto, and then, an extraction process was performed thereon three times with 150 mL of ethylether. The collected organic solvent layer was dried with magnesium sulfate and the solvent was removed therefrom by evaporation. The obtained residue was separation-purified by silica gel-column chromatography to obtain Intermediate I-2 (16.53 g, yield 73%).

Synthesis of Intermediate I-3

In a nitrogen atmosphere, 15.02 g (40 mmol) of Intermediate I-2 was dissolved in 200 ml of an anhydrous THF, and then the mixture was stirred at a temperature of 0° C. for 1 hour. 10 ml of methanesulfonic acid was added dropwise thereto over 30 minutes. After one hour of stirring at room temperature, 100 ml of sodium carbonate aqueous solution was added thereto, and then, an extraction process was performed thereon three times with 100 mL of dichloromethane. The collected organic solvent layer was dried with magnesium sulfate and the solvent was removed therefrom by evaporation. The obtained residue was separation-purified by silica gel-column chromatography to obtain Intermediate I-3 (12.51 g, yield 87%).

Synthesis of Intermediate I-4

10.73 g (30 mmol) of Intermediate I-3 was dissolved in 20 mL of THF, and then, 12 ml of n-BuLi (30 mmol, 2.5M in hexane) was slowly added dropwise thereto at a temperature of −78° C. After one hour of stirring at the same temperature, 11.16 mL (60 mmol) of 2-isoproxy-4,4,5,5-tetramethyl-1,3,2-dioxaborane was slowly added dropwise thereto. After the reaction solution was stirred at a temperature of −78° C. for 1 hour, the resultant solution was additionally stirred for 24 hours at room temperature. After the reaction was complete, 50 mL of 10% HCl aqueous solution and 50 mL of H$_2$O were added thereto, and then, an extraction process was performed thereon three times with 80 mL of diethylether. The collected organic layer was dried with magnesium sulfate and the solvent was removed therefrom by evaporation. The obtained residue was separation-purified by silica gel-column chromatography to obtain Intermediate I-4 (10.19 g, yield 83%).

Synthesis of Compound 1

2.02 g (5 mmol) of Intermediate I-4, 1.62 g (5 mmol) of Compound A-1, 0.288 g (0.25 mmol) of Pd(PPh$_3$)$_4$, and 0.691 g (5 mmol) of K$_2$CO$_3$ were dissolved in a 100 mL of THF/H$_2$O (2/1 volume ratio) mixed solution, and then, the mixture was stirred at a temperature of 80° C. for 12 hours. The reaction solution was cooled to room temperature and then 50 mL of water was added thereto, followed by 3 times of extraction with 20 mL of ethylether. The collected organic solvent layer was dried with magnesium sulfate and the solvent was removed therefrom by evaporation. The obtained residue was separation-purified by silica gel-column chromatography to obtain Intermediate I-5 (1.983 g, yield 79%).

1.044 g (2 mmol) of Intermediate I-5, 0.507 g (3 mmol) of Compound B-1, 0.091 g (0.01 mmol) of Pd$_2$(dba)$_3$ (tris(dibenzylideneacetone)dipalladium), 0.020 g (0.01 mmol) of t-Bu$_3$P, and 0.288 g (3 mmol) of t-BuONa were dissolved in 30 ml of toluene, and then, the mixture was stirred at a temperature of 85° C. for 4 hours. The reaction solution was cooled to room temperature, and then, an extraction process was performed thereon three times with 30 ml of water and 30 ml of diethylether. The collected organic layer was dried with magnesium sulfate and the solvent was removed therefrom by evaporation. The obtained residue was separation-purified by silica gel-column chromatography to obtain Compound 1 (0.994 g, yield 78%). The produced compound was identified by LC/MS and $^1$H NMR.

$^1$H NMR (CDCl$_3$, 300 MHz): δ=□□7.62 (d, 1H), 7.56-7.50 (m, 4H), 7.44-7.34 (m, 11H), 7.28 (dd, 2H), 7.20 (dd, 1H), 7.14-7.00 (m, 5H), 6.95 (d, 1H), 6.85-6.80 (dd, 8H), 1.58 (s, 6H)

LC/MS: calculated value: 654.30. found value: 655.05.
Synthesis of Compound 2

Compound 2 (1.221 g, 81%) was obtained from Intermediate I-4 in the same manner as used to synthesize Compound 1, except that Compound A-2 was used instead of Compound A-1 and Compound B-2 was used instead of Compound B-1. The produced compound was identified by LC/MS and $^1$H NMR.

$^1$H NMR (CDCl$_3$, 300 MHz): δ=□□7.64 (dd, 2H), 7.60-7.56 (m, 3H), 7.54-7.36 (m, 12H), 7.32-7.25 (m, 9H), 7.19 (dd, 2H), 7.04 (td, 2H), 6.95 (dd, 1H), 6.85 (dd, 1H), 6.78-6.70 (m, 4H), 1.56 (s, 6H)

LC/MS: calculated value: 754.33. found value: 754.99.
Synthesis of Compound 5

Compound 5 (1.123 g, 71%) was obtained from Intermediate I-4 in the same manner as used to synthesize Compound 1, except that Compound A-3 was used instead of Compound A-1 and Compound B-6 was used instead of Compound B-1. The produced compound was identified by LC/MS and $^1$H NMR.

$^1$H NMR (CDCl$_3$, 300 MHz): δ=□7.66 (dd, 2H), 7.60-7.56 (m, 3H), 7.50-7.34 (m, 12H), 7.18-7.14 (m, 2H), 7.10-6.95 (m, 9H), 6.85-6.70 (m, 5H), 6.64 (d, 1H), 1.56 (s, 6H)

LC/MS: calculated value: 790.32. found value: 791.42.
Synthesis of Compound 6

Compound 6 (1.366 g, 76%) was obtained from Intermediate I-4 in the same manner as used to synthesize Compound 1, except that Compound A-4 was used instead of Compound A-1 and Compound B-7 was used instead of Compound B-1. The produced compound was identified by LC/MS and $^1$H NMR.

$^1$H NMR (CDCl$_3$, 300 MHz): δ=□□7.64-7.60 (m, 2H), 7.56-7.40 (m, 9H), 7.36-7.26 (m, 10H), 7.12-7.06 (m, 4H), 6.93-6.89 (m, 3H), 6.80-6.70 (m, 5H), 6.66 (d, 1H), 1.54 (s, 6H), 1.08 (s, 9H)

LC/MS: calculated value: 898.41. found value: 899.06.
Synthesis of Compound 11

Compound 11 (1.113 g, 79%) was obtained from Intermediate I-4 in the same manner as used to synthesize Compound 1, except that Compound A-2 was used instead of Compound A-1. The produced compound was identified by LC/MS and $^1$H NMR.

$^1$H NMR (CDCl$_3$, 300 MHz): δ=□□7.68 (d, 1H), 7.64-7.40 (m, 10H), 7.28-7.12 (m, 10H), 7.05 (dd, 2H), 6.84-6.76 (m, 4H), 6.58-6.46 (m, 7H), 1.56 (s, 6H)

LC/MS: calculated value: 704.32. found value: 705.46.

Synthesis of Compound 12

Compound 12 (1.221 g, 66%) was obtained from Intermediate I-4 in the same manner as used to synthesize Compound 1, except that Compound A-5 was used instead of Compound A-1 and Compound B-2 was used instead of Compound B-1. The produced compound was identified by LC/MS and $^1$H NMR.

$^1$H NMR (CDCl$_3$, 300 MHz): δ=□□7.70-7.62 (m, 4H), 7.58-7.42 (m, 10H), 7.34-7.08 (m, 10H), 6.90-6.74 (m, 5H), 6.70-6.54 (m, 6H), 1.54 (s, 6H), 1.48 (s, 6H)

LC/MS: calculated value: 838.37. found value: 839.65.
Synthesis of Compound 20

Compound 20 (1.111 g, 61%) was obtained from Intermediate I-4 in the same manner as used to synthesize Compound 1, except that Compound A-7 was used instead of Compound A-1 and Compound B-8 was used instead of Compound B-1. The produced compound was identified by LC/MS and $^1$H NMR.

$^1$H NMR (CDCl$_3$, 300 MHz): δ=□□7.72-7.68 (m, 2H), 7.62-7.28 (m, 27H), 7.18-6.90 (m, 9H), 6.74 (dd, 1H), 6.65 (d, 1H), 1.54 (s, 6H)

LC/MS: calculated value: 910.34. found value: 911.44.
Synthesis of Compound 21

Compound 21 (1.087 g, 77%) was obtained from Intermediate I-4 in the same manner as used to synthesize Compound 1, except that Compound A-8 was used instead of Compound A-1. The produced compound was identified by LC/MS and $^1$H NMR.

$^1$H NMR (CDCl$_3$, 300 MHz): δ=□8.23 (d, 1H), 7.86-7.60 (m, 10H), 7.50-7.12 (m, 12H), 6.90-6.70 (m, 5H), 6.58 (d, 1H), 6.50 (dd, 4H), 1.54 (s, 6H)

LC/MS: calculated value: 705.31. found value: 706.65.
Synthesis of Compound 22

Compound 22 (1.138 g, 67%) was obtained from Intermediate I-4 in the same manner as used to synthesize Compound 1, except that Compound A-6 was used instead of Compound A-1 and Compound B-2 was used instead of Compound B-1. The produced compound was identified by LC/MS and $^1$H NMR.

$^1$H NMR (CDCl$_3$, 300 MHz): δ=□□8.25 (d, 1H), 7.86-7.45 (m, 13H), 7.40-7.20 (m, 11H), 6.95-6.72 (m, 4H), 6.65-6.58 (m, 3H), 6.35 (dd, 2H), 1.54 (s, 6H)

LC/MS: calculated value: 839.37. found value: 843.22.
Synthesis of Compound 23

Compound 23 (1.130 g, 71%) was obtained from Intermediate I-4 in the same manner as used to synthesize Compound 1, except that Compound A-9 was used instead of Compound A-1 and Compound B-3 was used instead of Compound B-1. The produced compound was identified by LC/MS and $^1$H NMR.

$^1$H NMR (CDCl$_3$, 300 MHz): δ=□□8.45 (s, 2H), 8.32 (s, 1H), 7.86-7.60 (m, 14H), 7.52-7.46 (m, 3H), 7.40-7.15 (m, 4H), 6.86-6.60 (m, 4H), 1.54 (s, 6H)

LC/MS: calculated value: 795.32. found value: 796.44.
Synthesis of Compound 34

Intermediates II-1 to II-6 and Compound 34 were synthesized according to Reaction Schemes 3 and 4 below.

Reaction Scheme 3

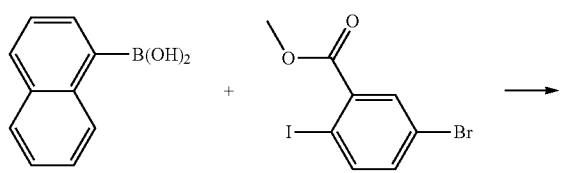

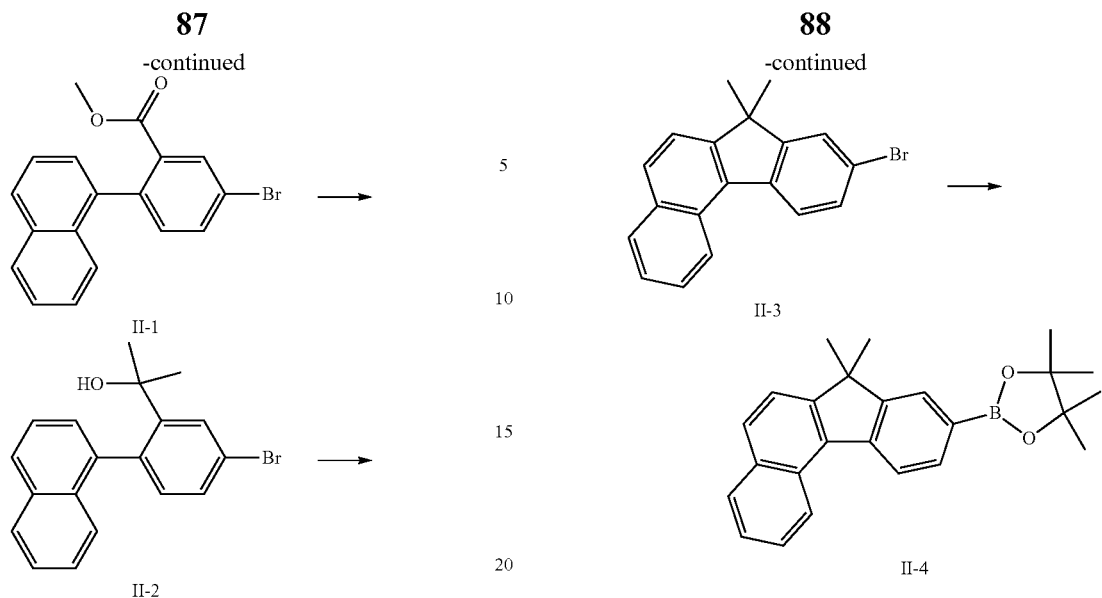
II-1
II-2
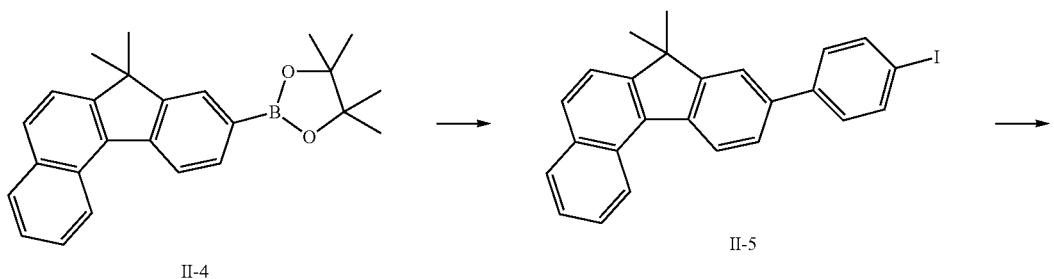
II-3
II-4
Reaction Scheme 4
II-4 → II-5
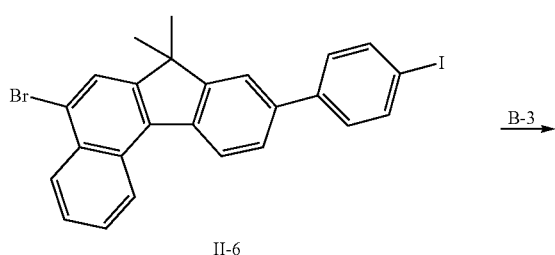
II-6
B-3 →
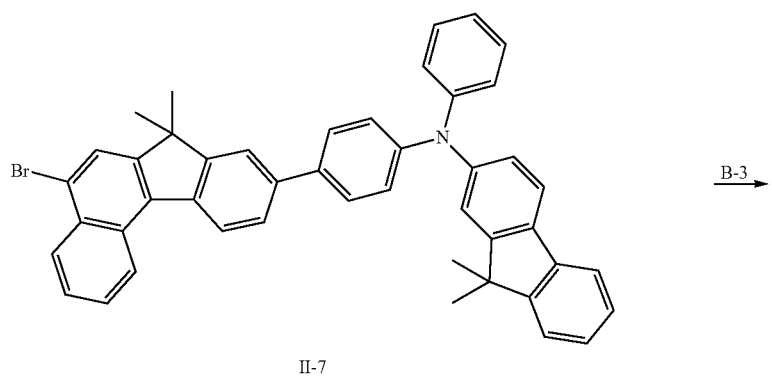
II-7
B-3 →

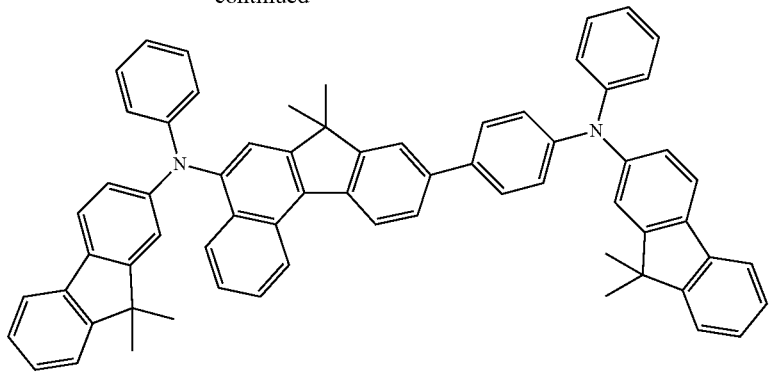

34

Synthesis of Intermediate II-1

Intermediate II-1 (14.322 g, 78%) was synthesized in the same manner as used to synthesize Intermediate I-1, except that 1-naphthaleneborate was used instead of 4-bromo-1-naphthaleneborate.

Synthesis of Intermediate II-2

Intermediate II-2 (12.276 g, 85%) was synthesized in the same manner as used to synthesize Intermediate I-2, except that Intermediate II-1 was used instead of Intermediate I-1.

Synthesis of Intermediate II-3

Intermediate II-3 (10.659 g, 92%) was synthesized in the same manner as used to synthesize Intermediate I-3, except that Intermediate II-2 was used instead of Intermediate I-2.

Synthesis of Intermediate II-4

Intermediate II-4 (5.55 g, 76%) was synthesized in the same manner as used to synthesize Intermediate I-4, except that Intermediate II-3 was used instead of Intermediate I-3.

Synthesis of Intermediate II-5

Intermediate II-5 (5.35 g, 80%) was synthesized in the same manner as used to synthesize Intermediate I-5, except that Intermediate II-4 was used instead of Intermediate I-4 and 1,4 diiodobenzene was used instead of Compound A-1. The produced compound was identified by LC/MS and $^1$H NMR.

Synthesis of Intermediate II-6

4.45 g (10 mmol) of Intermediate II-5 and 1.78 g (10 mmol) of N-bromosuccinimide were dissolved in 100 ml of DMF, and then, the mixture was stirred at a temperature of 130° C. for 1 hour. The reaction solution was cooled to room temperature, and then, 30 ml of water was added thereto, and then, an extraction process was performed thereon three times with 30 ml of diethylether. The collected organic layer was dried with magnesium sulfate and the solvent was removed therefrom by evaporation. The obtained residue was separation-purified by silica gel-column chromatography to obtain Compound II-6 (4.62 g, 88%). The produced compound was identified by LC/MS and $^1$H NMR.

Synthesis of Compound 34

1.575 g (3 mmol) of Intermediate II-6, 1.14 g (4 mmol) of Compound B-3, 0.137 g (0.15 mmol) of Pd$_2$(dba)$_3$ (tris(dibenzylideneacetone)dipalladium), 0.030 g (0.15 mmol) of t-Bu$_3$P, and 0.288 g (4 mmol) of t-BuONa were dissolved in 30 ml of toluene, and then, the mixture was stirred at a temperature of 85° C. for 4 hours. The reaction solution was cooled to room temperature, and then, an extraction process was performed thereon three times with 30 ml of water and 30 ml of diethylether. The collected organic layer was dried with magnesium sulfate and the solvent was removed therefrom by evaporation. The obtained residue was separation-purified by silica gel-column chromatography to obtain Intermediate II-7 (1.501 g, 73%).

1.364 g (2 mmol) of Intermediate II-7, 0.855 g (3 mmol) of Compound B-3, 0.091 g (0.1 mmol) of Pd$_2$(dba)$_3$ (tris(dibenzylideneacetone)dipalladium), 0.020 g (0.1 mmol) of t-Bu$_3$P, and 0.288 g (3 mmol) of t-BuONa were dissolved in 30 ml of toluene, and then, the mixture was stirred at a temperature of 85° C. for 4 hours. The reaction solution was cooled to room temperature, and then, an extraction process was performed thereon three times with 30 ml of water and 30 ml of diethylether. The collected organic layer was dried with magnesium sulfate and the solvent was removed therefrom by evaporation. The obtained residue was separation-purified by silica gel-column chromatography to obtain Compound 34 (1.268 g, 71%). The produced compound was identified by LC/MS and $^1$H NMR.

$^1$H NMR (CDCl$_3$, 300 MHz): δ=☐☐7.78-7.68 (m, 4H), 7.63-7.46 (m, 5H), 7.38-7.27 (m, 4H), 7.05-6.91 (m, 10H), 6.86 (s, 1H), 6.82-6.74 (m, 4H), 6.65-6.58 (m, 4H), 6.44 (dd, 2H), 6.34 (dd, 2H), 1.54 (s, 6H), 1.48 (s, 12H)

LC/MS: calculated value: 886.43. found value: 887.55.

Synthesis of Compound 31

Compound 31 (1.155 g, 76%) was obtained from Intermediate II-6 in the same manner as used to synthesize Compound 34, except that Compound B-2 was used instead of Compound B-3. The produced compound was identified by LC/MS and $^1$H NMR.

$^1$H NMR (CDCl$_3$, 300 MHz): δ=☐7.70-7.60 (m, 4H), 7.58-7.32 (m, 15H), 7.20-7.10 (m, 8H), 6.86-6.75 (m, 5H), 6.44 (dd, 2H), 6.34 (dd, 2H), 1.54 (s, 6H)

LC/MS: calculated value: 754.33. found value: 755.10.

Synthesis of Compound 33

Compound 33 (0.968 g, 60%) was obtained from Intermediate II-6 in the same manner as used to synthesize Compound 34, except that Compound B-9 was used instead of Compound B-3. The produced compound was identified by LC/MS and $^1$H NMR.

$^1$H NMR (CDCl$_3$, 300 MHz): δ=☐7.72-7.66 (m, 2H), 7.60-7.52 (m, 7H), 7.50-7.28 (m, 12H), 7.05-6.91 (m, 6H), 6.75-6.60 (m, 6H), 6.42 (dd, 2H), 6.36 (dd, 2H), 6.31 (dd, 2H), 1.54 (s, 6H)

LC/MS: calculated value: 806.37. found value: 807.34.

Synthesis of Compound 48

Intermediate III-7 and Compound 48 were synthesized according to Reaction Scheme 5.

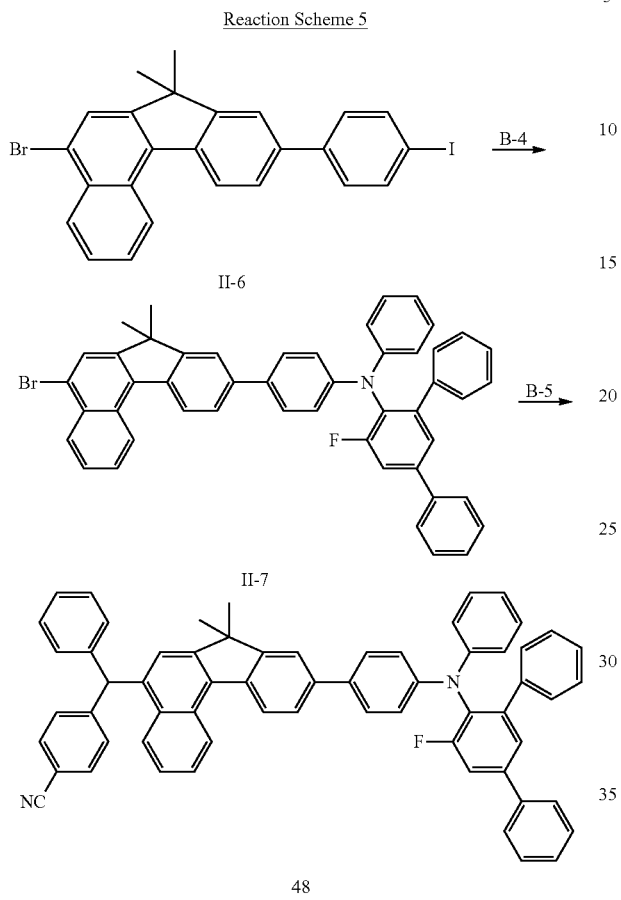

Synthesis of Compound 48

1.575 g (3 mmol) of Intermediate II-6, 1.356 g (4 mmol) of Compound B-4, 0.091 g (0.1 mmol) of $Pd_2(dba)_3$ (tris(dibenzylideneacetone)dipalladium), 0.020 g (0.1 mmol) of t-$Bu_3P$, and 0.384 g (4 mmol) of t-BuONa were dissolved in 30 ml of toluene, and then, the mixture was stirred at a temperature of 85° C. for 4 hours. The reaction solution was cooled to room temperature, and then, an extraction process was performed thereon three times with 30 ml of water and 30 ml of diethylether. The collected organic layer was dried with magnesium sulfate and the solvent was removed therefrom by evaporation. The obtained residue was separation-purified by silica gel-column chromatography to obtain Intermediate III-7 (1.84 g, 83%).

1.470 g (2 mmol) of Intermediate III-7, 0.582 g (3 mmol) of Compound B-5, 0.091 g (0.1 mmol) of $Pd_2(dba)_3$ (tris(dibenzylideneacetone)dipalladium), 0.020 g (0.1 mmol) of t-$Bu_3P$, and 0.288 g (3 mmol) of t-BuONa were dissolved in 30 ml of toluene, and then, the mixture was stirred at a temperature of 85° C. for 4 hours. The reaction solution was cooled to room temperature, and then, an extraction process was performed thereon three times with 30 ml of water and 30 ml of diethylether. The collected organic layer was dried with magnesium sulfate and the solvent was removed therefrom by evaporation. The obtained residue was separation-purified by silica gel-column chromatography to obtain Compound 48 (1.394 g, 80%). The produced compound was identified by LC/MS and $^1$H NMR.

$^1$H NMR (CDCl$_3$, 300 MHz): δ=□□7.78-7.72 (m, 2H), 7.68-7.36 (m, 18H), 7.18-7.05 (m, 7H), 6.94-6.88 (m, 3H), 6.75-6.70 (dd, 4H), 6.35-6.29 (m, 4H), 1.55 (s, 6H)

LC/MS: calculated value: 850.03. found value: 851.22.

Synthesis of Compound 42

Compound 42 (1.161 g, 82%) was obtained from Intermediate II-6 in the same manner as used to synthesize Compound 48, except that Compound B-2 was used instead of Compound B-4 and Compound B-1 was used instead of Compound B-5. The produced compound was identified by LC/MS and $^1$H NMR.

$^1$H NMR (CDCl$_3$, 300 MHz): δ=□□7.76-7.60 (m, 3H), 7.55-7.42 (m, 7H), 7.35-7.24 (m, 3H), 7.15-7.00 (m, 9H), 6.78-6.62 (m, 6H), 6.40 (dd, 2H), 6.34 (dd, 4H), 1.55 (s, 6H)

LC/MS: calculated value: 704.32. found value: 705.65.

Synthesis of Compound 46

Compound 46 (0.971 g, 63%) was obtained from Intermediate II-6 in the same manner as used to synthesize Compound 48, except that Compound B-10 was used instead of Compound B-4 and Compound B-6 was used instead of Compound B-5. The produced compound was identified by LC/MS and $^1$H NMR.

$^1$H NMR (CDCl$_3$, 300 MHz): δ=□□7.82-7.60 (m, 4H), 7.58-7.22 (m, 15H), 7.13-7.05 (m, 4H), 6.97-6.91 (m, 2H), 6.82 (dd, 3H), 6.45 (q, 2H), 1.55 (s, 6H)

LC/MS: calculated value: 777.36. found value: 778.26.

Synthesis of Compound 52

Intermediates II-8 and II-9 and Compound 52 were synthesized according to Reaction Scheme 6.

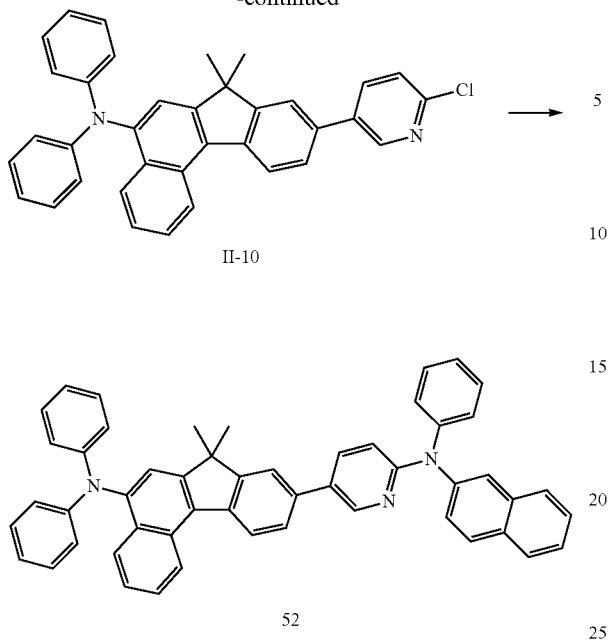

Synthesis of Compound 62

Intermediates III-1 to III-5 and Compound 62 were synthesized according to Reaction Schemes 7 and 8 below.

Reaction Scheme 7

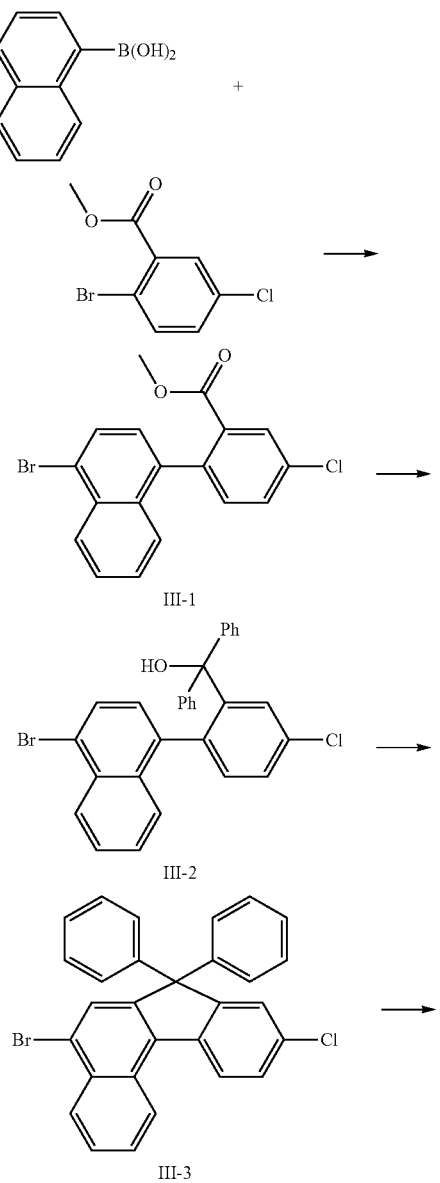

Synthesis of Intermediate II-8

Intermediate II-8 (4.62 g, 65%) was synthesized in the same manner as used to synthesize Intermediate I-5, except that 2-chloro-5-bromopyridine was used instead of Compound A-1.

Synthesis of Intermediate II-9

Intermediate II-9 (4.37 g, 77%) was synthesized in the same manner as used to synthesize Intermediate II-6, except that Intermediate II-8 was used instead of Intermediate II-5.

Synthesis of Compound 52

Intermediate II-10 (1.25 g, 80%) was synthesized in the same manner as used to synthesize Intermediate II-7, except that Intermediate II-9 was used instead of Intermediate II-6 and Compound B-1 was used instead of Compound B-3.

Compound 52 (1.001 g, 71%) was obtained in the same manner as used to synthesize Compound 1, except that Intermediate II-10 was used instead of Intermediate I-5 and Compound B-2 was used instead of Compound B-1. The produced compound was identified by LC/MS and $^1$H NMR.

$^1$H NMR (CDCl$_3$, 300 MHz): δ=8.24 (d, 1H), 7.82-7.79 (m, 2H), 7.76-7.50 (m, 10H), 7.46-7.15 (m, 10H), 6.92-6.76 (m, 6H), 6.35 (d, 4H), 1.55 (s, 6H)

LC/MS: calculated value: 705.89. found value: 707.05.

Synthesis of Compound 57

Compound 57 (1.073 g, 67%) was obtained from Intermediate II-9 in the same manner as used to synthesize Compound 52, except that Compound B-2 was used instead of Compound B-1 and Compound B-11 was used instead of Compound B-2. The produced compound was identified by LC/MS and $^1$H NMR.

$^1$H NMR (CDCl$_3$, 300 MHz): δ=8.15 (d, 1H), 8.10 (s, 1H), 7.98-7.52 (m, 16H), 7.36-7.15 (m, 10H), 6.98 (s, 1H), 6.92 (td, 2H), 6.70 (dd, 2H), 6.34 (dd, 2H), 1.55 (s, 6H)

LC/MS: calculated value: 795.32. found value: 795.99.

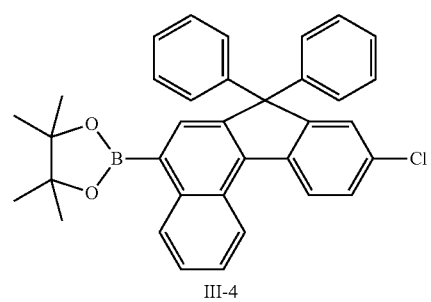

Reaction Scheme 8

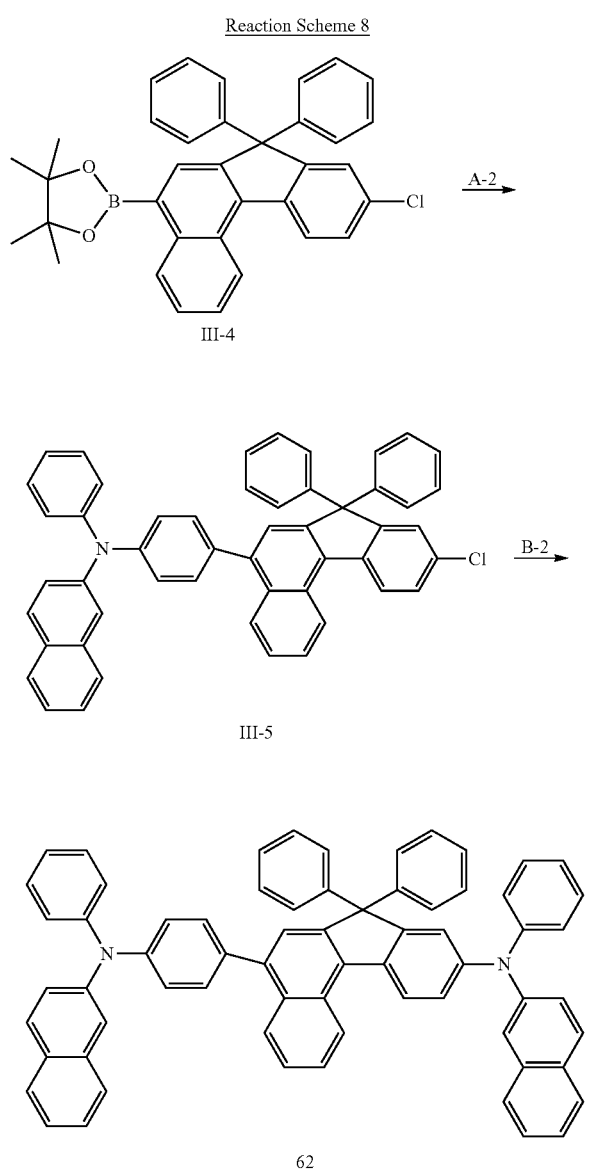

Synthesis of Intermediate III-3

Intermediate III-3 (11.063 g, 85%) was synthesized in the same manner as used to synthesize Intermediate I-3, except that Intermediate III-2 was used instead of Intermediate I-2.

Synthesis of Intermediate III-4

Intermediate III-4 (8.976 g, 77%) was synthesized in the same manner as used to synthesize Intermediate I-4, except that Intermediate III-3 was used instead of Intermediate I-3.

Synthesis of Compound 62

Intermediate III-5 (1.741 g, 83%) was synthesized in the same manner as used to synthesize Intermediate I-5, except that Intermediate III-4 was used instead of Intermediate I-4 and Compound A-2 was used instead of Compound A-1.

Compound 62 (1.246 g, 71%) was synthesized in the same manner as used to synthesize Compound 1, except that Intermediate III-5 was used instead of Intermediate I-5 and Compound B-2 was used instead of Compound B-1. The produced compound was identified by LC/MS and $^1$H NMR.

$^1$H NMR (CDCl$_3$, 300 MHz): δ=☐☐7.74-7.50 (m, 12H), 7.44-7.32 (m, 5H), 7.28-7.20 (m, 4H), 7.15-6.88 (m, 14H), 6.82-6.70 (m, 3H), 6.68 (td, 2H), 6.39-6.29 (m, 6H)

LC/MS: calculated value: 878.37. found value: 879.10.

Synthesis of Compound 67

Compound 67 (1.101 g, 61%) was synthesized in the same manner as used to synthesize Compound 62, except that Compound A-10 was used instead of Compound A-2. The produced compound was identified by LC/MS and $^1$H NMR.

$^1$H NMR (CDCl$_3$, 300 MHz): δ=☐☐7.84-7.68 (m, 5H), 7.62-7.42 (m, 11H), 7.36-7.30 (m, 4H), 7.26-7.02 (m, 15H), 6.92 (td, 1H), 6.68 (qd, 2H), 6.40-6.26 (m, 8H)

LC/MS: calculated value: 918.36. found value: 919.44.

Synthesis of Compound 74

Intermediates IV-1 to IV-6 and Compound 74 were synthesized according to Reaction Schemes 9 and 10 below.

Synthesis of Intermediate III-1

25.08 g (100 mmol) of 4-bromo-1-naphthaleneborate, 24.95 g (100 mmol) of methyl 5-chloro-2-bromo benzoate, 5.77 g (0.5 mmol) of Pd(PPh$_3$)$_4$, and 27.64 g (200 mmol) of K$_2$CO$_3$ were dissolved in a 500 mL of THF/H$_2$O (2/1 volume ratio) mixed solution, and then, the mixture was stirred at a temperature of 80° C. for 12 hours. The reaction solution was cooled to room temperature and then 200 mL of water was added thereto, followed by 3 times of extraction with 150 mL of ethylether. The collected organic solvent layer was dried with magnesium sulfate and the solvent was removed therefrom by evaporation. The obtained residue was separation-purified by silica gel-column chromatography to obtain Intermediate III-1 (29.29 g, yield 78%).

Synthesis of Intermediate III-2

Intermediate III-2 (13.473 g, 90%) was synthesized in the same manner as in Intermediate I-2, except that Intermediate III-1 was used instead of Intermediate I-1 and a 1.6M phenyl magnesium bromide hexane solution was used instead of a 1.6M methylmagnesium bromide hexane solution.

Reaction Scheme 9

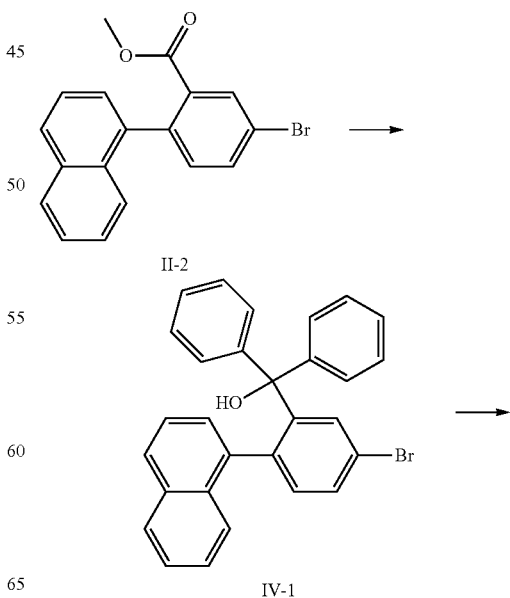

97
-continued
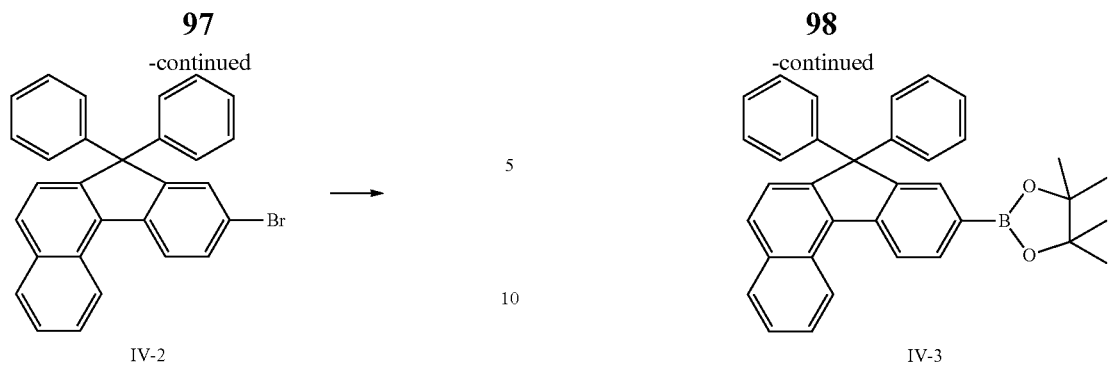
98
-continued
Reaction Scheme 10
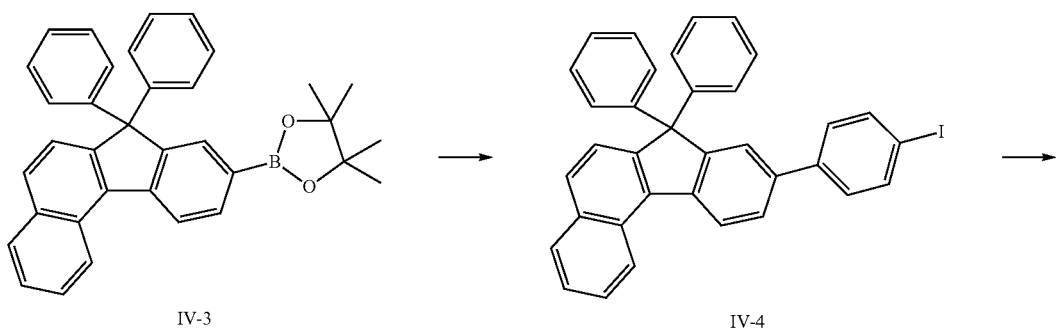
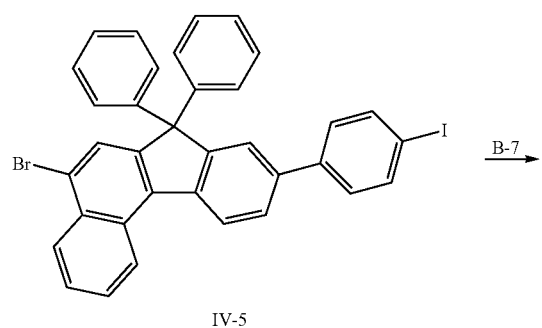
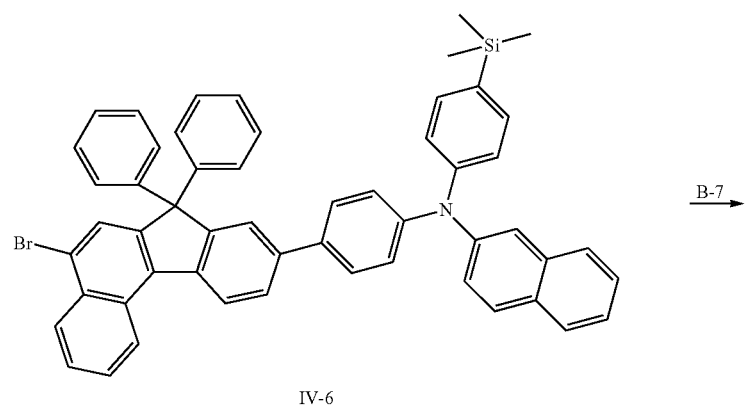

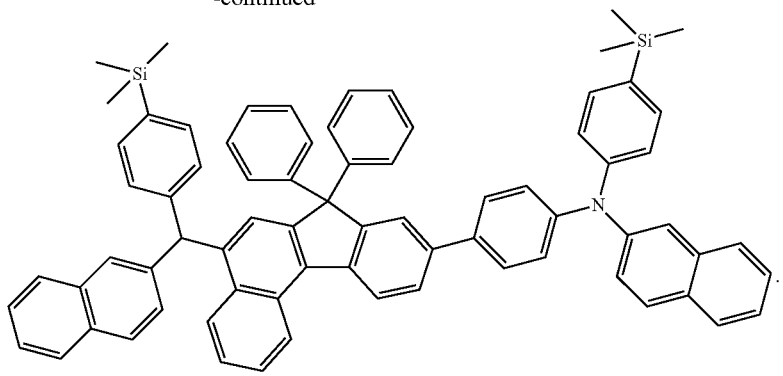

74

Synthesis of Intermediate IV-1

Intermediate IV-1 (12.183 g, 87%) was synthesized in the same manner as in Intermediate II-2, except that a 1.6M phenyl magnesium bromide hexane solution was used instead of a 1.6M methylmagnesium bromide hexane solution.

Synthesis of Intermediate IV-2

Intermediate IV-2 (10.281 g, 87%) was synthesized in the same manner as used to synthesize Intermediate II-3, except that Intermediate IV-1 was used instead of Intermediate II-2.

Synthesis of Intermediate IV-3

Intermediate IV-3 (9.386 g, 86%) was synthesized in the same manner as used to synthesize Intermediate II-4, except that Intermediate IV-2 was used instead of Intermediate II-3.

Synthesis of Intermediate IV-4

Intermediate IV-4 (7.41 g, 79%) was synthesized in the same manner as used to synthesize Intermediate II-5, except that Intermediate IV-3 was used instead of Intermediate II-4.

Synthesis of Intermediate IV-5

Intermediate IV-5 (7.11 g, 84%) was synthesized in the same manner as used to synthesize Intermediate II-6, except that Intermediate IV-4 was used instead of Intermediate II-5.

Synthesis of Intermediate IV-6

Intermediate IV-6 (2.054 g, 84%) was synthesized in the same manner as used to synthesize Intermediate II-7, except that Intermediate IV-5 was used instead of Intermediate II-6 and Intermediate B-7 was used instead of Intermediate B-3.

Synthesis of Compound 74

Compound 74 (1.553 g, 76%) was synthesized in the same manner as used to synthesize Compound 34, except that Intermediate IV-6 was used instead of Intermediate II-7 and Compound B-7 was used instead of Compound B-3. The produced compound was identified by LC/MS and $^1$H NMR.

$^1$H NMR (CDCl$_3$, 300 MHz): δ=□7.84-7.68 (m, 6H), 7.65-7.55 (m, 6H), 7.50-7.35 (m, 10H), 7.25-7.11 (m, 5H), 7.05-6.93 (m, 7H), 6.86-6.72 (m, 4H), 6.54 (dd, 2H), 6.48-6.40 (m, 4H), 1.08 (s 18H)

LC/MS: calculated value: 1022.45. found value: 1022.99.

Synthesis of Compound 71

Compound 71 (1.098 g, 62%) was synthesized in the same manner as used to synthesize Compound 74, except that Compound B-2 was used instead of Compound B-7. The produced compound was identified by LC/MS and $^1$H NMR.

$^1$H NMR (CDCl$_3$, 300 MHz): δ=□7.86-7.66 (m, 6H), 7.63-7.39 (m, 12H), 7.32-7.28 (m, 5H), 7.20-6.97 (m, 15H), 6.93 (dd, 2H), 6.72 (qd, 2H), 6.44 (dd, 2H), 6.28 (dd, 2H)

LC/MS: calculated value: 879.10. found value: 878.44.

Synthesis of Compound 87

Intermediate II-11 and Compound 87 were synthesized according to Reaction Scheme 11.

Reaction Scheme 11

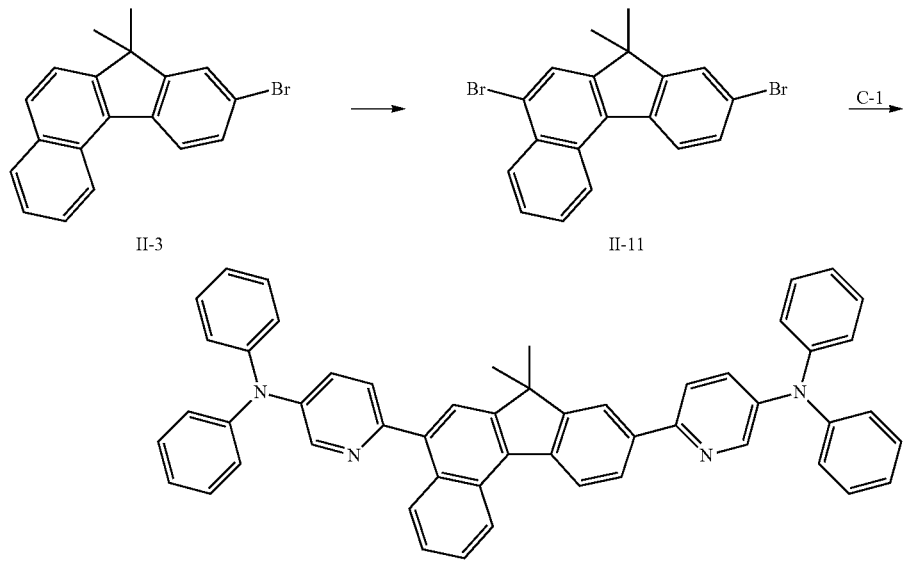

87

Synthesis of Intermediate II-11

Intermediate II-11 (6.03 g, 75%) was synthesized in the same manner as used to synthesize Intermediate II-6, except that Intermediate II-3 was used instead of Intermediate II-5.

Synthesis of Compound 87

0.804 g (2 mmol) of Intermediate II-11, 3.348 g (9 mmol) of Compound C-1, 0.115 g (0.1 mmol) of Pd(PPh$_3$)$_4$, and 1.382 g (10 mmol) of K$_2$CO$_3$ were dissolved in a 100 mL of THF/H$_2$O (2/1 volume ratio) mixed solution, and then, the mixture was stirred at a temperature of 80° C. for 12 hours. The reaction solution was cooled to room temperature and then 50 mL of water was added thereto, followed by 3 times of extraction with 30 mL of ethylether. The collected organic layer was dried with magnesium sulfate and the solvent was removed therefrom by evaporation. The obtained residue was separation-purified by silica gel-column chromatography to obtain Compound 87 (0.878 g, yield 60%). The produced compound was identified by LC/MS and $^1$H NMR.

$^1$H NMR (CDCl$_3$, 300 MHz): δ=□□8.23 (d, 1H), 8.17 (d, 2H), 8.10 (d, 1H), 8.05-8.00 (m, 2H), 7.78-7.48 (m, 8H), 7.32-7.15 (m, 8H), 6.88 (td, 4H), 6.52 (dd, 8H), 1.55 (s, 6H)

LC/MS: calculated value: 732.33. found value: 733.44.

Synthesis of Compound 81

Compound 81 (0.949 g, 65%) was synthesized in the same manner as used to synthesize Compound 87, from Intermediate II-11, except that Compound C-2 was used instead of Compound C-1.

$^1$H NMR (CDCl$_3$, 300 MHz): δ=□□7.86-7.82 (m, 2H), 7.74 (d, 1H), 7.55-7.46 (m, 6H), 7.30-7.08 (m, 12H), 6.91 (dd, 2H), 6.85 (dd, 2H), 6.72 (td, 4H), 6.46 (dd, 8H), 1.55 (s, 6H)

LC/MS: calculated value: 730.33. found value: 731.25.

Synthesis of Compound 92

Intermediate III-6 and Compound 92 were synthesized according to Reaction Scheme 12.

Synthesis of Intermediate III-6

Intermediate III-6 (9.573 g, 82%) was synthesized in the same manner as used to synthesize Intermediate II-6, except that Intermediate IV-2 was used instead of Intermediate II-5.

Synthesis of Compound 92

Compound 92 (1.336 g, 67%) was synthesized in the same manner as used to synthesize Compound 87, except that Intermediate III-6 was used instead of Intermediate II-11 and Compound C-3 was used instead of Compound C-1. The produced compound was identified by LC/MS and $^1$H NMR.

$^1$H NMR (CDCl$_3$, 300 MHz): δ=□□7.86-7.72 (m, 3H), 7.68-7.45 (m, 10H), 7.38-7.15 (m, 12H), 7.12-6.84 (m, 17H), 6.74-6.68 (m, 6H)

LC/MS: calculated value: 990.38. found value: 991.05.

Hereinafter, one or more embodiments of the present invention will be described in detail with reference to the following examples. However, these examples are not intended to limit the scope of the present invention.

Example 1

An anode was prepared by cutting a Corning 15 Ω/cm$^2$ (1200 Å) ITO glass substrate to a size of 50 mm×50 mm×0.7 mm, ultrasonically cleaning the glass substrate using isopropyl alcohol and pure water each for 5 minutes, and then exposing to irradiation of UV light for 30 minutes and ozone to clean. Then, the ITO glass substrate was loaded into a vacuum deposition apparatus.

2-TNATA was vacuum deposited on the ITO glass substrate to form a HIL with a thickness of 600 Å. NPB was vacuum deposited on the HIL to form a HTL having a thickness of 300 Å

ADN (as a host) and Compound 1 (as a dopant) were co-deposited on the HTL at a weight ratio of 98:2 to form an EML having a thickness of 300 Å.

Reaction Scheme 12

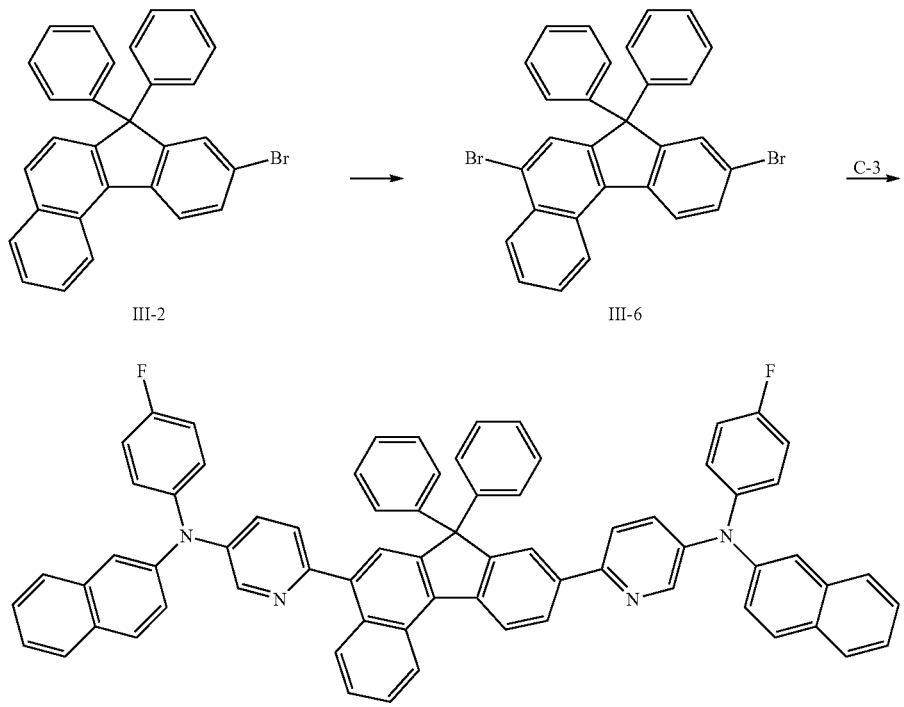

Alq₃ was vacuum deposited on the EML to form an ETL having a thickness of 300 Å, LiF was vacuum-deposited on the ETL to form an EIL having a thickness of 10 Å, and Al was vacuum deposited on the EIL to form a cathode having a thickness of 3000 Å, thereby completing the manufacturing of an organic light-emitting diode.

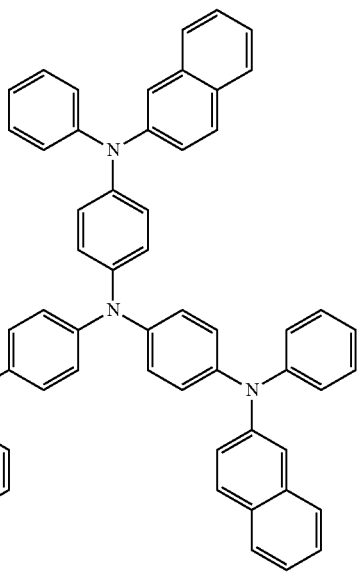

2-TNATA

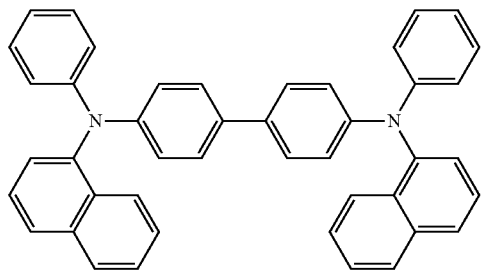

NPB

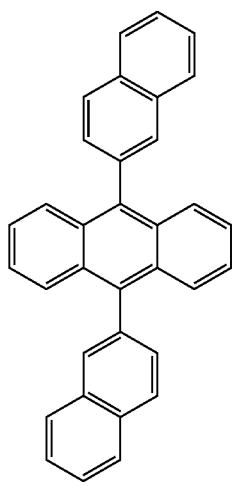

ADN

Example 2

An organic light-emitting diode was manufactured in the same manner as in Example 1, except that Compound 12 was used instead of Compound 1 in forming the EML.

Example 3

An organic light-emitting diode was manufactured in the same manner as in Example 1, except that Compound 22 was used instead of Compound 1 in forming the EML.

Example 4

An organic light-emitting diode was manufactured in the same manner as in Example 1, except that Compound 34 was used instead of Compound 1 in forming the EML.

Example 5

An organic light-emitting diode was manufactured in the same manner as in Example 1, except that Compound 48 was used instead of Compound 1 in forming the EML.

Example 6

An organic light-emitting diode was manufactured in the same manner as in Example 1, except that Compound 52 was used instead of Compound 1 in forming the EML.

Example 7

An organic light-emitting diode was manufactured in the same manner as in Example 1, except that Compound 74 was used instead of Compound 1 in forming the EML.

Example 8

An organic light-emitting diode was manufactured in the same manner as in Example 1, except that Compound 87 was used instead of Compound 1 in forming the EML.

Example 9

An organic light-emitting diode was manufactured in the same manner as in Example 1, except that Compound 92 was used instead of Compound 1 in forming the EML.

Comparative Example 1

An organic light-emitting diode was manufactured in the same manner as in Example 1, except that DPAVBi was used instead of Compound 1 in forming the EML.

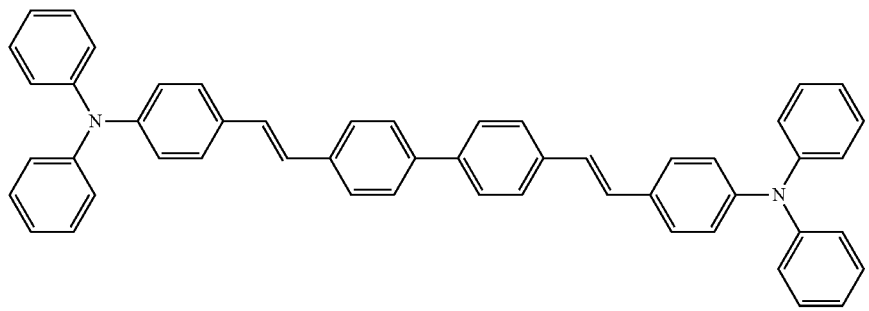

DPAVBi

Comparative Example 2

An organic light-emitting diode was manufactured in the same manner as in Example 1, except that Compound A was used instead of Compound 1 in forming the EML.

Compound A

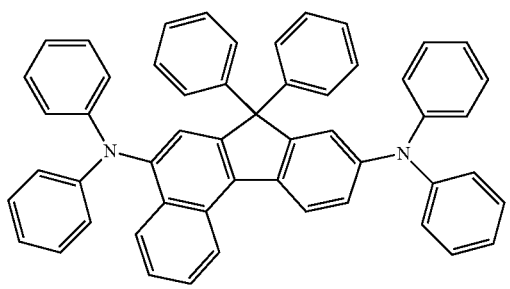

Comparative Example 3

An organic light-emitting diode was manufactured in the same manner as in Example 1, except that Compound B was used instead of Compound 1 in forming the EML.

Compound B

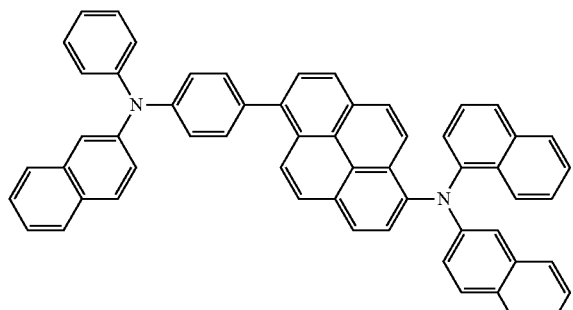

Comparative Example 4

An organic light-emitting diode was manufactured in the same manner as in Example 1, except that Compound C was used instead of Compound 1 in forming the EML.

Compound C

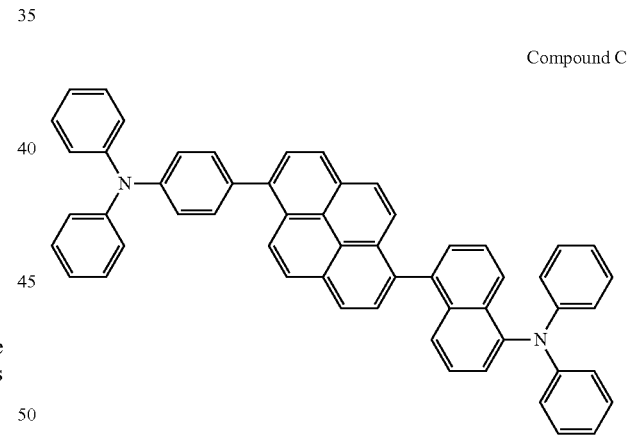

Evaluation Example 1

The driving voltage, current density, brightness, efficiency, and color purity of the organic light-emitting diodes of Examples 1 to 9 and Comparative Examples 1 to 4 were evaluated by using a PR650 Spectroscan Source Measurement Unit (product of PhotoResearch company). Results thereof are shown in Table 1:

TABLE 1

|  | Light-emitting material | Driving voltage (V @ 50 mA/cm$^2$) | Brightness (cd/m$^2$@50 mA/cm$^2$) | Efficiency (cd/A@50 mA/cm$^2$) | Emission color | Half lifetime (hr@100 mA/cm$^2$) |
| --- | --- | --- | --- | --- | --- | --- |
| Example 1 | Compound 1 | 6.11 | 3210 | 6.42 | Blue | 380 |
| Example 2 | Compound 12 | 6.18 | 3388 | 6.78 | Blue | 358 |
| Example 3 | Compound 22 | 6.17 | 3515 | 7.03 | Blue | 362 |
| Example 4 | Compound 34 | 6.22 | 3328 | 6.66 | Blue | 351 |
| Example 5 | Compound 48 | 6.23 | 3540 | 7.08 | Blue | 345 |
| Example 6 | Compound 52 | 6.09 | 3452 | 6.90 | Blue | 354 |
| Example 7 | Compound 74 | 6.32 | 3580 | 7.16 | Blue | 325 |
| Example 8 | Compound 87 | 6.12 | 3240 | 6.48 | Blue | 318 |
| Example 9 | Compound 92 | 6.20 | 3600 | 7.20 | Blue | 312 |
| Comparative Example 1: | DPAVBi | 7.35 | 2065 | 4.13 | Blue | 145 |
| Comparative Example 2: | Compound A | 6.45 | 3025 | 6.05 | Blue | 286 |
| Comparative Example 3: | Compound B | 6.65 | 2825 | 5.65 | Blue | 274 |
| Comparative Example 4: | Compound C | 6.38 | 2975 | 5.95 | Blue | 295 |

Referring to Table 1, it was confirmed that the organic light-emitting diodes manufactured according to Examples 1 to 9 had a lower driving voltage, and improved current density, brightness, efficiency, and color purity characteristics, compared to the organic light-emitting diodes manufactured according to Comparative Examples 1 to 4.

Thus, according to some embodiments, an organic light-emitting diode including the benzofluorene-based compound may have a low driving voltage, high efficiency, high brightness, and long lifespan.

While the present invention has described with reference to certain embodiments thereof, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A benzofluorene-based compound represented by Formula 1 below:

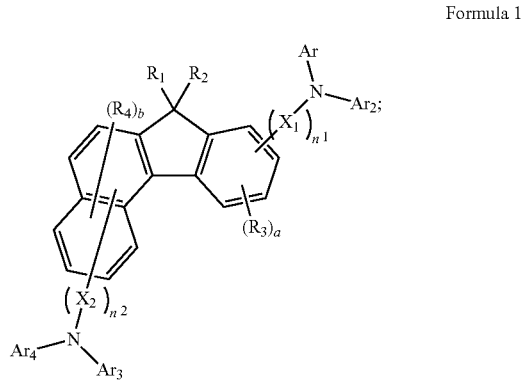

Formula 1 wherein in Formula 1:

$X_1$ and $X_2$ are each independently selected from a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, and a substituted or unsubstituted $C_2$-$C_{60}$ heteroarylene group;

n1 and n2 are each independently selected from an integer of 0 to 3, wherein when n1 is an integer of 2 or more, 2 or more of $X_1$ are identical to or different from each other, and when n2 is an integer of 2 or more, 2 or more of $X_2$ are identical to or different from each other;

the sum of n1 and n2 is an integer of 1 to 6;

$Ar_1$ to $Ar_4$ are each independently selected from a substituted or unsubstituted $C_6$-$C_{30}$ aryl group and a substituted or unsubstituted $C_2$-$C_{30}$ heteroaryl group;

$R_1$ to $R_4$ are each independently selected from a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{30}$ alkyl group, a substituted or unsubstituted $C_2$-$C_{60}$ alkenyl group, a substituted or unsubstituted $C_2$-$C_{60}$ alkynyl group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{30}$ aryl group, and a substituted or unsubstituted $C_2$-$C_{30}$ heteroaryl group;

a is an integer of 0 to 3, and when a is an integer of 2 or more, 2 or more of $R_3$ are identical to or different from each other; and b is an integer of 0 to 5, and when b is an integer of 2 or more, 2 or more of $R_4$ are identical to or different from each other.

2. The benzofluorene-based compound of claim 1, wherein $X_1$ and $X_2$ are each independently selected from:

a phenylene group, a naphthylene group, an anthracenylene group, a pyridinylene group, a pyrazinylene group, a pyrimidinylene group, and a pyridazinylene group; and a phenylene group, a naphthylene group, an anthracenylene group, a pyridinylene group, a pyrazinylene group, a pyrimidinylene group, and a pyridazinylene group, each substituted with at least one selected from a deuterium atom, —F, a cyano group, a nitro group, a methyl group, an ethyl group, an n-propyl group, an i-propyl group, an n-butyl group, an i-butyl group, a t-butyl group, a phenyl group, a naphthyl group, an anthryl group, a fluorenyl group, a pyridyl group, a pyrazinyl group, a pyrimidyl group, and a pyridazinyl group.

3. The benzofluorene-based compound of claim 1, wherein $X_1$ and $X_2$ are each independently selected from a phenylene group, a naphthylene group, an anthracenylene group, a pyridinylene group, and a pyrimidinylene group.

4. The benzofluorene-based compound of claim 1, wherein $X_1$ and $X_2$ are each independently selected from Formulae 2a to 2h below:

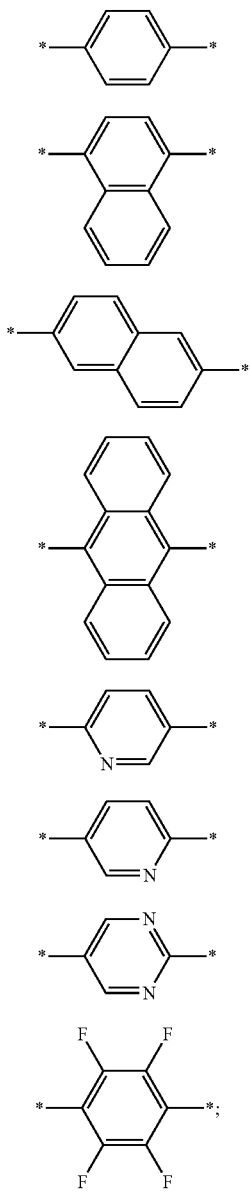

and in Formulae 2a to 2h, * indicates a binding site to a corresponding N of Formula 1 and *' indicates a binding site to a corresponding position on the benzofluorene ring of Formula 1.

5. The benzofluorene-based compound of claim 1, wherein n1 and n2 are each 0 or 1, and the sum of n1 and n2 is 1.

6. The benzofluorene-based compound of claim 1, wherein n1 and n2 are each 1.

7. The benzofluorene-based compound of claim 1, wherein $Ar_1$ to $Ar_4$ are each independently selected from:
a phenyl group, a naphthyl group, an anthryl group, a fluorenyl group, a benzofuranyl group, a benzothiophenyl group, a dibenzofuranyl group, and a dibenzothiophenyl group; and
a phenyl group, a naphthyl group, an anthryl group, a fluorenyl group, a benzofuranyl group, a benzothiophenyl group, a dibenzofuranyl group, and a dibenzothiophenyl group, each substituted with at least one selected from a deuterium atom, —F, a hydroxyl group, a cyano group, a nitro group, —Si($Q_1$)($Q_2$)($Q_3$) (wherein $Q_1$ to $Q_3$ are each independently selected from a hydrogen atom, a deuterium atom, a methyl group, an ethyl group, an n-propyl group, an i-propyl group, an n-butyl group, a sec-butyl group, an i-butyl group, and a t-butyl group), a methyl group, an ethyl group, an n-propyl group, an i-propyl group, an n-butyl group, a sec-butyl group, an i-butyl group, a t-butyl group, a phenyl group, a naphthyl group, an anthryl group, a pyridyl group, a pyrimidyl group, and a triazinyl group.

8. The benzofluorene-based compound of claim 1, wherein $Ar_1$ to $Ar_4$ are each independently selected from:
a phenyl group, a naphthyl group, a fluorenyl group, a dibenzofuranyl group, and a dibenzothiophenyl group; and
a phenyl group, a naphthyl group, a fluorenyl group, a dibenzofuranyl group, and a dibenzothiophenyl group, each substituted with at least one selected from a deuterium atom, —F, a cyano group, a nitro group, a methyl group, an ethyl group, a t-butyl group, a phenyl group, a pyridyl group, and —Si($Q_1$)($Q_2$)($Q_3$), wherein $Q_1$ to $Q_3$ are each independently selected from a methyl group, an ethyl group, and a t-butyl group.

9. The benzofluorene-based compound of claim 1, wherein $Ar_1$ to $Ar_4$ are each independently selected from Formulae 3a to 3m below:

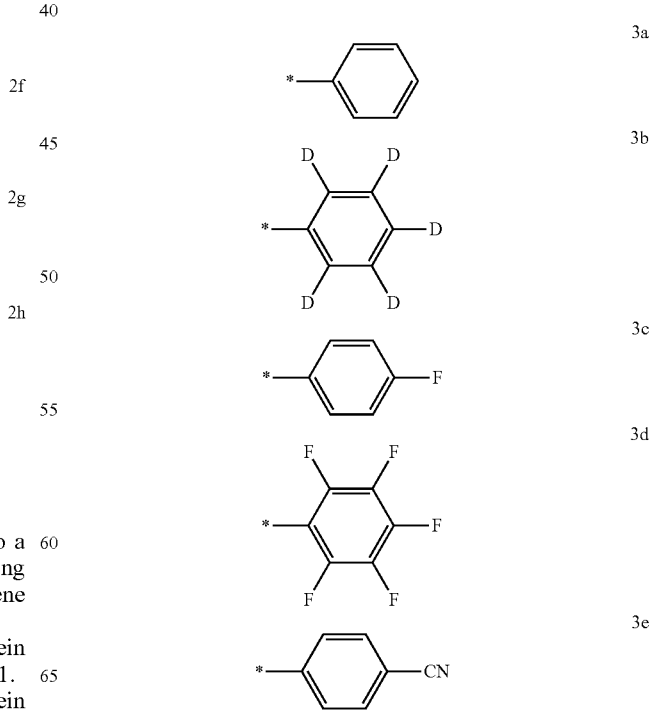

-continued

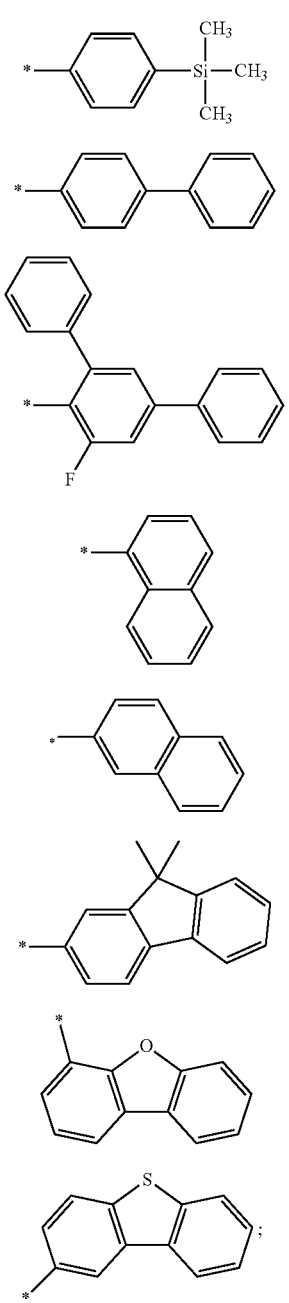

and wherein in Formulae 3a to 3m, * indicates a binding site to a corresponding N of Formula 1.

10. The benzofluorene-based compound of claim 1, wherein $R_1$ and $R_2$ are each independently selected from a hydrogen atom, a deuterium atom, a halogen atom, a hydroxyl group, a cyano group, a nitro group, a substituted or unsubstituted $C_1$-$C_{30}$ alkyl group, and a substituted or unsubstituted $C_6$-$C_{30}$ aryl group.

11. The benzofluorene-based compound of claim 1, wherein $R_1$ and $R_2$ are each independently selected from a hydrogen atom, a deuterium atom, a methyl group, and a phenyl group; and
a methyl group, and a phenyl group, each substituted with at least one selected from a hydrogen atom, a deuterium atom, a halogen atom, a cyano group, and a nitro group.

12. The benzofluorene-based compound of claim 1, wherein
$R_1$ to $R_2$ are each independently selected from a methyl group, —$CD_3$, and a phenyl group.

13. The benzofluorene-based compound of claim 1, wherein $R_3$ and $R_4$ are each independently selected from:
a hydrogen atom, a deuterium atom, —F, a cyano group, a nitro group, a methyl group, an ethyl group, an n-propyl group, an i-propyl group, an n-butyl group, an i-butyl group, and a t-butyl group;
a methyl group, an ethyl group, an n-propyl group, an i-propyl group, an n-butyl group, an i-butyl group, and a t-butyl group, each substituted with at least one selected from a hydrogen atom, a deuterium atom, —F, a cyano group, a nitro group, a methyl group, an ethyl group, an n-propyl group, an i-propyl group, an n-butyl group, an i-butyl group, and a t-butyl group;
a phenyl group, a naphthyl group, and an anthracenyl group; and
a phenyl group, a naphthyl group, and an anthracenyl group, each substituted with at least one selected from a hydrogen atom, a deuterium atom, —F, a cyano group, a nitro group, a methyl group, an ethyl group, an n-propyl group, an i-propyl group, an n-butyl group, an i-butyl group, and a t-butyl group.

14. The benzofluorene-based compound of claim 1, wherein a is 0 and b is 0.

15. The benzofluorene-based compound of claim 1, wherein the benzofluorene-based compound represented by Formula 1 is selected from a compound represented by Formulae 1a to 1c below:

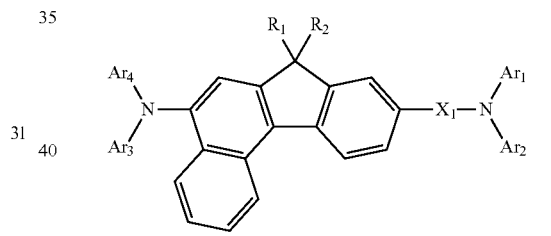

Formula 1a

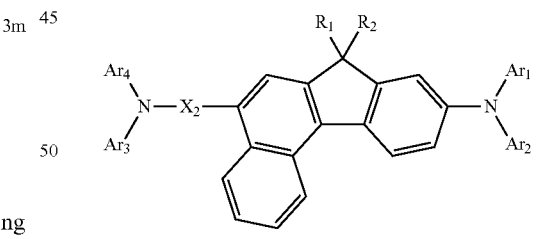

Formula 1b

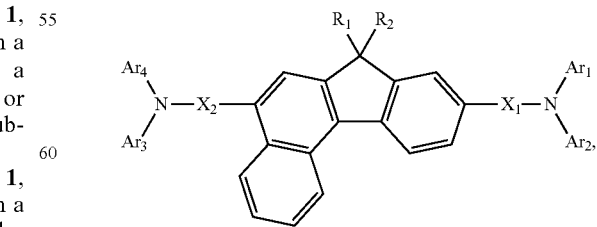

Formula 1c wherein:
in Formulae 1a to 1c, $X_1$ and $X_2$ are each independently selected from Formulae 2a to 2h below:

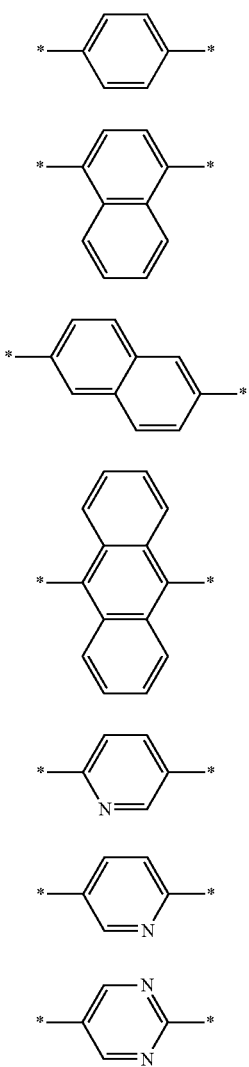
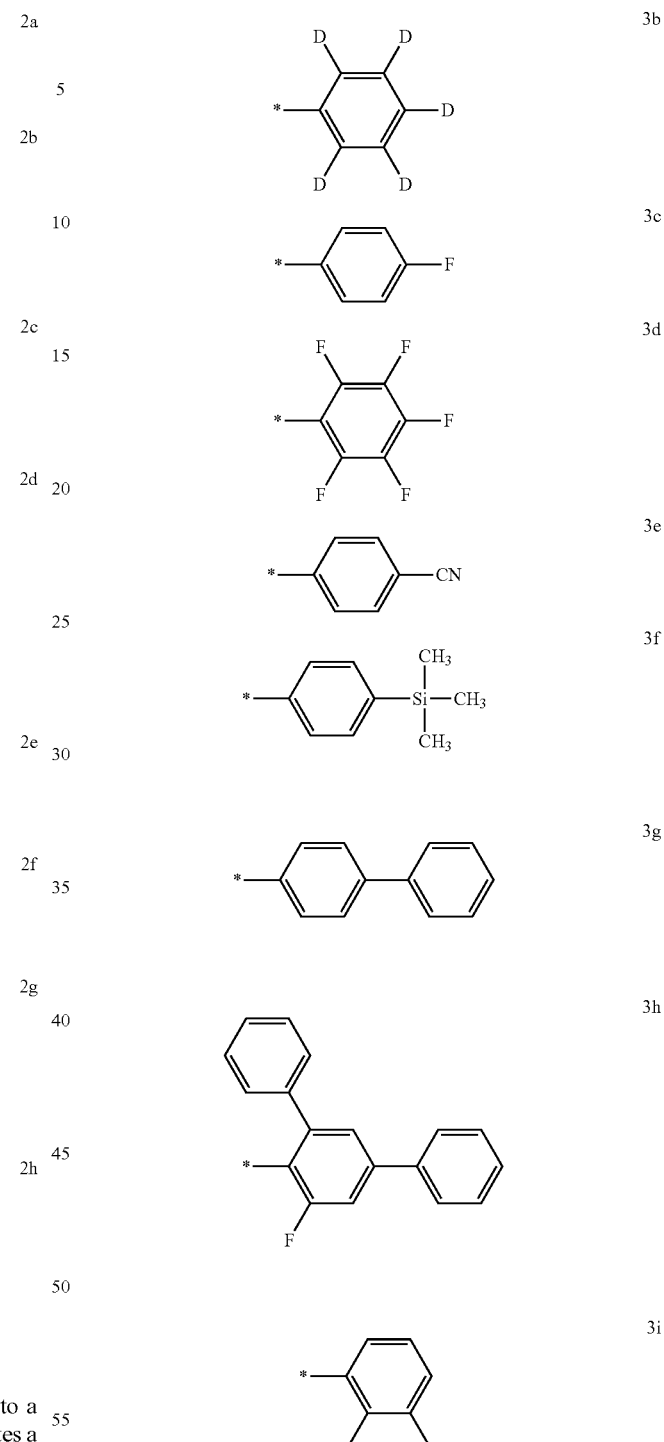
and in Formulae 2a to 2h, * indicates a binding site to a corresponding N of Formulae 1a to 1c, and *' indicates a binding site to a corresponding position on the benzofluorene ring of Formulae 1a to 1c;
$Ar_1$ to $Ar_4$ are each independently selected from Formulae 3a to 3m below:
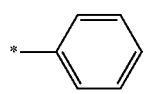
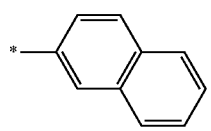

115
-continued
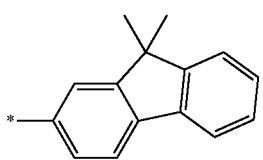
3k
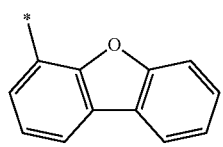
31
116
-continued
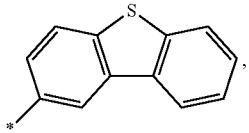
3m
and in Formulae 3a to 3m, * indicates a binding site to a corresponding N of Formulae 1a to 1c, and
$R_1$ to $R_2$ are each independently selected from a methyl group, —$CD_3$, and a phenyl group.
16. The benzofluorene-based compound of claim 1, wherein the benzofluorene-based compound represented by Formula 1 is selected from Compounds 1 to 100 below:
1
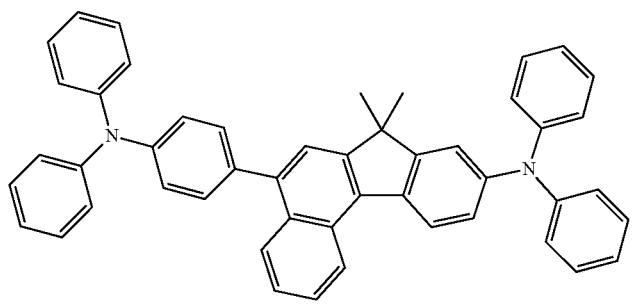
2
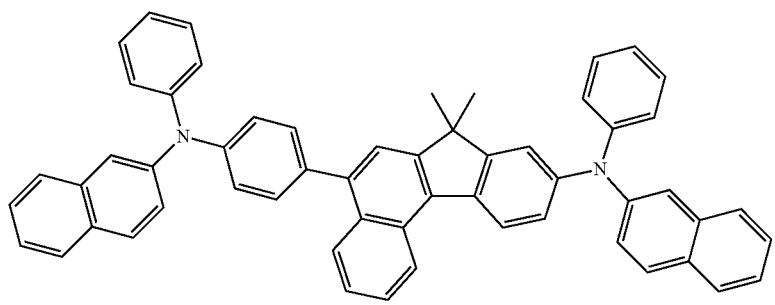
3
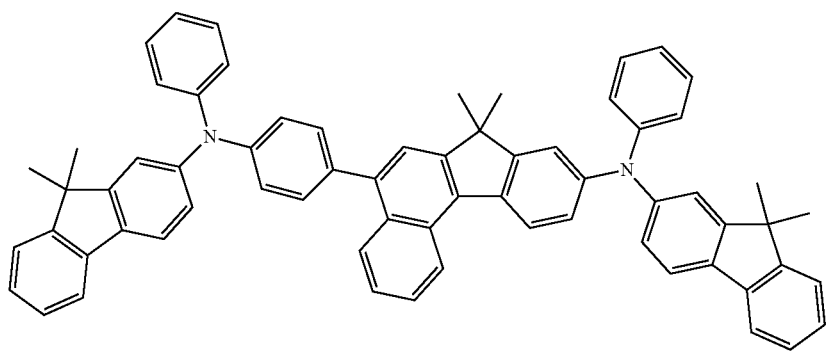

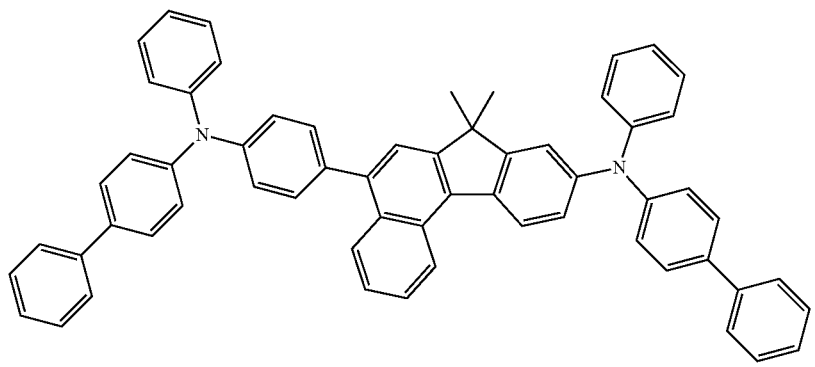
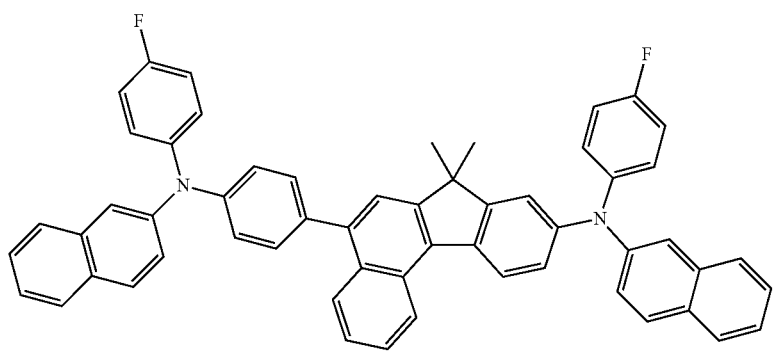
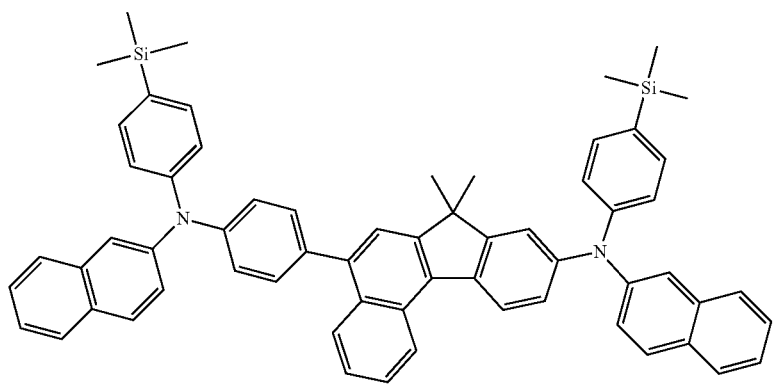
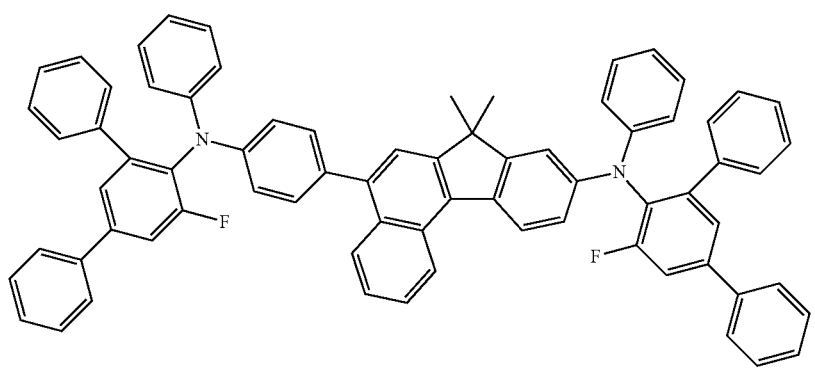

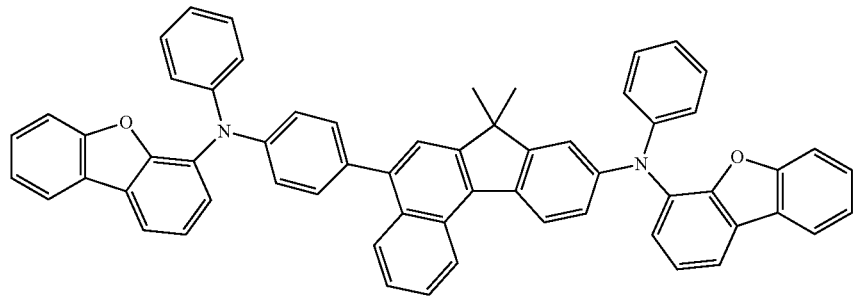
8
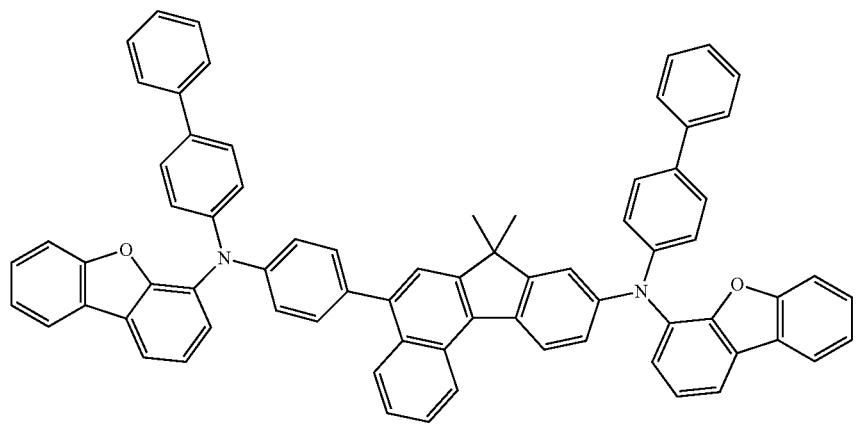
9
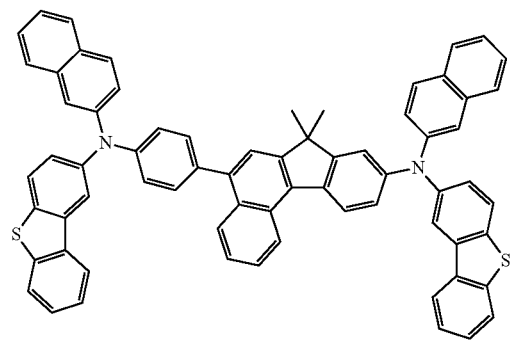
10
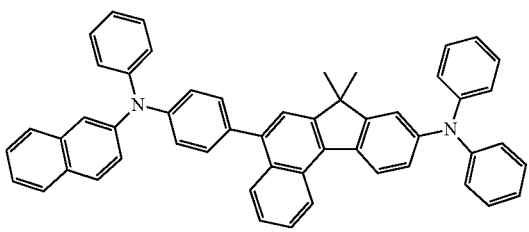
11
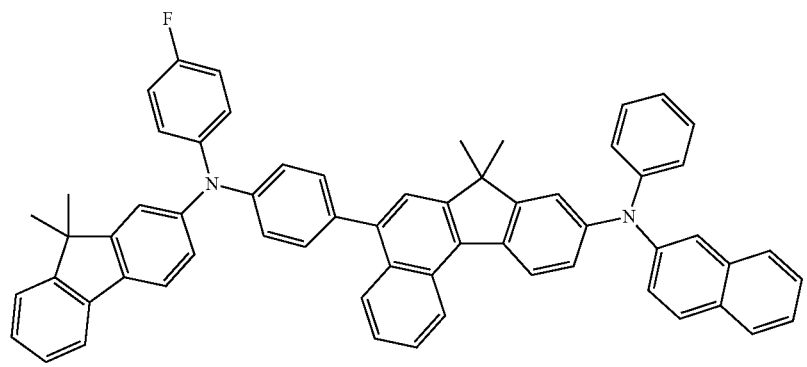
12

13
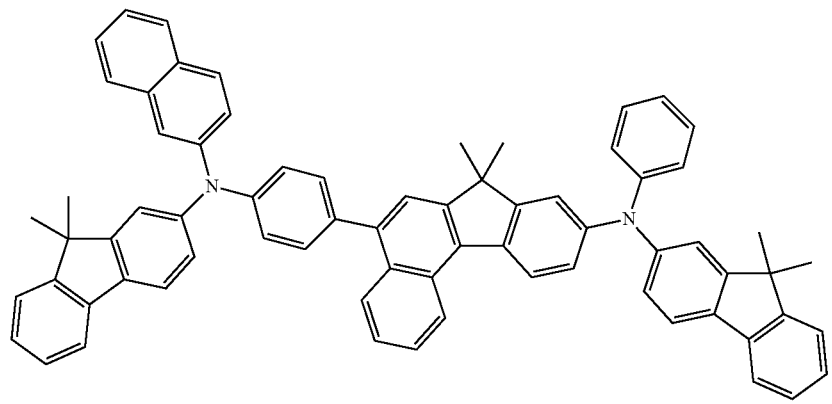
14
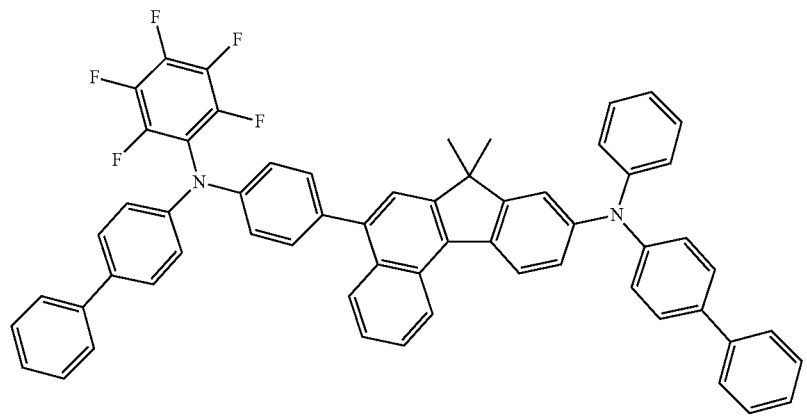
15
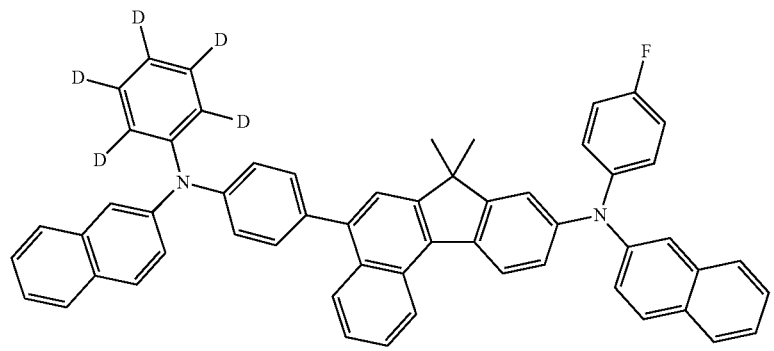
16
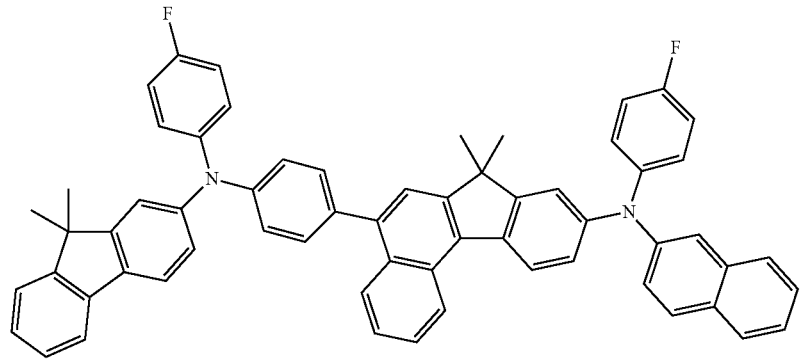

17
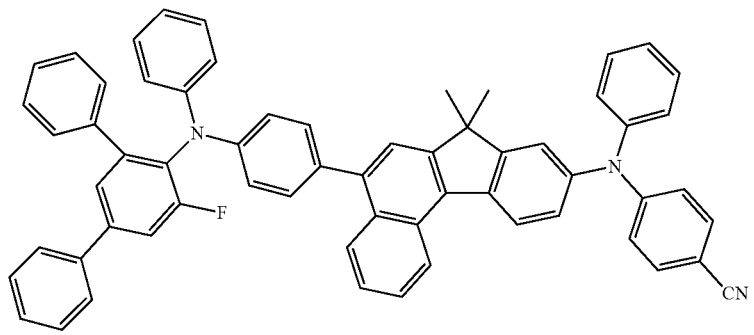
18
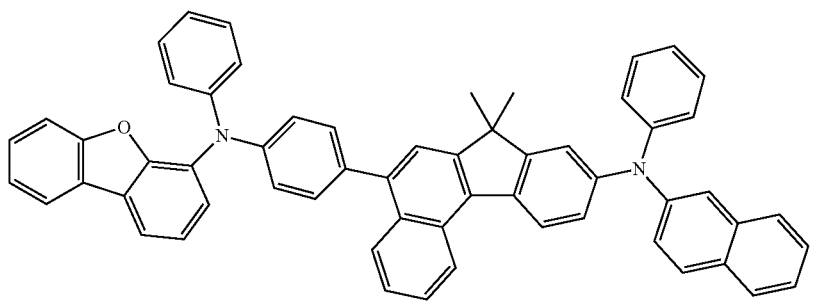
19
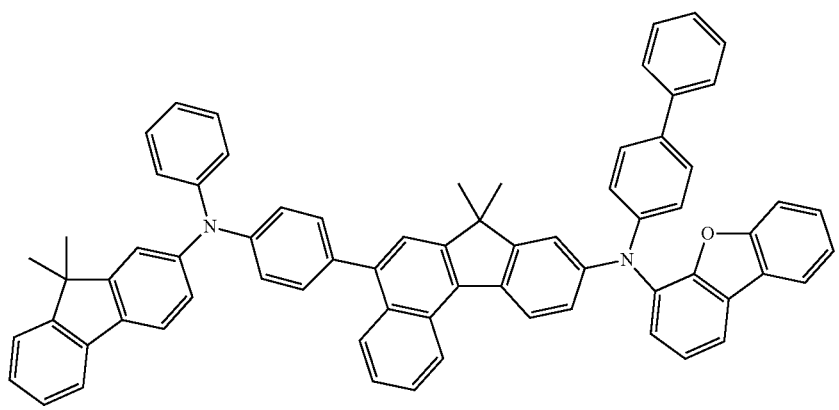
20
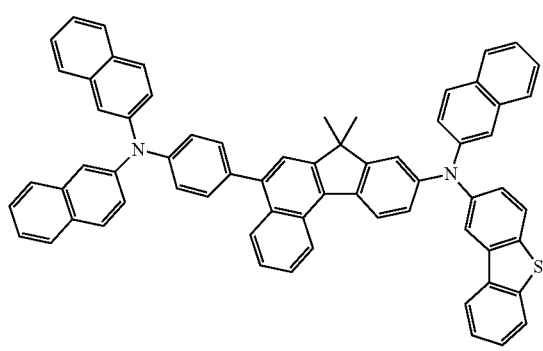
21
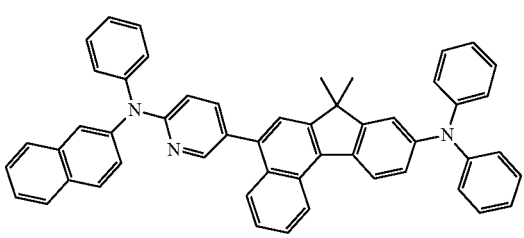

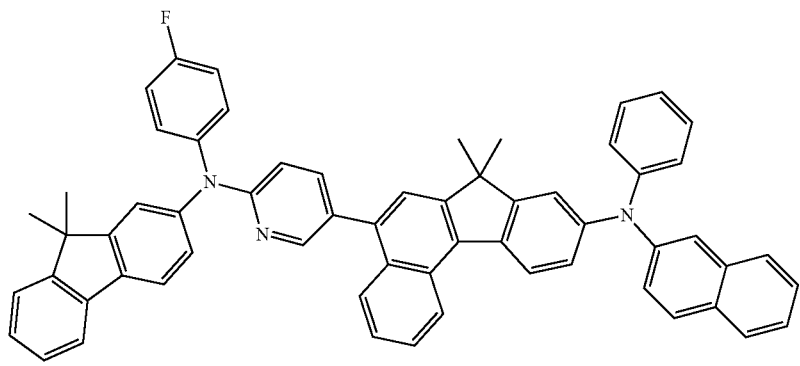
22
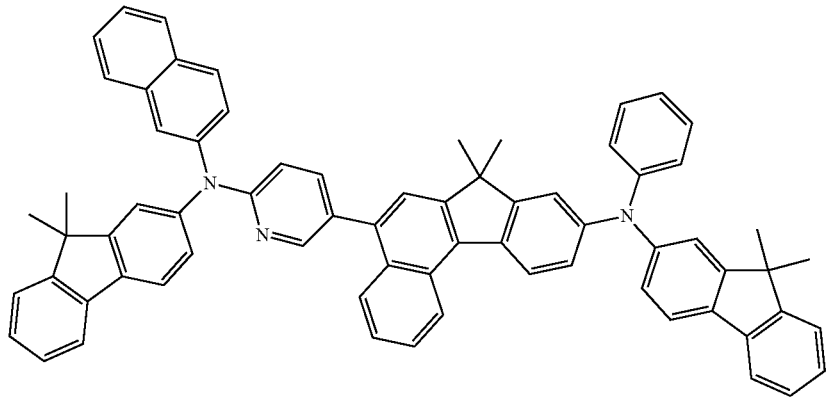
23
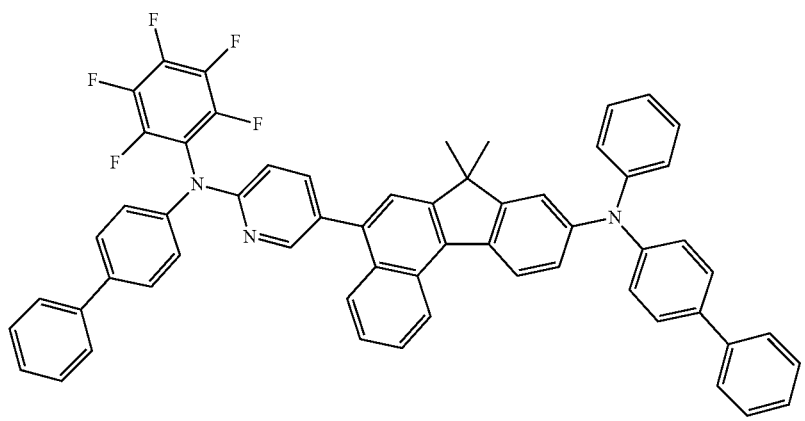
24
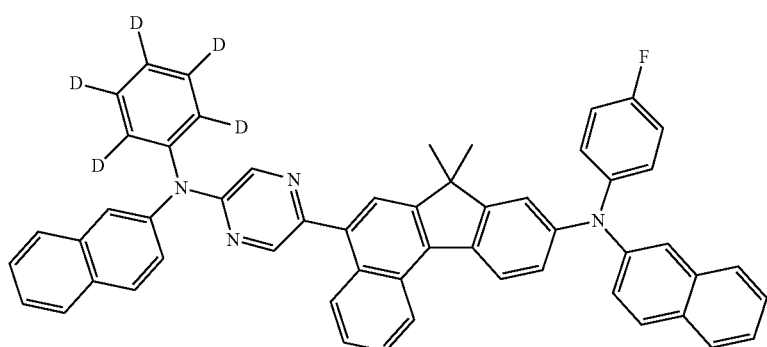
25

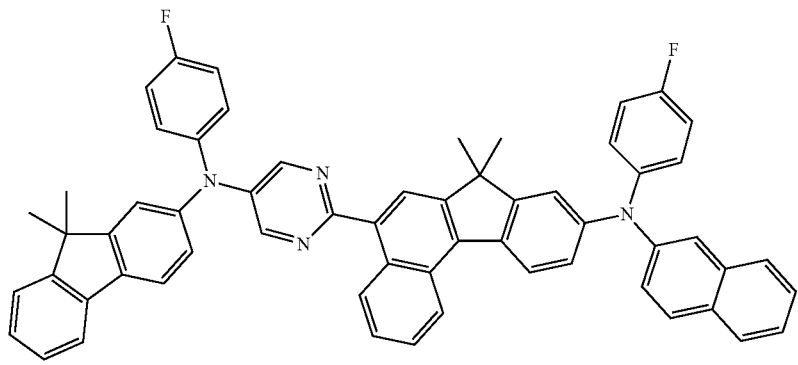
26
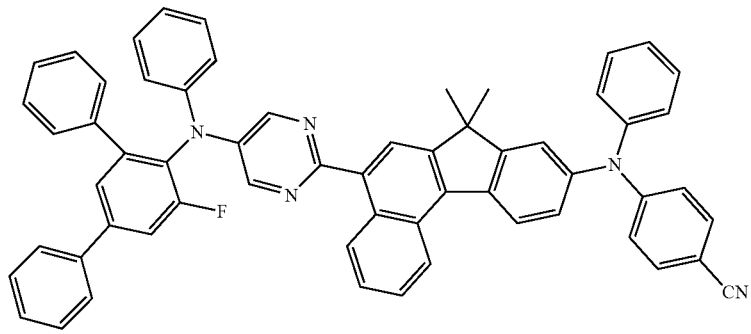
27
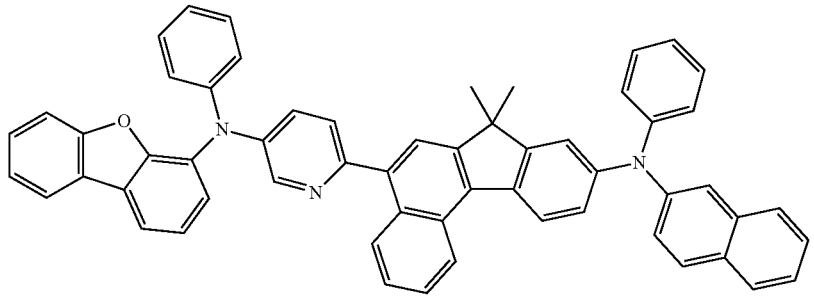
28
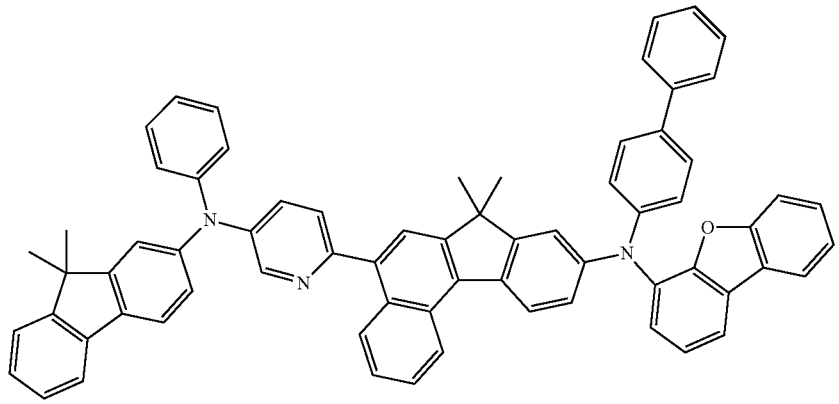
29

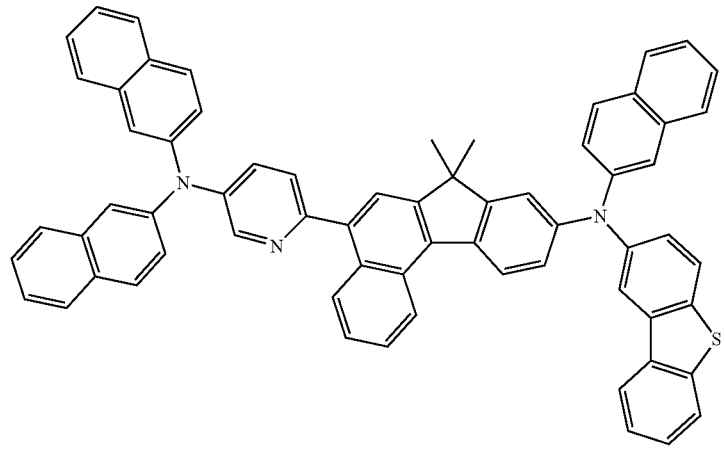
30
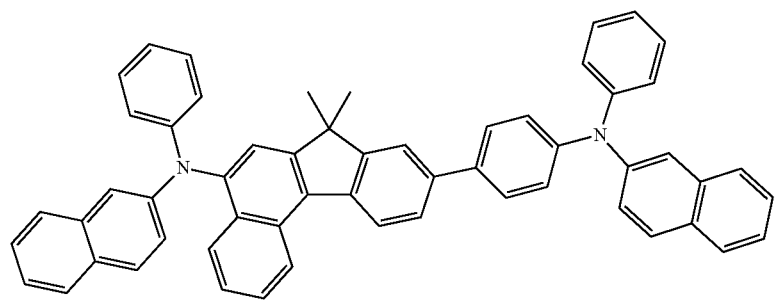
31
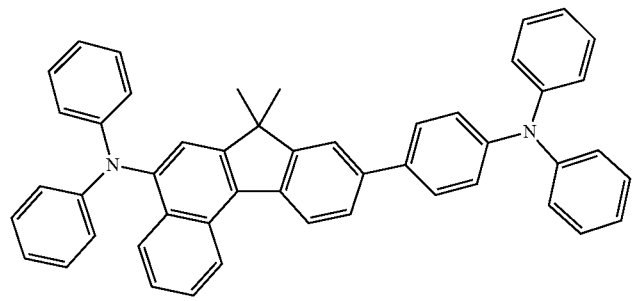
32
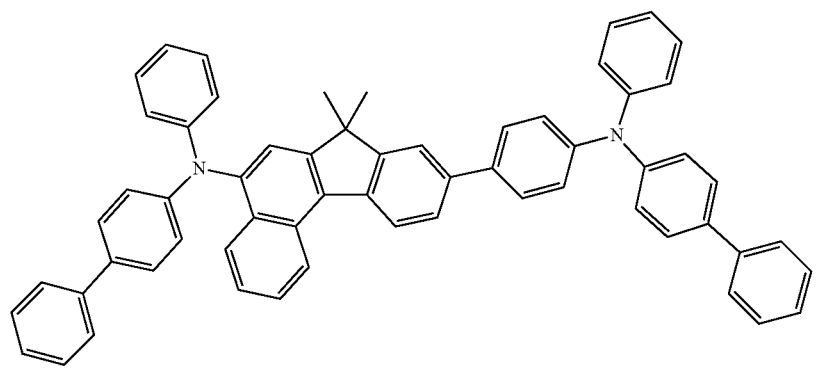
33

34
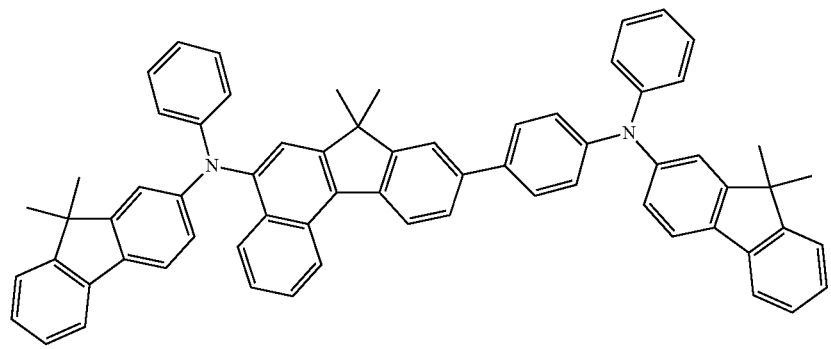
35
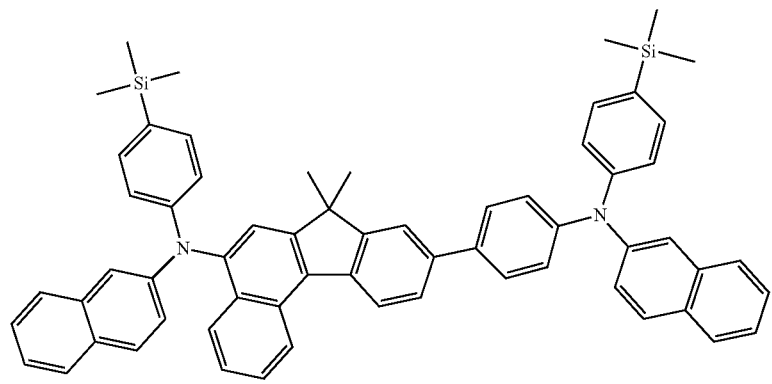
36
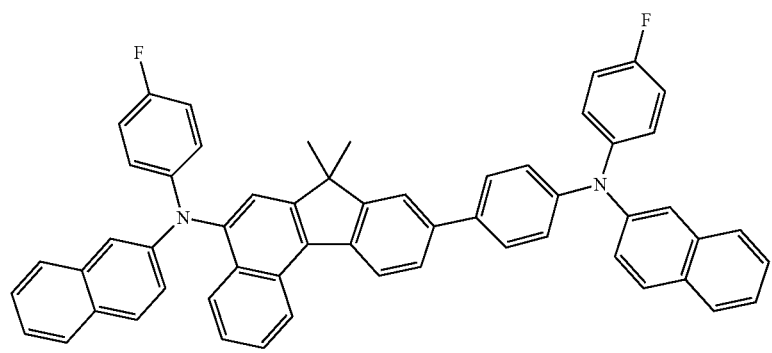
37
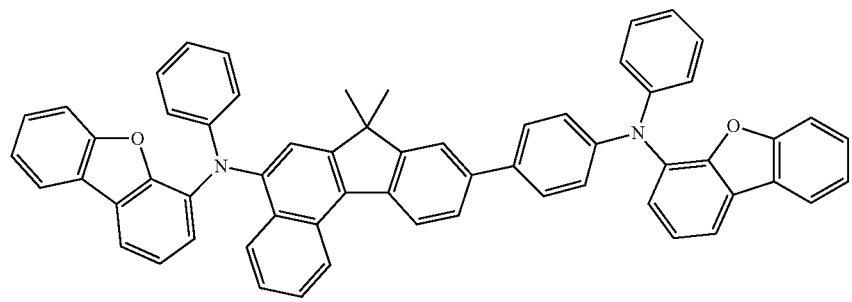

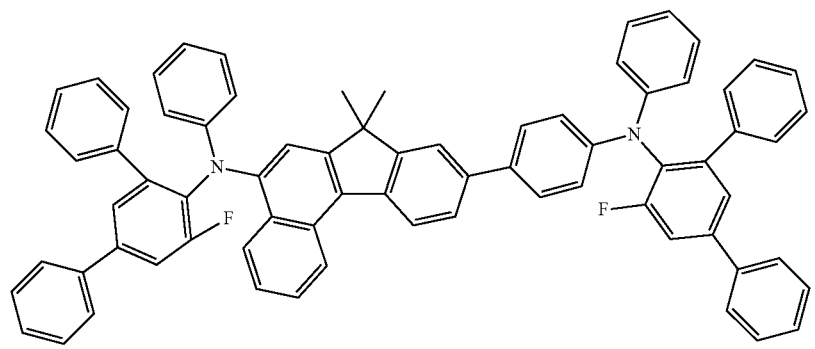
38
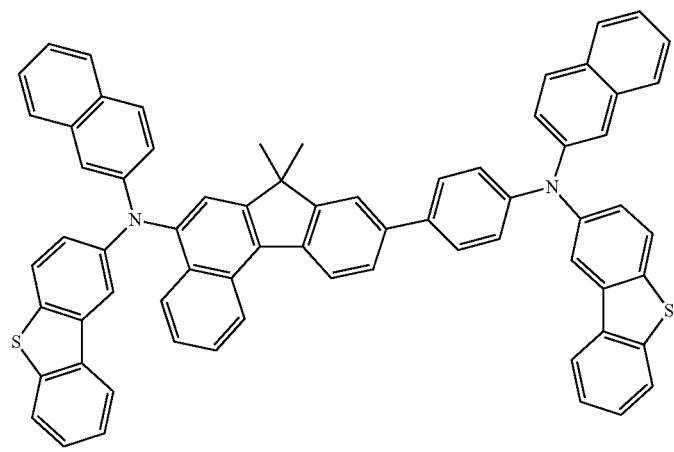
39
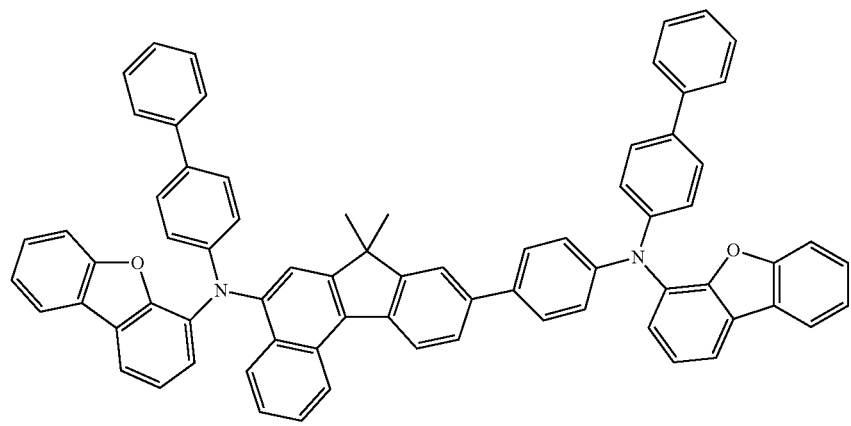
40
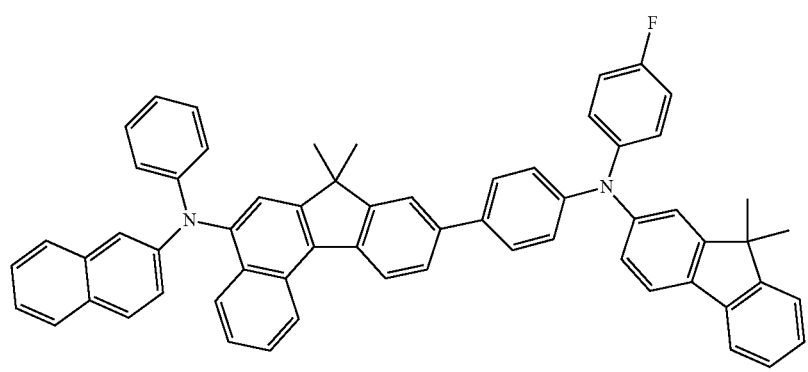
41

-continued
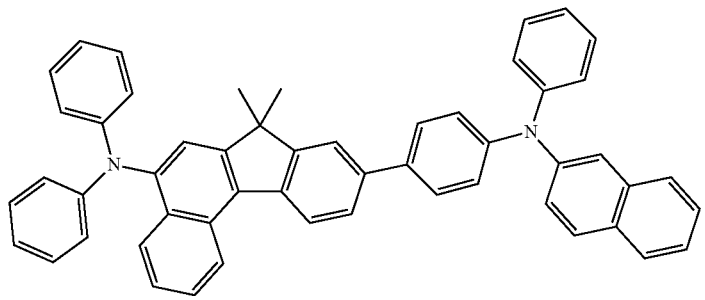
42
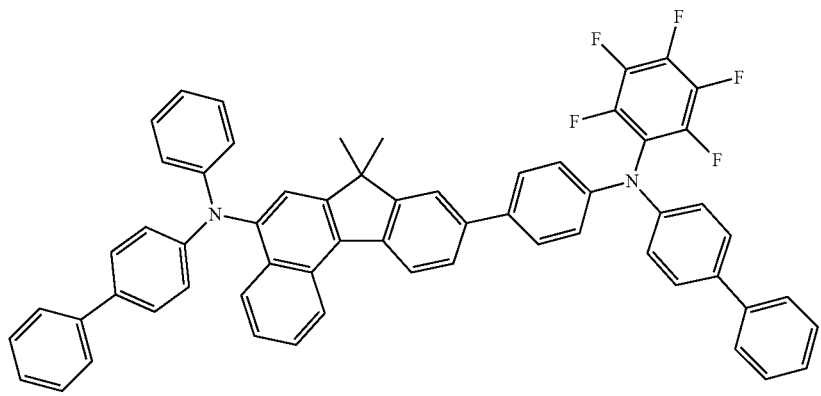
43
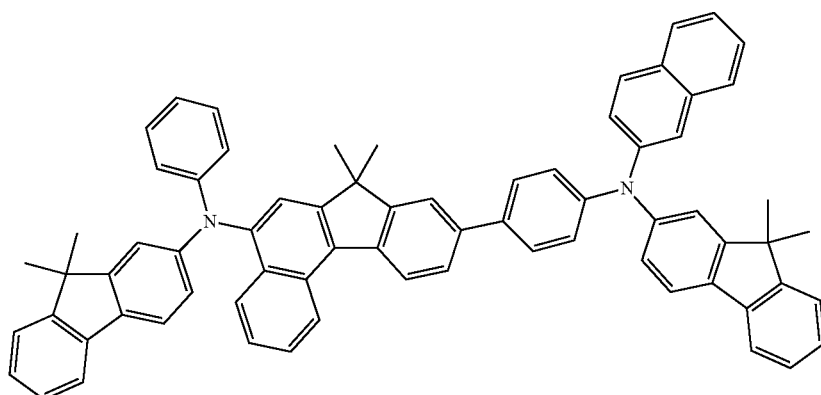
44
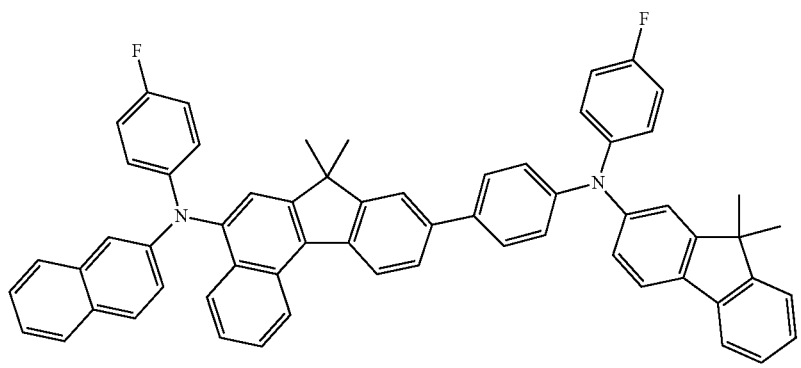
45

-continued
46
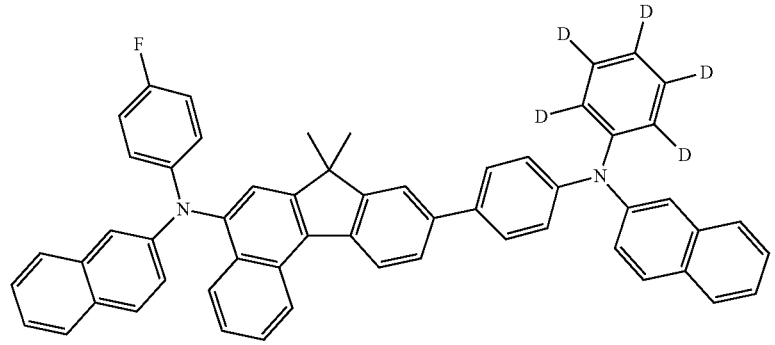
47
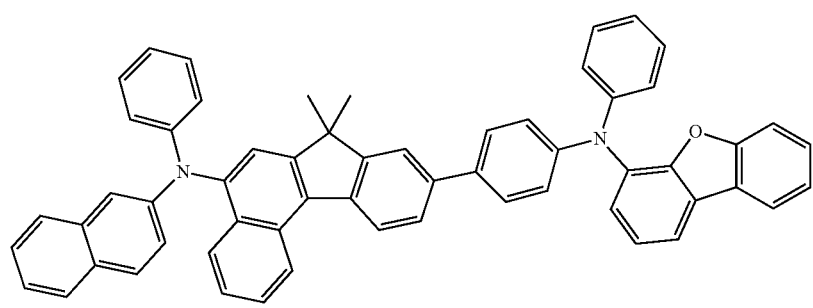
48 49
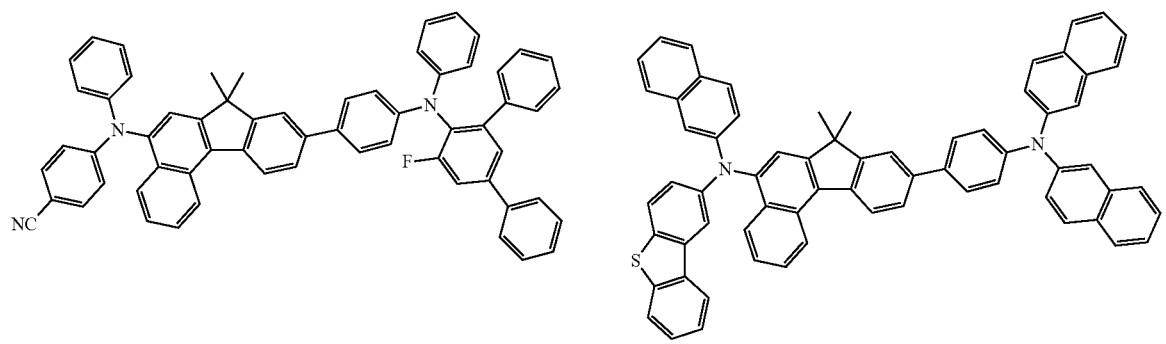
50
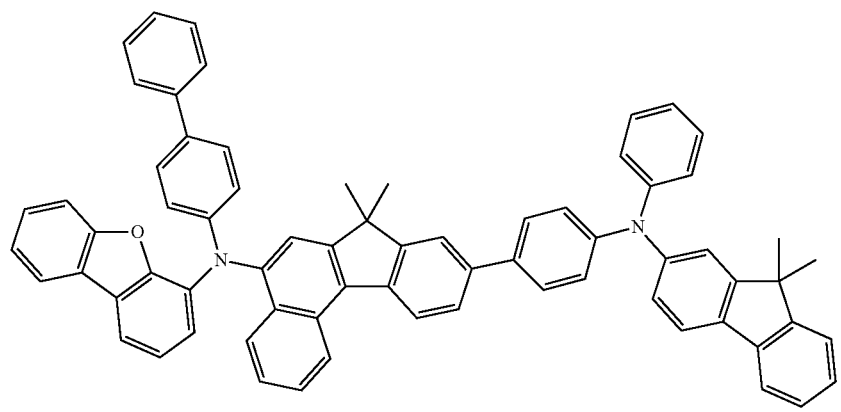

-continued
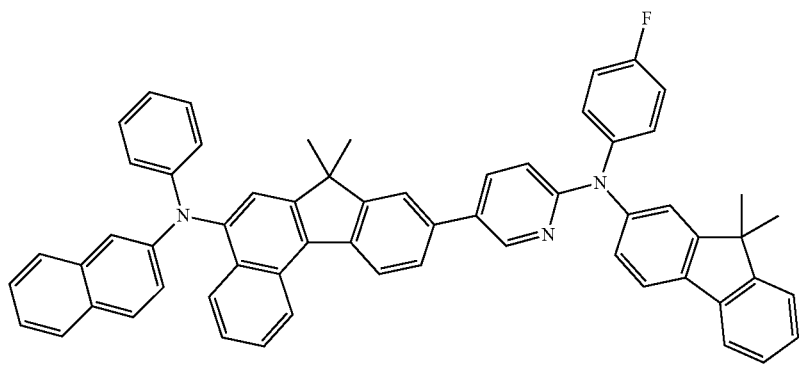
51
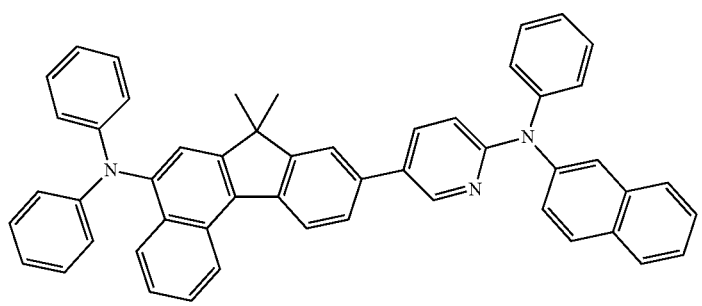
52
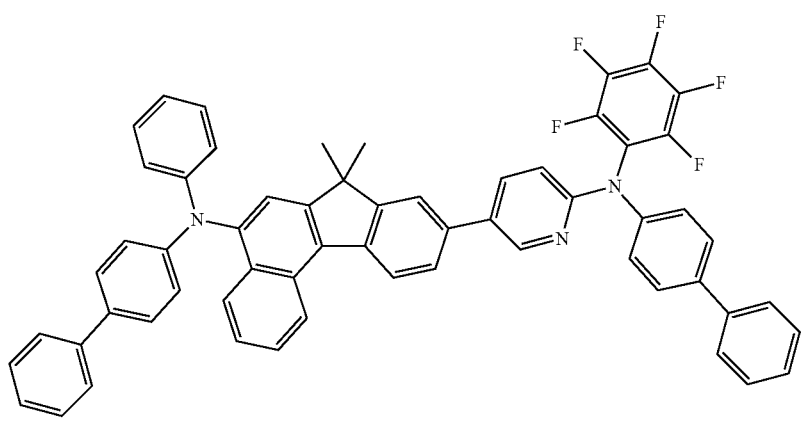
53
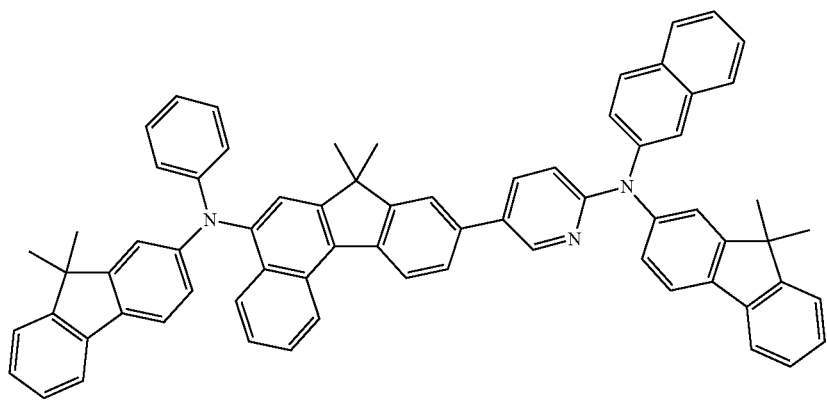
54

-continued
55
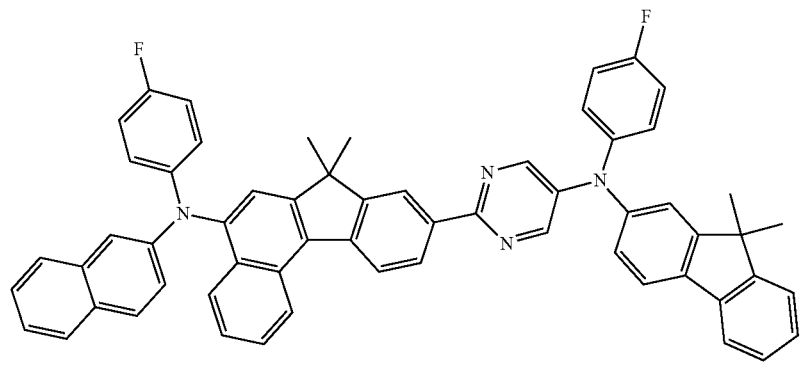
56
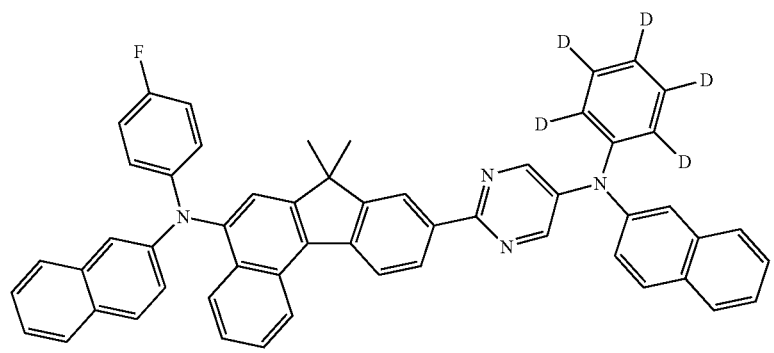
57
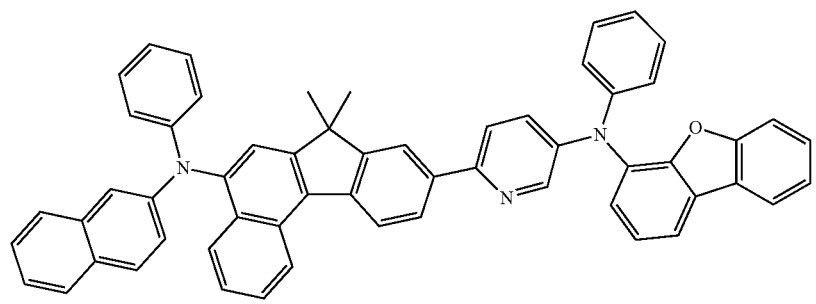
58 59
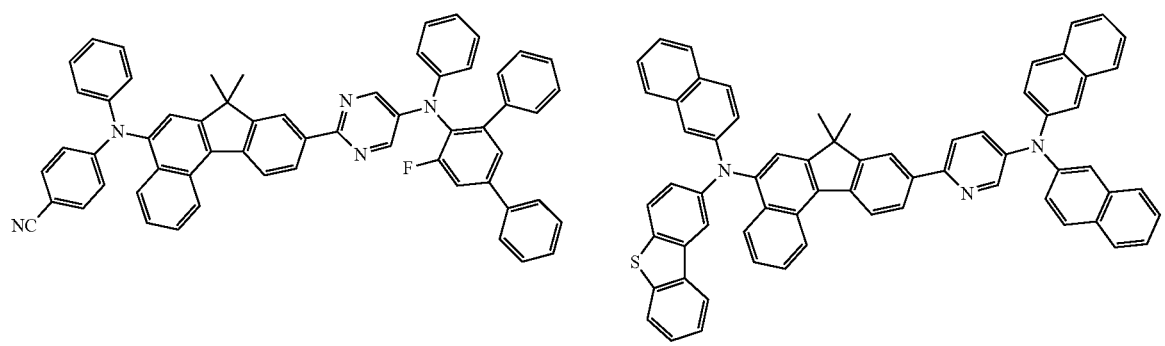

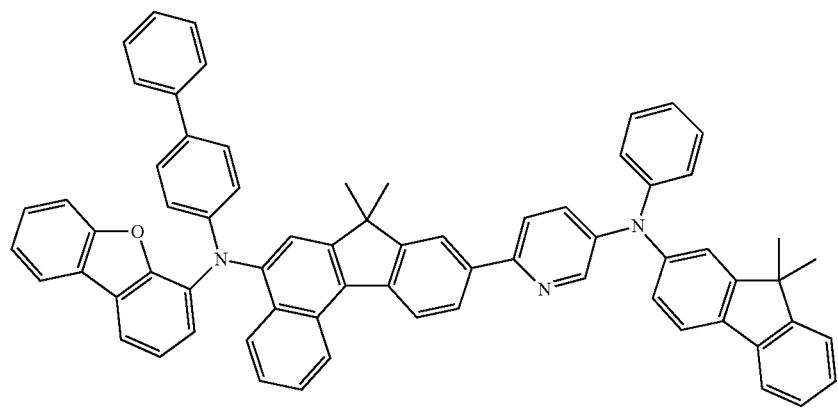
60
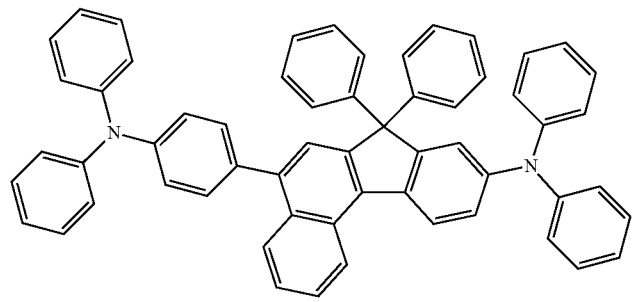
61
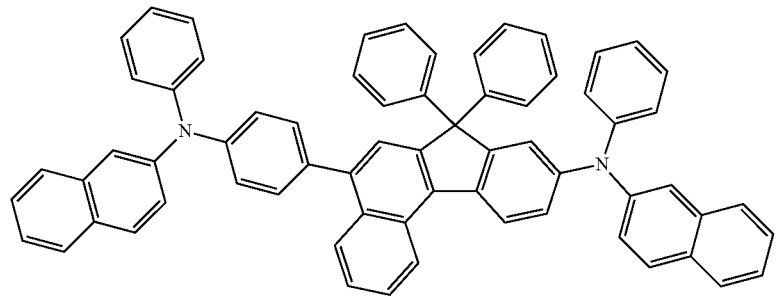
62
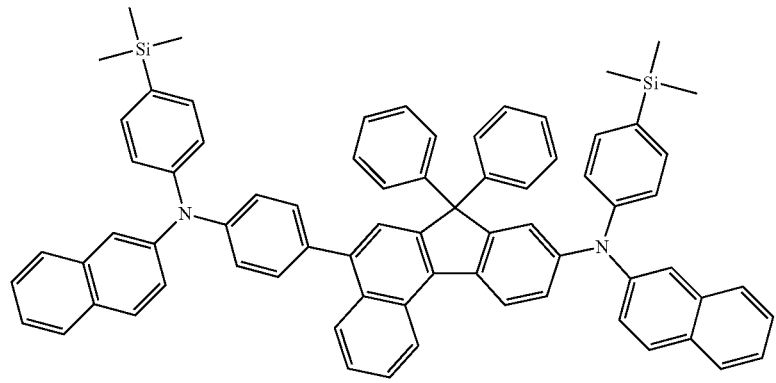
63

64
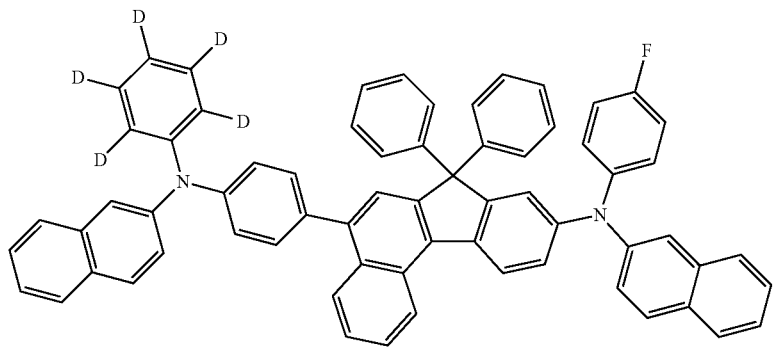
65
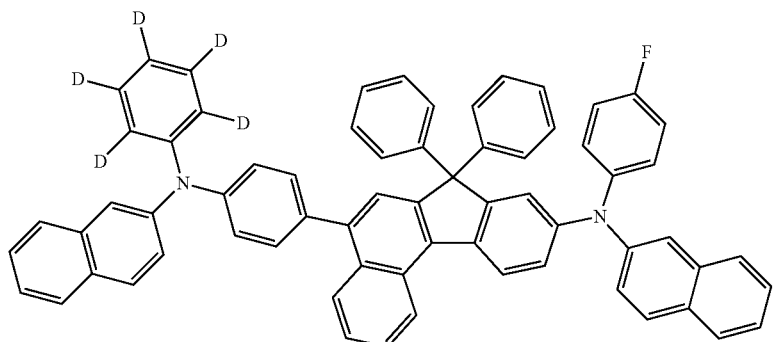
66
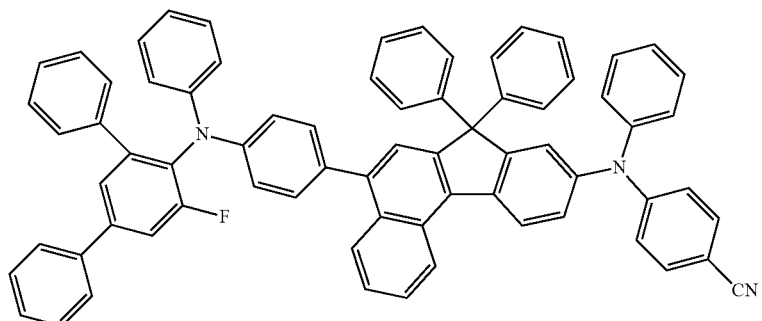
67
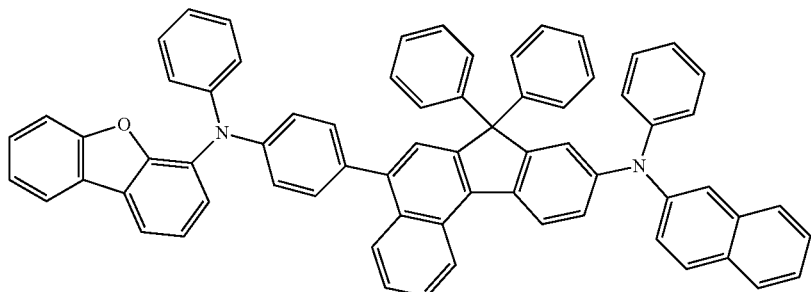
68
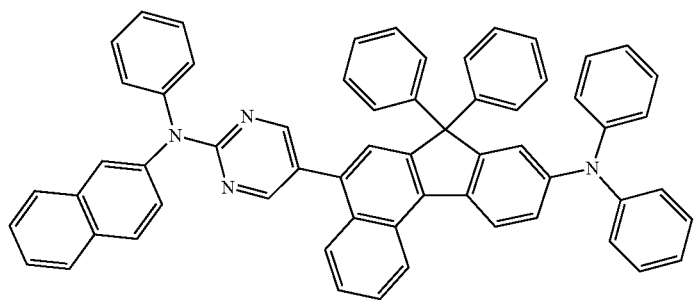

-continued
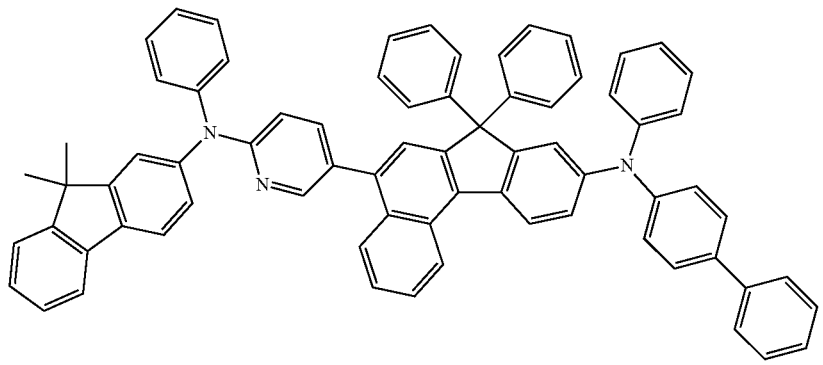
69
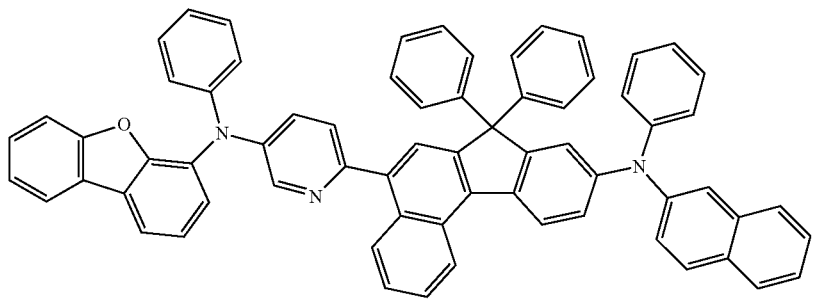
70
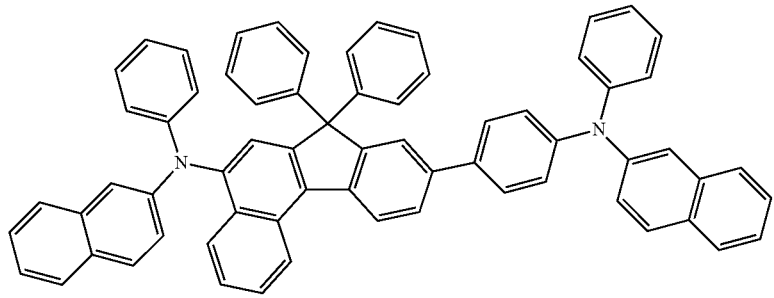
71
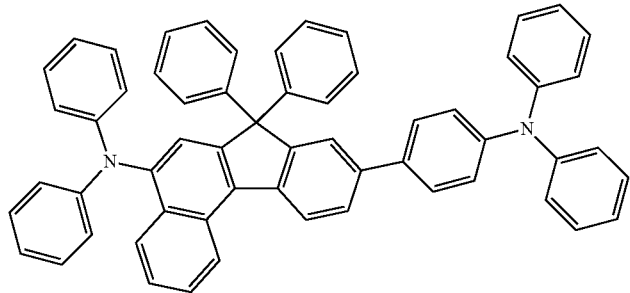
72
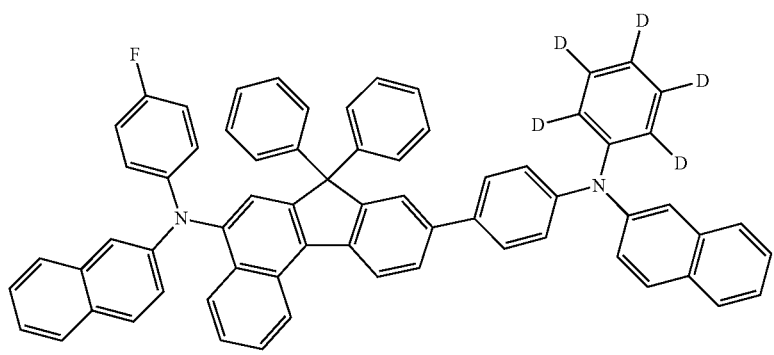
73

-continued
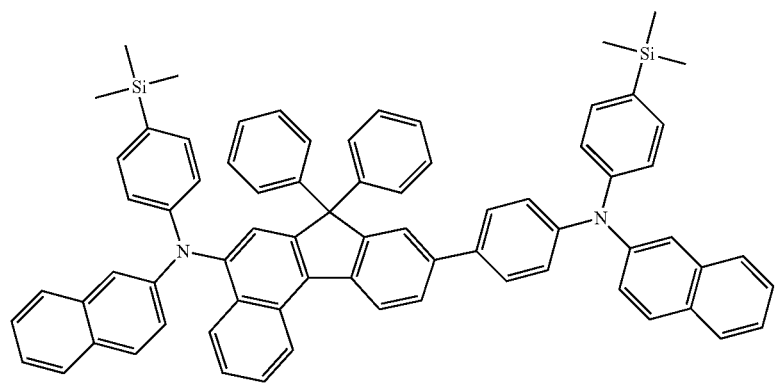
74
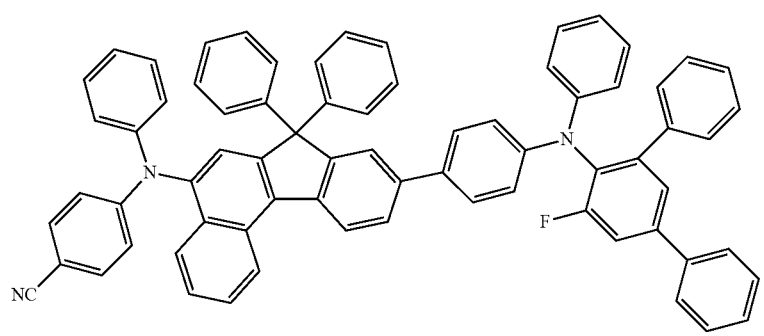
75
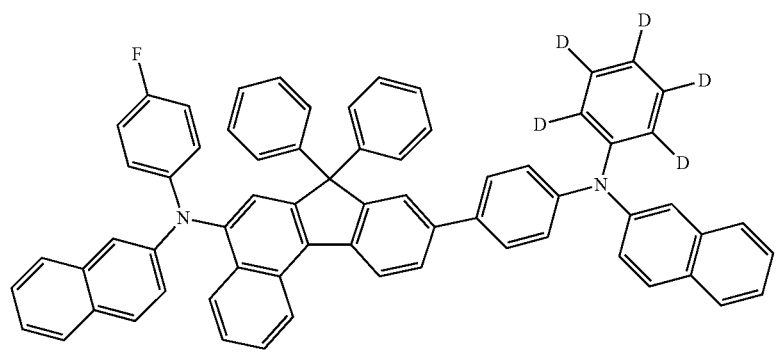
76
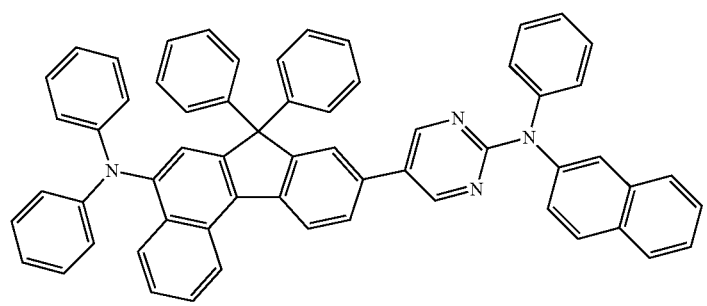
77

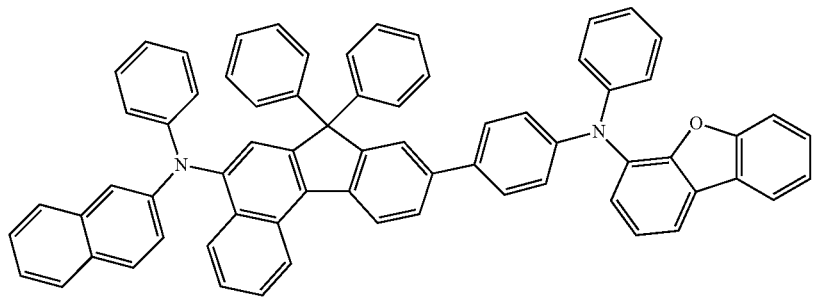
78
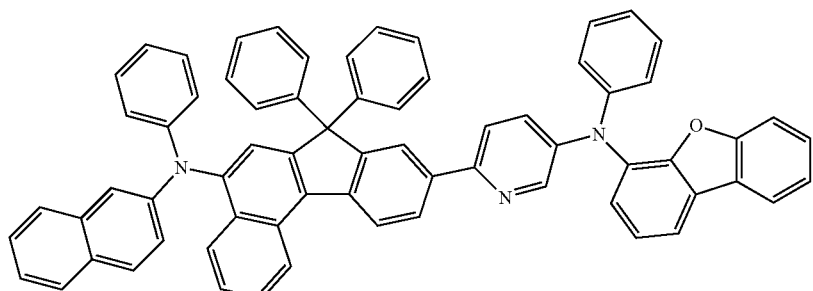
79
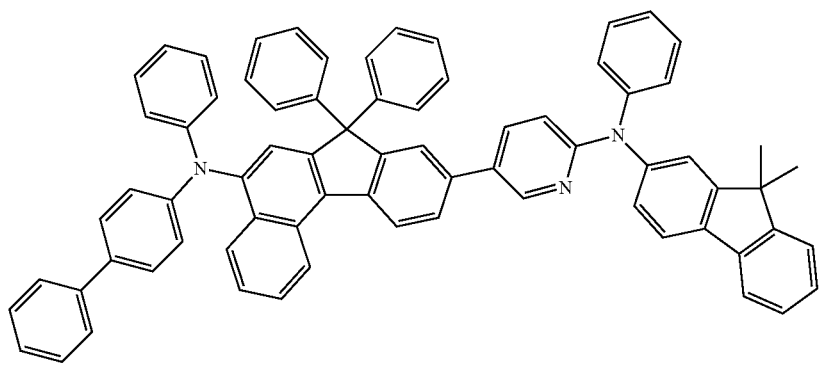
80
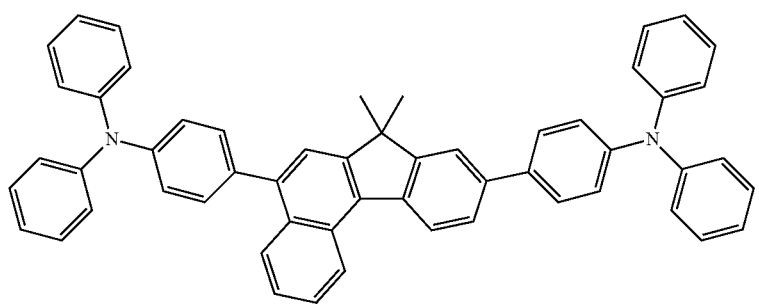
81
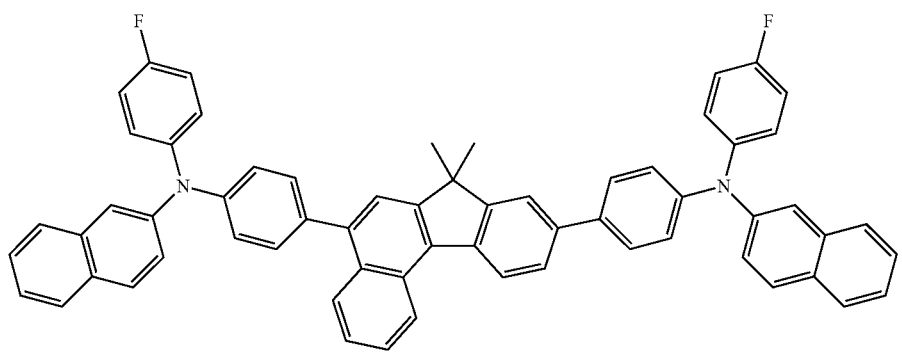
82

83
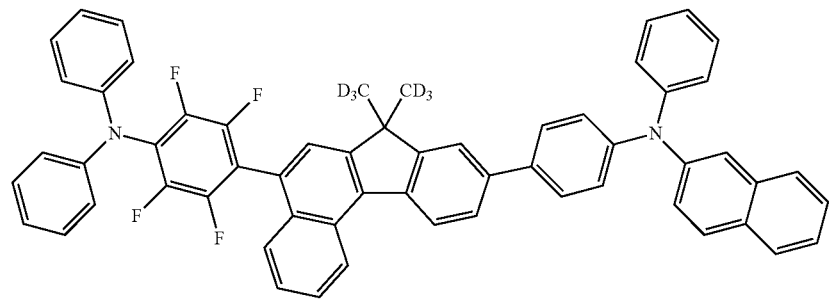
84
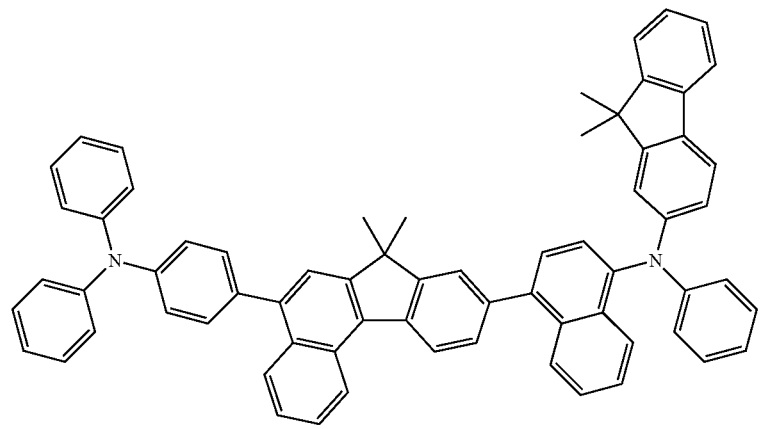
85
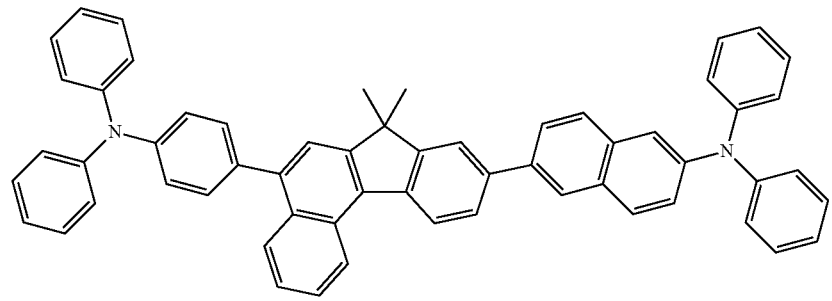
86
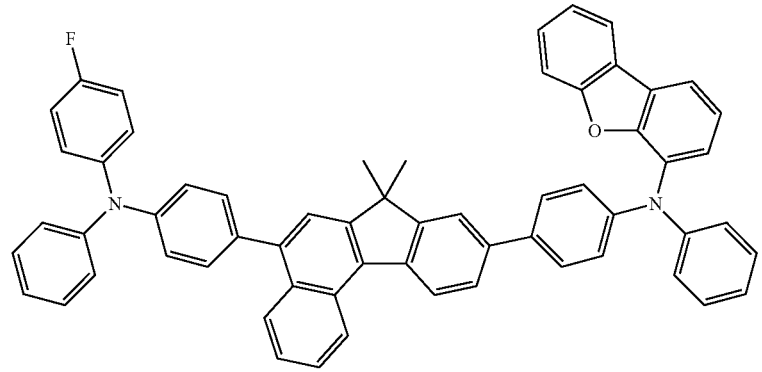

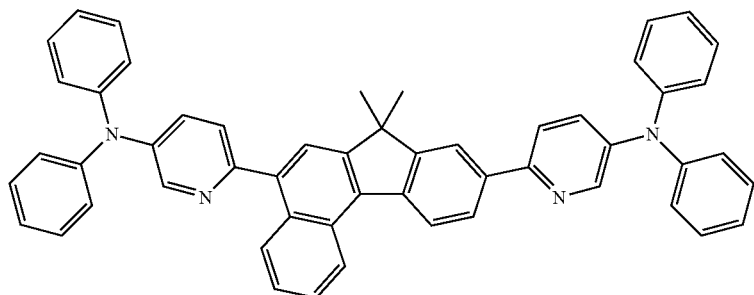
87
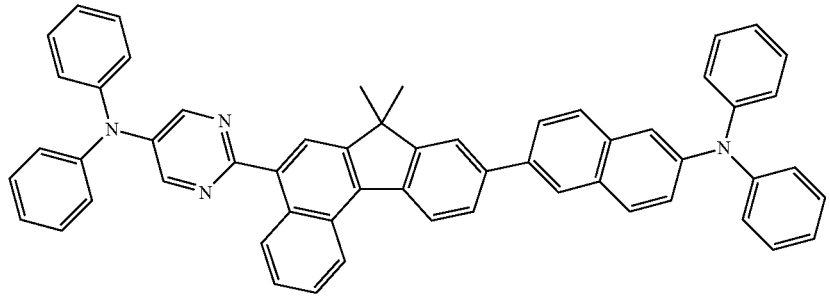
88
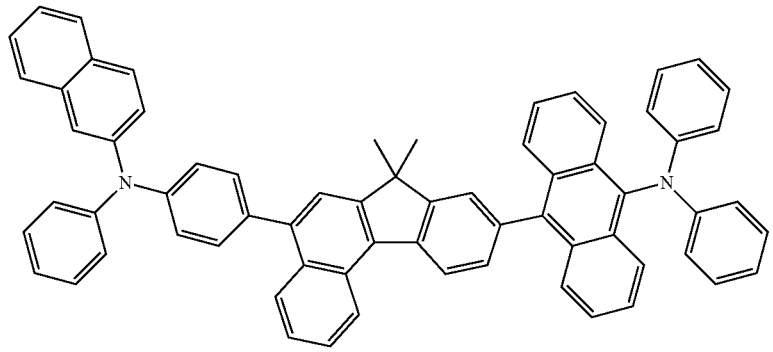
89
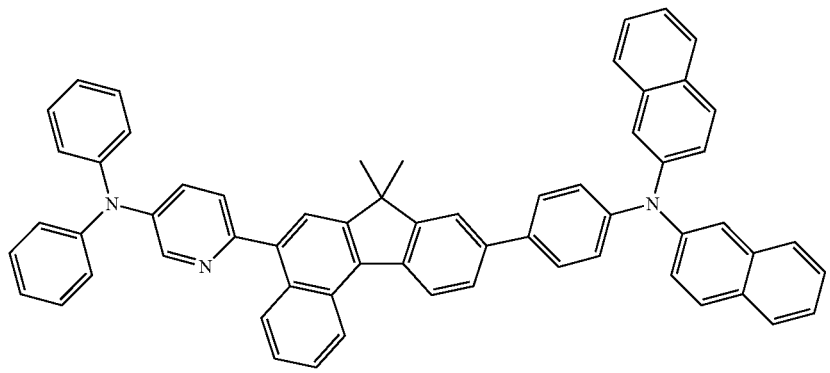
90
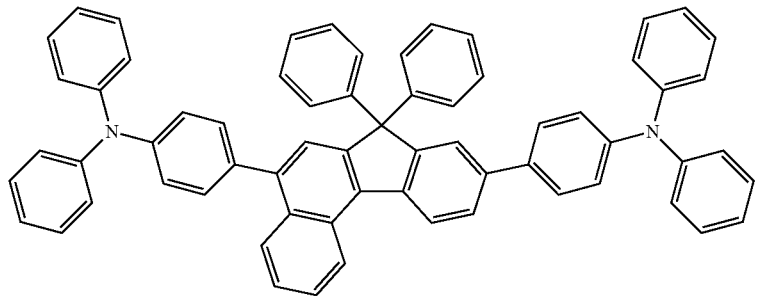
91

92
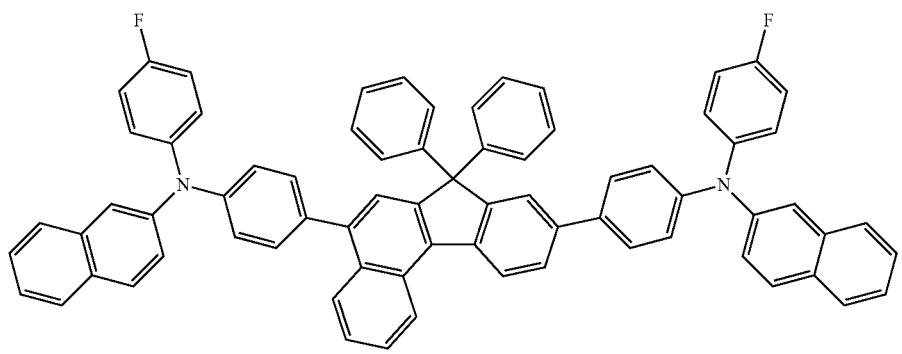
93
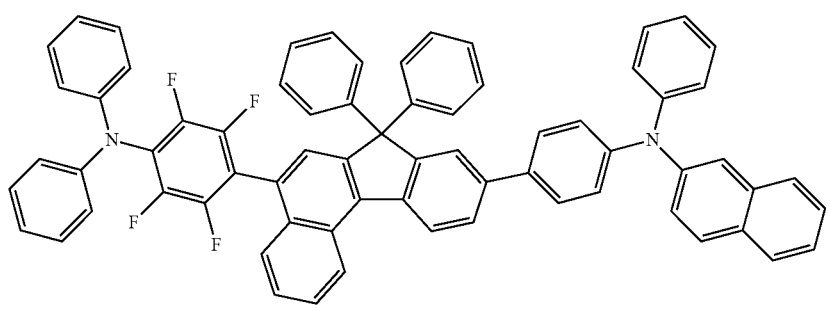
94
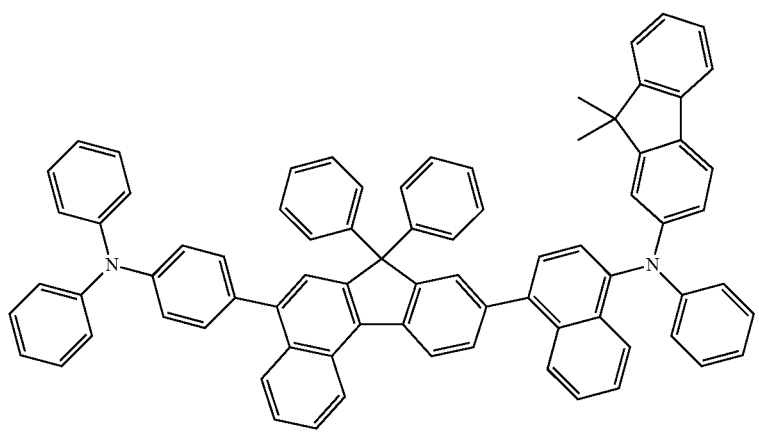
95
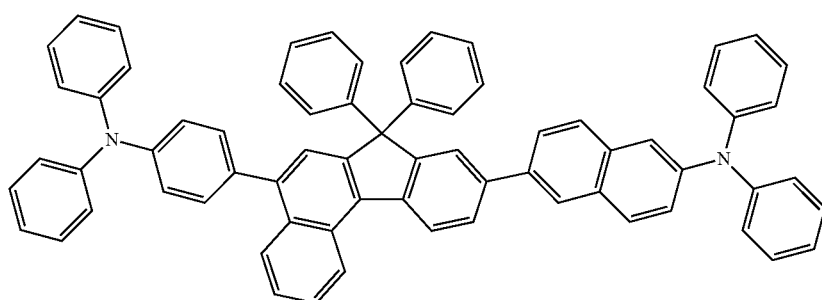

-continued
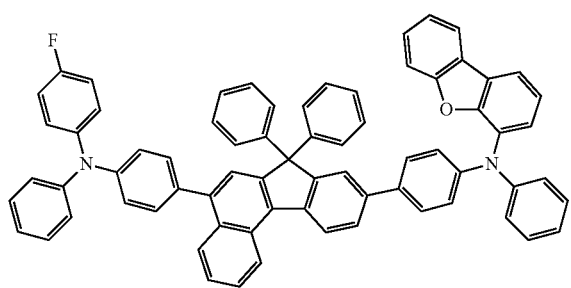
96
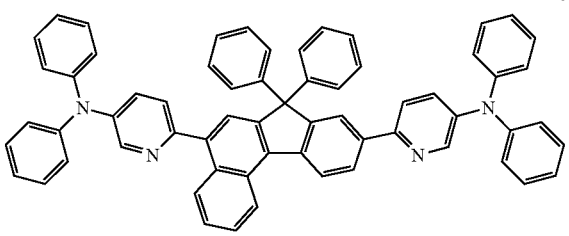
97
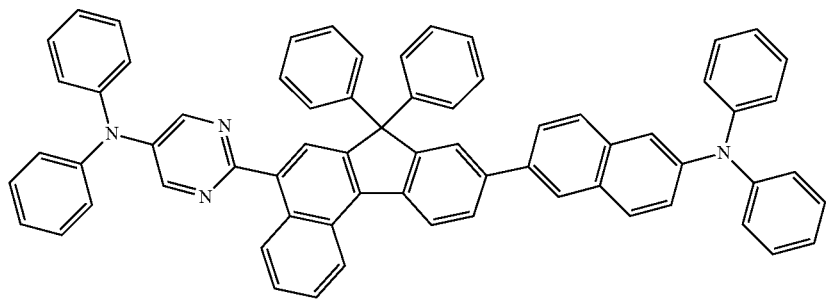
98
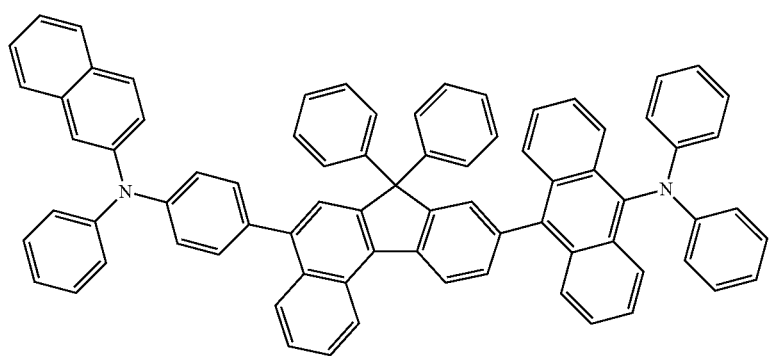
99
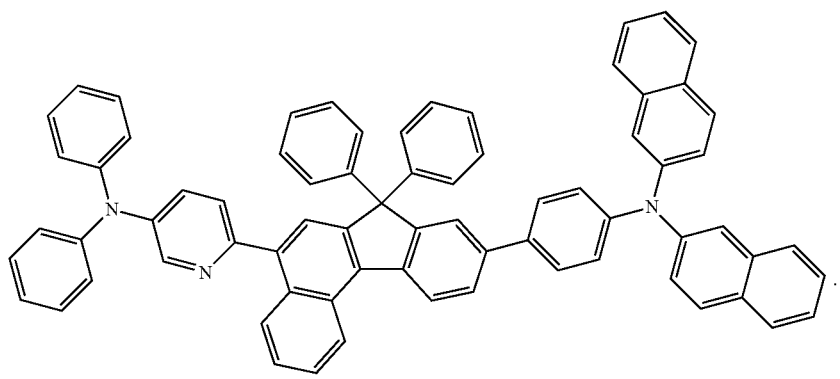
100

17. An organic light-emitting diode comprising:
a substrate;
a first electrode;
a second electrode on the first electrode; and
an organic layer between the first electrode and the second electrode and comprising an emission layer and the benzofluorene-based compound of claim 1.

18. The organic light-emitting diode of claim 17, wherein the organic layer comprises:
a hole transporting region between the first electrode and the emission layer, wherein the hole transporting region comprises at least one selected from a hole injection layer, a hole transport layer, a functional layer having a hole injection capability and a hole transport capability, a buffer layer, and an electron blocking layer; and
an electron transporting region between the emission layer and the second electrode, wherein the electron transporting region comprises at least one selected from a hole blocking layer, an electron transport layer, and an electron injection layer.

19. The organic light-emitting diode of claim 17, wherein the benzofluorene-based compound is in the emission layer.

20. The organic light-emitting diode of claim 19, wherein the emission layer further comprises a host, and the benzofluorene-based compound of Formula 1 is a dopant.

* * * * *